US012278271B2

(12) United States Patent
Kim et al.

(10) Patent No.: US 12,278,271 B2
(45) Date of Patent: Apr. 15, 2025

(54) SEMICONDUCTOR DEVICE HAVING CAPPING LAYERS WITH DIFFERENT GERMANIUM CONCENTRATIONS OVER AN ACTIVE PATTERN

(71) Applicant: Samsung Electronics Co., Ltd., Suwon-si (KR)

(72) Inventors: Dahye Kim, Seoul (KR); Jinbum Kim, Seoul (KR); Jaemun Kim, Seoul (KR); Sangmoon Lee, Suwon-si (KR); Seung Hun Lee, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 775 days.

(21) Appl. No.: 17/514,379

(22) Filed: Oct. 29, 2021

(65) Prior Publication Data
US 2022/0246728 A1 Aug. 4, 2022

(30) Foreign Application Priority Data

Feb. 3, 2021 (KR) .......................... 10-2021-0015218

(51) Int. Cl.
*H01L 29/165* (2006.01)
*H01L 27/092* (2006.01)
(Continued)

(52) U.S. Cl.
CPC .......... *H01L 29/165* (2013.01); *H01L 27/092* (2013.01); *H01L 29/0607* (2013.01);
(Continued)

(58) Field of Classification Search
CPC ......... H01L 29/42392; H01L 21/76834; H01L 27/0886; H01L 27/0922; H01L 29/165; H01L 29/0607; H01L 21/823857; H01L 27/0924; H01L 29/78696; H01L 29/0673; H01L 29/0669; H01L 29/66439; H01L 29/775; H01L 21/823864; H01L 21/823431; H01L 21/823821;
(Continued)

(56) References Cited

U.S. PATENT DOCUMENTS 7,749,879 B2 7/2010 Ahn et al.
9,985,101 B2 5/2018 Hatem et al.
(Continued)

*Primary Examiner* — Younes Boulghassoul
(74) *Attorney, Agent, or Firm* — FINNEGAN, HENDERSON, FARABOW, GARRETT & DUNNER LLP

(57) ABSTRACT

A semiconductor device includes a substrate including a peripheral region, a first active pattern on the peripheral region, the first active pattern having an upper portion including first semiconductor patterns and second semiconductor patterns, which are alternately stacked, a first gate electrode intersecting the first active pattern, a pair of first source/drain patterns provided at both sides of the first gate electrode, respectively, a first capping layer on the first active pattern, a second capping layer on the first capping layer, and a first gate insulating layer between the second capping layer and the first gate electrode. The first capping layer is between a sidewall of the first active pattern and the second capping layer. A concentration of germanium (Ge) of the first capping layer is greater than a concentration of germanium of the second capping layer.

20 Claims, 53 Drawing Sheets

(51) Int. Cl.
    *H01L 29/06*    (2006.01)
    *H01L 29/40*    (2006.01)
    *H01L 29/417*   (2006.01)
    *H01L 29/423*   (2006.01)
    *H01L 29/786*   (2006.01)

(52) U.S. Cl.
    CPC .. *H01L 29/41733* (2013.01); *H01L 29/41775* (2013.01); *H01L 29/42392* (2013.01); *H01L 29/78618* (2013.01); *H01L 29/401* (2013.01)

(58) Field of Classification Search
    CPC ............... H01L 21/845; H01L 27/1211; H01L 29/41791; H01L 29/66795–66818; H01L 29/785–7856; H01L 2029/7857–7858; H01L 2924/13067; H01L 29/1041; H01L 29/1045; H01L 29/1054; H01L 29/7842; H01L 29/7845; H01L 21/823412; H01L 21/823807; H10B 12/36; H10B 12/056
    See application file for complete search history.

(56) References Cited

U.S. PATENT DOCUMENTS

| | | | |
|---|---|---|---|
| 10,374,059 B2 | 8/2019 | Cheng et al. | |
| 10,522,622 B2 | 12/2019 | Cheng et al. | |
| 10,741,641 B2 | 8/2020 | Guillorn et al. | |
| 10,763,368 B2 | 9/2020 | Chiang et al. | |
| 2016/0240616 A1* | 8/2016 | Cea | H01L 29/66818 |
| 2018/0323312 A1* | 11/2018 | Van Dal | H01L 29/42392 |
| 2020/0105756 A1 | 4/2020 | Crum et al. | |
| 2020/0273753 A1* | 8/2020 | Loubet | H01L 21/823481 |
| 2020/0381555 A1* | 12/2020 | Lee | H01L 27/0886 |
| 2020/0395354 A1* | 12/2020 | Lee | G06F 30/394 |
| 2020/0411515 A1* | 12/2020 | Kim | H01L 27/0886 |
| 2021/0043763 A1* | 2/2021 | Jung | H01L 27/0886 |
| 2021/0126102 A1* | 4/2021 | Nakjin | H01L 29/42376 |
| 2021/0134958 A1* | 5/2021 | Cho | H01L 29/78696 |
| 2022/0173053 A1* | 6/2022 | Park | H01L 29/0673 |
| 2022/0173214 A1* | 6/2022 | Park | H01L 29/66439 |
| 2022/0181489 A1* | 6/2022 | You | H01L 29/0673 |

\* cited by examiner

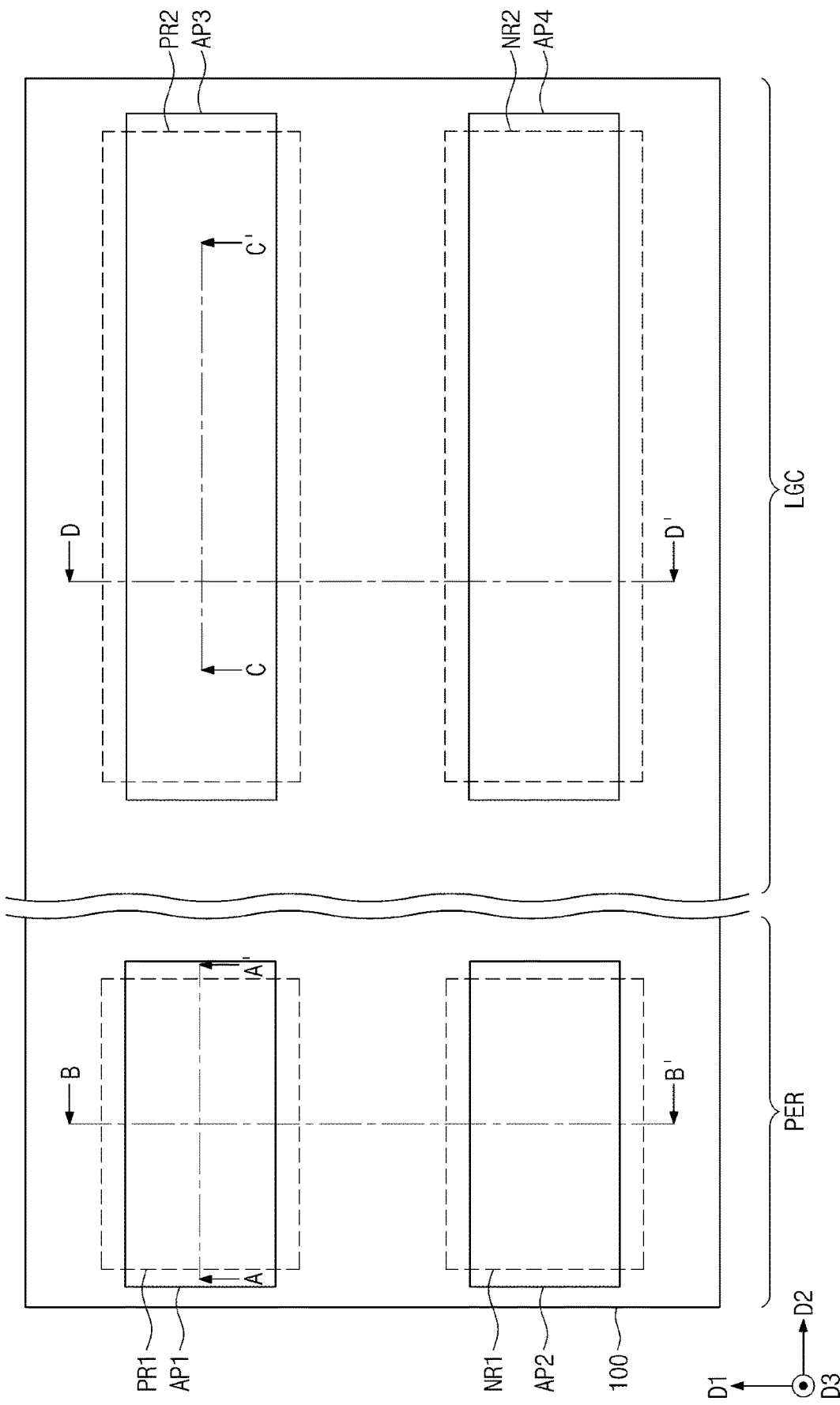

SEMICONDUCTOR DEVICE HAVING CAPPING LAYERS WITH DIFFERENT GERMANIUM CONCENTRATIONS OVER AN ACTIVE PATTERN

CROSS-REFERENCE TO RELATED APPLICATION

This U.S. non-provisional patent application claims priority under 35 U.S.C. § 119 to Korean Patent Application No. 10-2021-0015218, filed on Feb. 3, 2021, in the Korean Intellectual Property Office, the disclosure of which is hereby incorporated by reference in its entirety.

BACKGROUND

Embodiments of the inventive concept relate to a semiconductor device and, more particularly, to a semiconductor device including a field effect transistor.

Semiconductor devices may include integrated circuits including metal-oxide-semiconductor field effect transistors (MOSFETs). As sizes and design rules of semiconductor devices have been reduced, MOSFETs have been scaled down. Operating characteristics of semiconductor devices may deteriorate due to the reduction in the size of MOSFETs. Accordingly, various methods for forming semiconductor devices, which have excellent performance while overcoming limitations due to high integration have been studied.

SUMMARY

Embodiments of the inventive concepts may provide a semiconductor device with improved electrical characteristics.

In an aspect, a semiconductor device may include a substrate including a peripheral region and a logic cell region, a first active pattern on the peripheral region, the first active pattern having an upper portion including first semiconductor patterns and second semiconductor patterns, which are alternately stacked, a first gate electrode intersecting the first active pattern, a pair of first source/drain patterns provided at both sides of the first gate electrode, respectively, a first capping layer on the first active pattern, a second capping layer on the first capping layer, and a first gate insulating layer between the second capping layer and the first gate electrode. The first capping layer may be between a sidewall of the first active pattern and the second capping layer. A concentration of germanium (Ge) of the first capping layer may be greater than a concentration of germanium of the second capping layer.

In an aspect, a semiconductor device may include a substrate including a peripheral region and a logic cell region, a first active pattern and a second active pattern, which are provided on the peripheral region and the logic cell region, respectively, a first gate electrode and a second gate electrode, which intersect the first active pattern and the second active pattern, respectively, a first capping layer on the first active pattern, a second capping layer on the first capping layer, a first gate insulating layer between the second capping layer and the first gate electrode, and a second gate insulating layer between the second active pattern and the second gate electrode. An upper portion of the first active pattern may include first semiconductor patterns and second semiconductor patterns, which are alternately stacked. The first capping layer may and the second semiconductor patterns may include a same semiconductor material. The first capping layer may be between a sidewall of the first active pattern and the second capping layer.

In an aspect, a semiconductor device may include a substrate including a peripheral region and a logic cell region, a device isolation layer provided on the peripheral region to define a first active pattern, a pair of first source/drain patterns provided on the first active pattern, first semiconductor patterns and second semiconductor patterns provided between the first source/drain patterns, wherein the first and second semiconductor patterns are alternately stacked on the first active pattern and a bottom surface of a lowermost one of the second semiconductor patterns is located at a higher level than a top surface of the device isolation layer with respect to the substrate providing a base level, a first gate electrode intersecting the first and second semiconductor patterns on the first active pattern, a first capping layer on the first active pattern, a second capping layer on the first capping layer, a first gate insulating layer between the second capping layer and the first gate electrode, a pair of gate spacers provided on both sidewalls of the first gate electrode, respectively, a gate capping pattern on the first gate electrode, a first interlayer insulating layer on the gate capping pattern, an active contact penetrating the first interlayer insulating layer and electrically connected to at least one of the first source/drain patterns, a second interlayer insulating layer on the first interlayer insulating layer, a first metal layer provided in the second interlayer insulating layer and electrically connected to the active contact, and a second metal layer on the first metal layer. The first gate insulating layer may include an insulating layer on the second capping layer, and a high-k dielectric layer on the insulating layer. The insulating layer may include a silicon oxide layer. The first capping layer may be between a sidewall of the first active pattern and the second capping layer, and a concentration of germanium (Ge) of the first capping layer may be greater than a concentration of germanium of the second capping layer.

BRIEF DESCRIPTION OF THE DRAWINGS

The inventive concepts will become more apparent in view of the attached drawings and accompanying detailed description.

FIGS. 3, 5, 7, 9, 11 and 13 are plan views illustrating a method for manufacturing a semiconductor device according to some embodiments of the inventive concept.

DETAILED DESCRIPTION OF THE EMBODIMENTS

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present inventive concept. As used herein, the term "and/or" includes any and all combinations of one or more of the associated listed items. It is noted that aspects described with respect to one embodiment may be incorporated in different embodiments although not specifically described relative thereto. That is, all embodiments and/or features of any embodiments can be combined in any way and/or combination.

Figure 1:
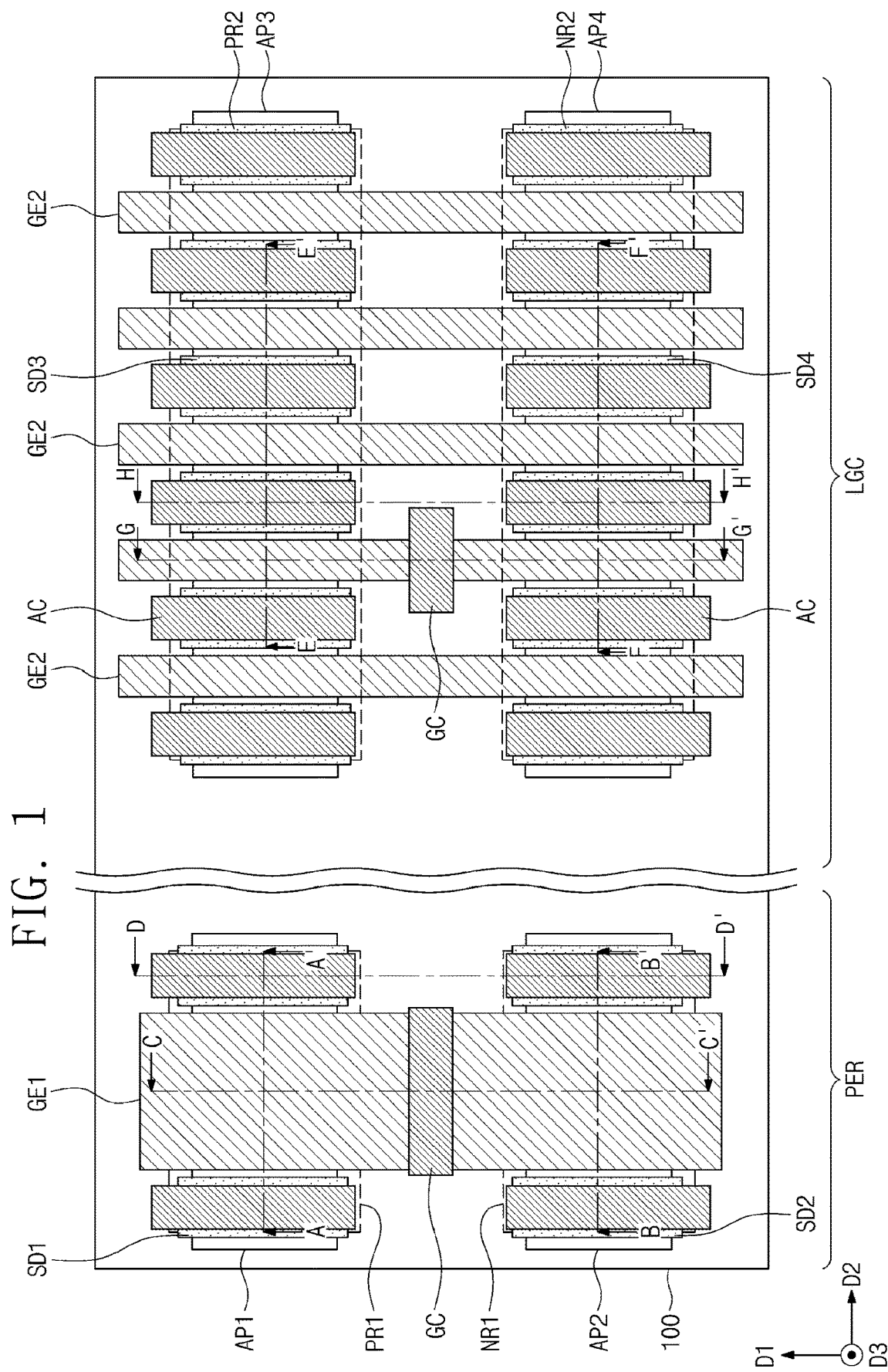
FIG. 1 is a plan view illustrating a semiconductor device according to some embodiments of the inventive concept.
Figure 2A:
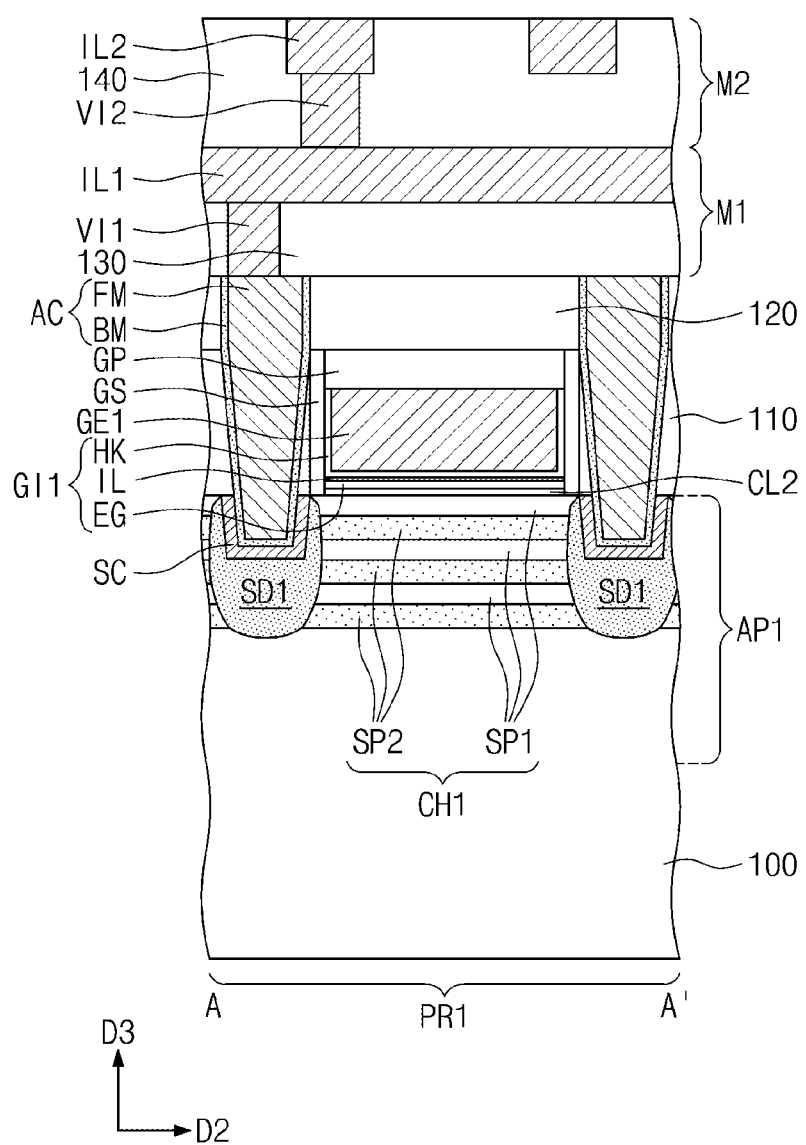
FIGS. 2A to 2H are cross-sectional views taken along lines A-A', B-B', C-C', D-D', E-E', F-F', G-G' and H-H' of FIG. 1, respectively.
Figure 2B:
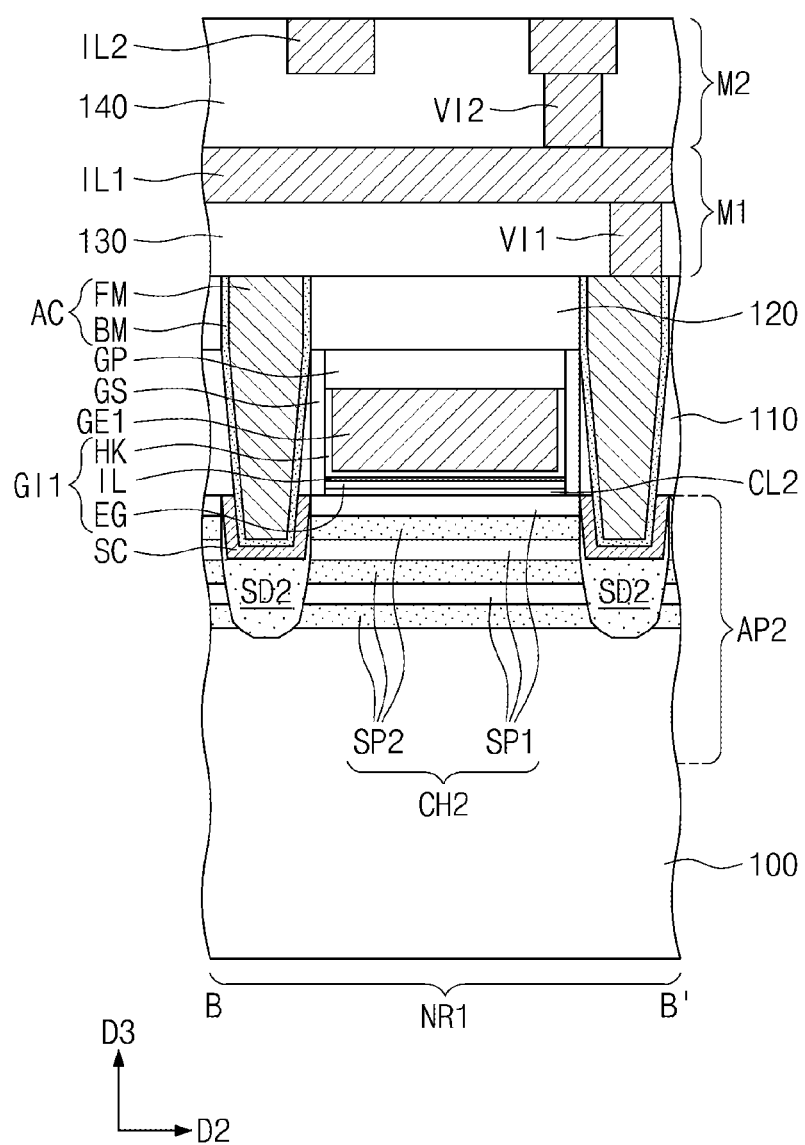
Figure 2C:
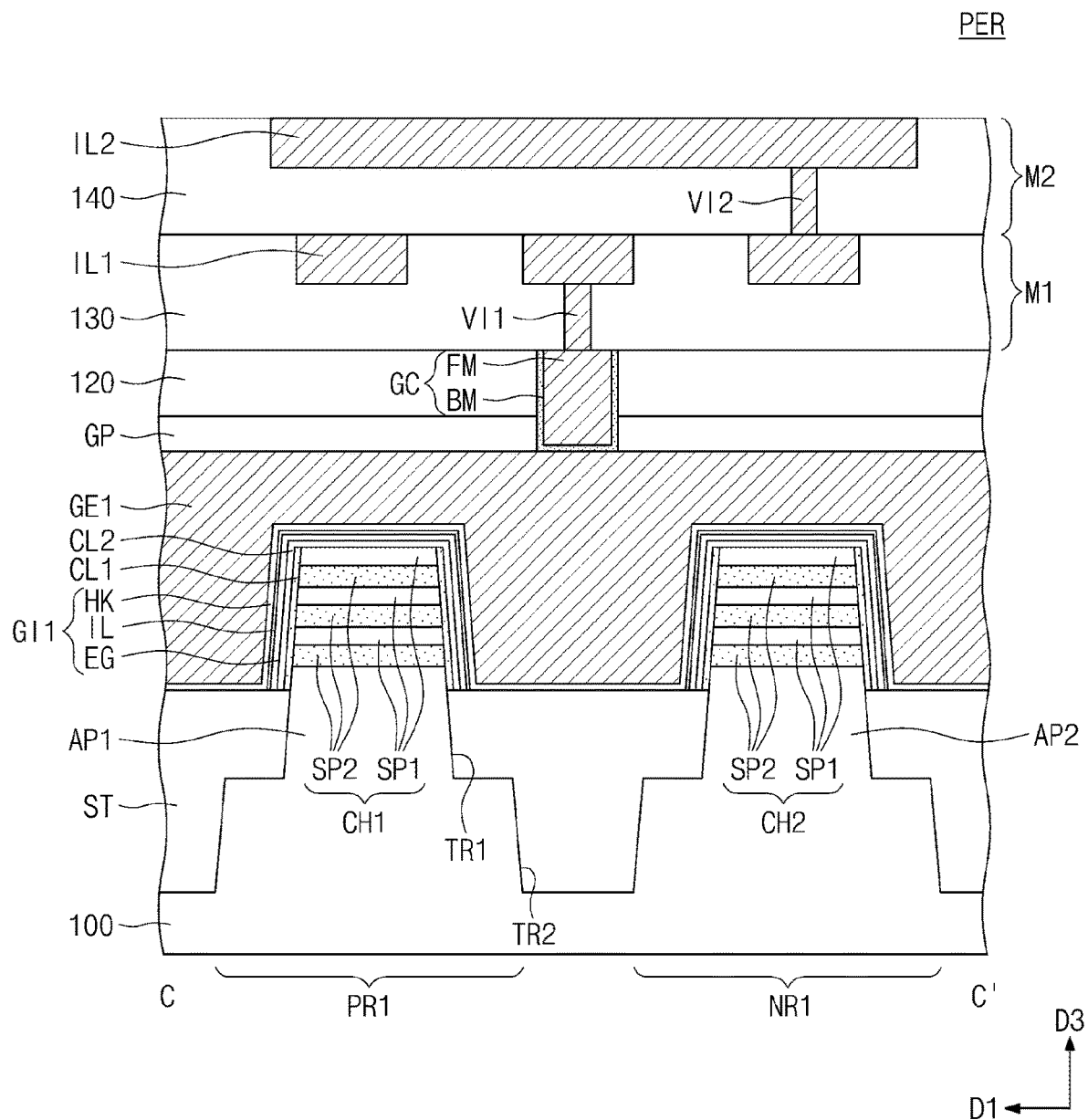
Figure 2D:
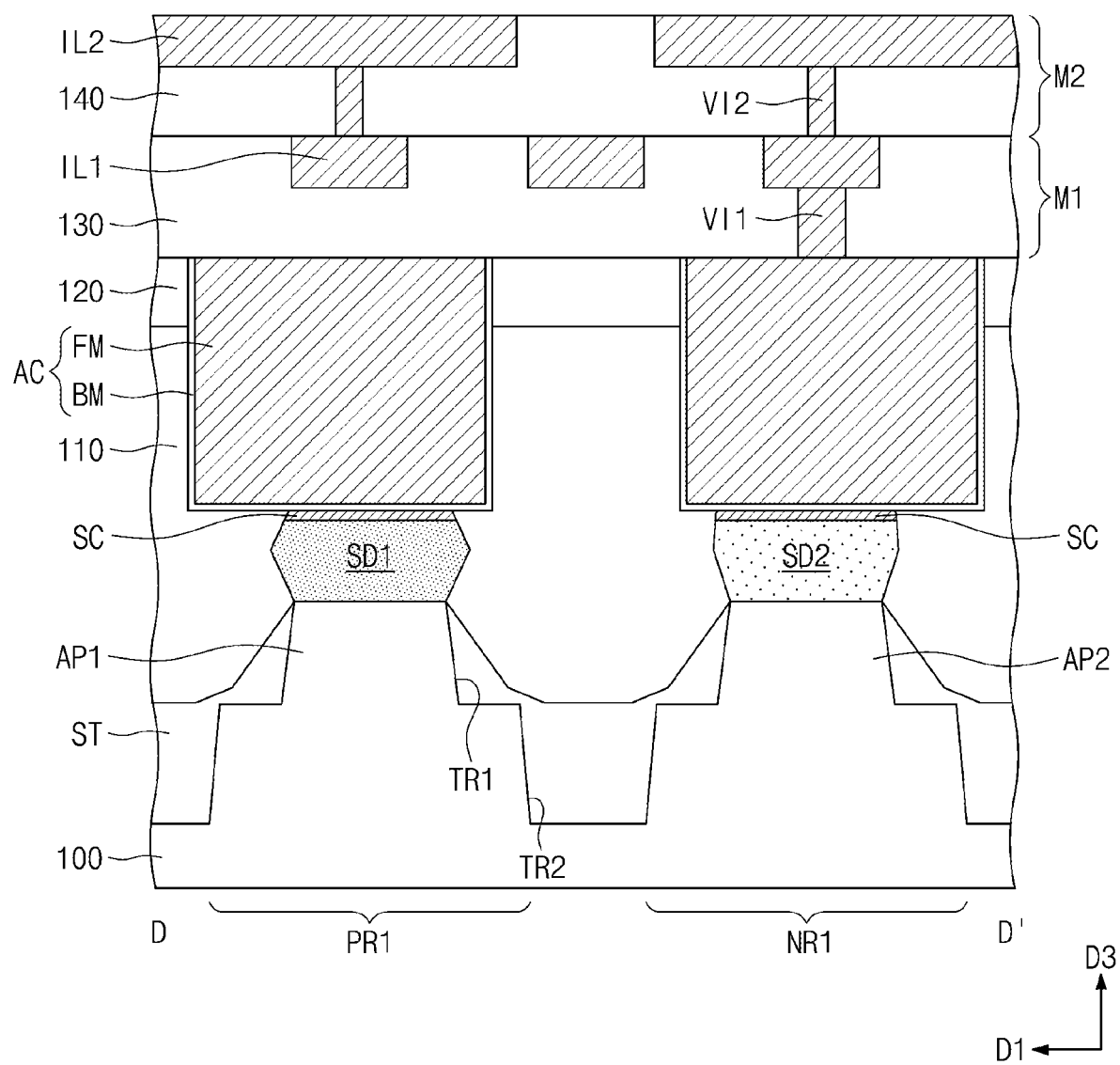
Figure 2E:
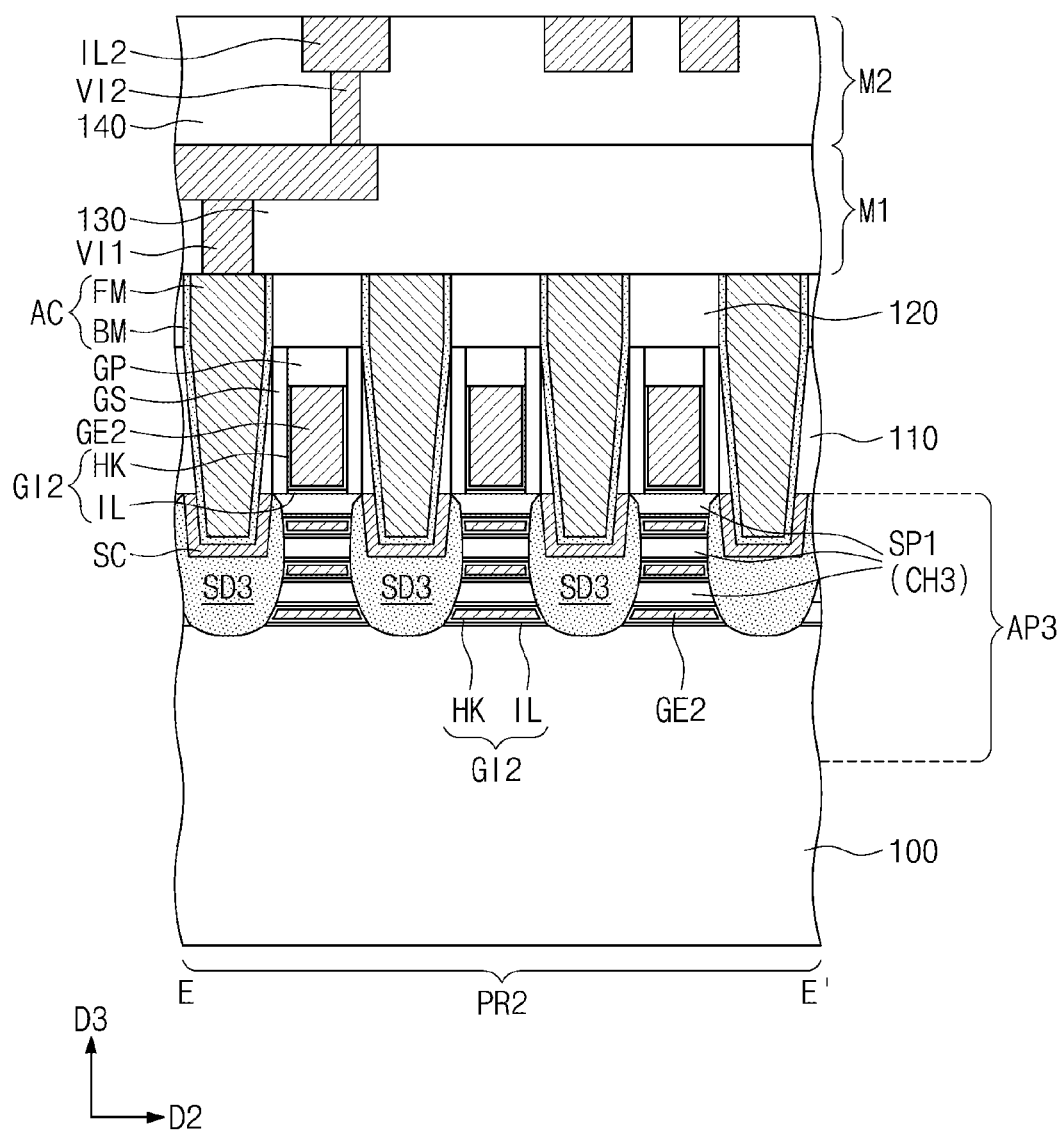
Figure 2F:
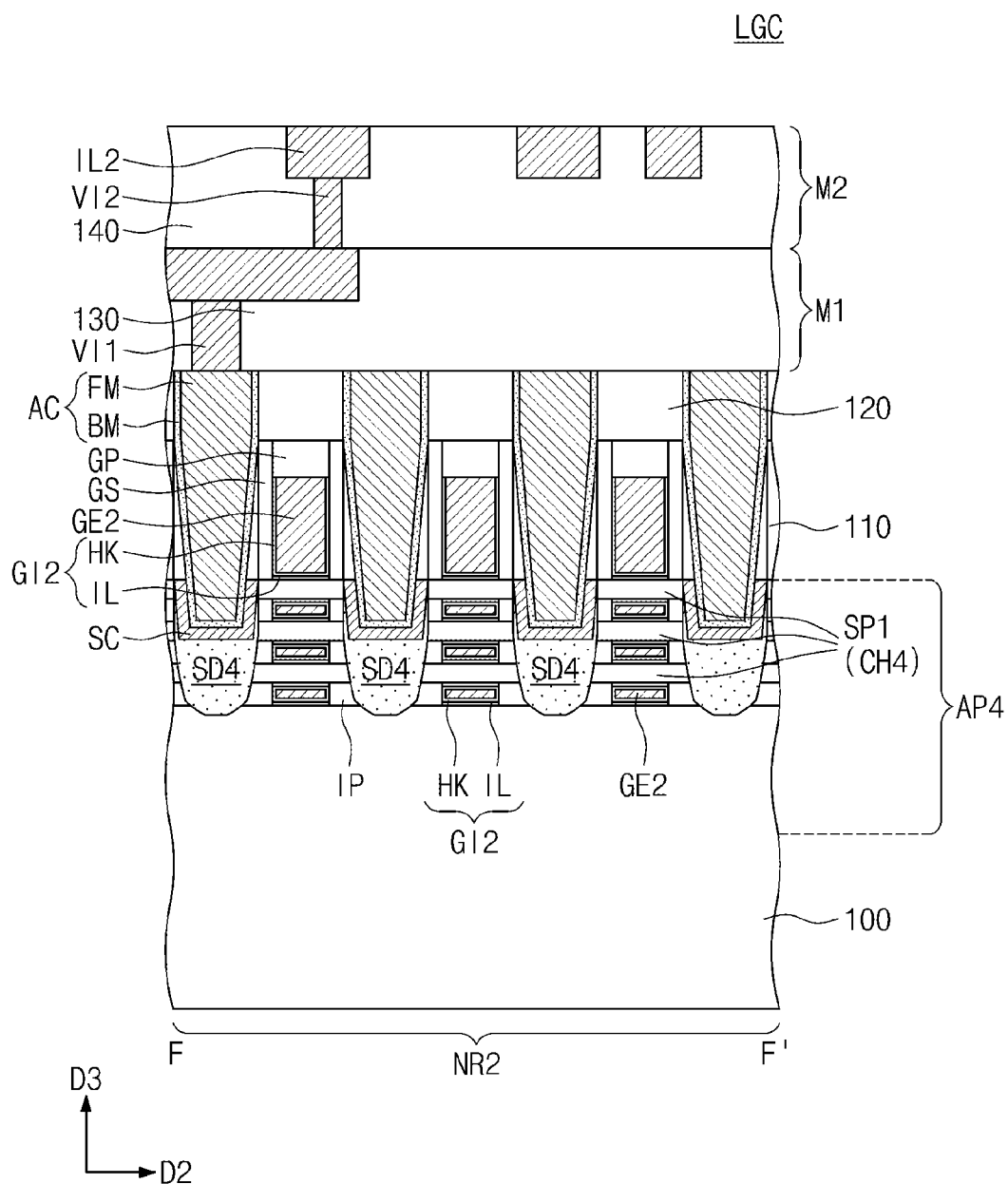
Figure 2G:
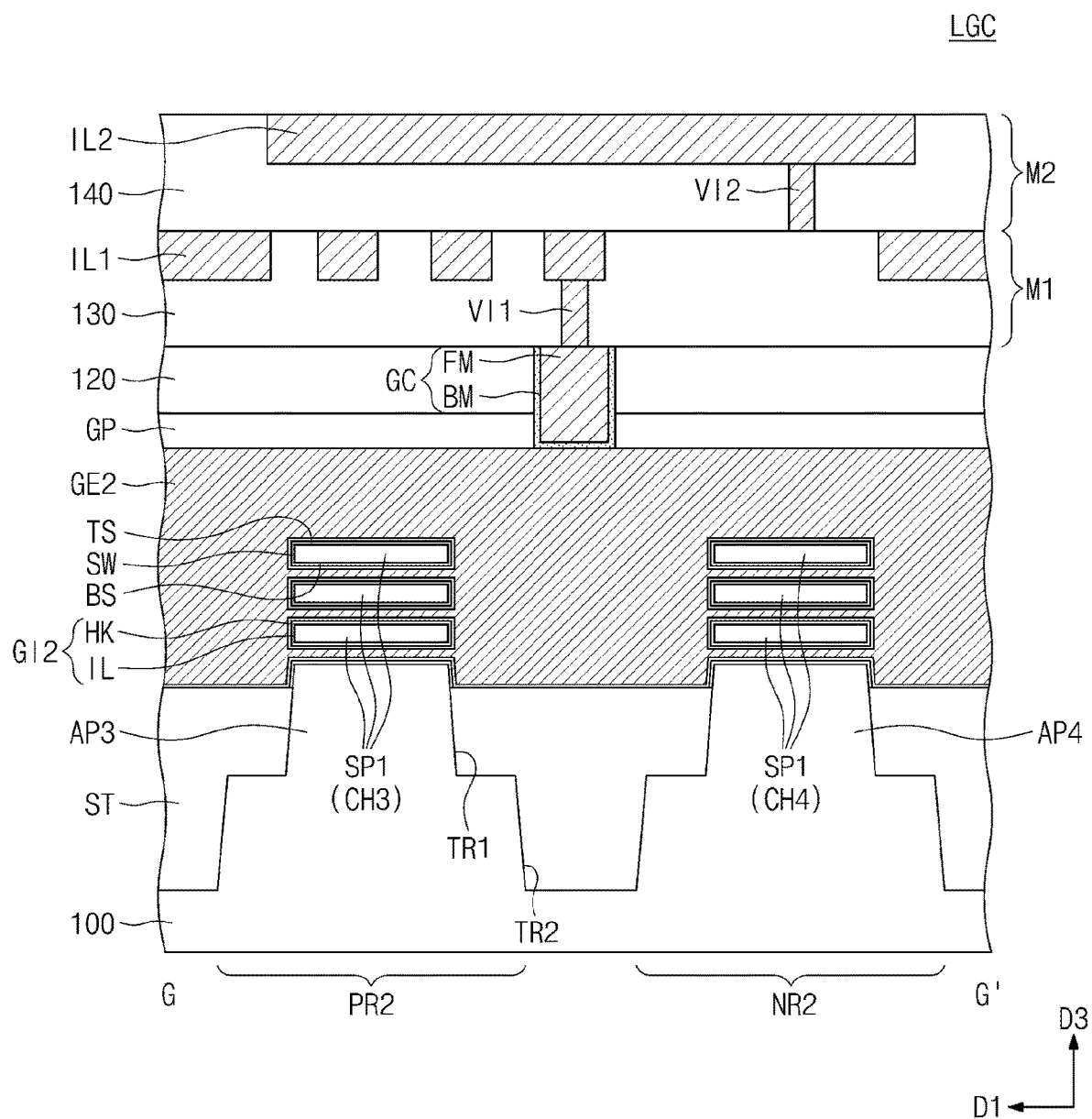
Figure 2H:
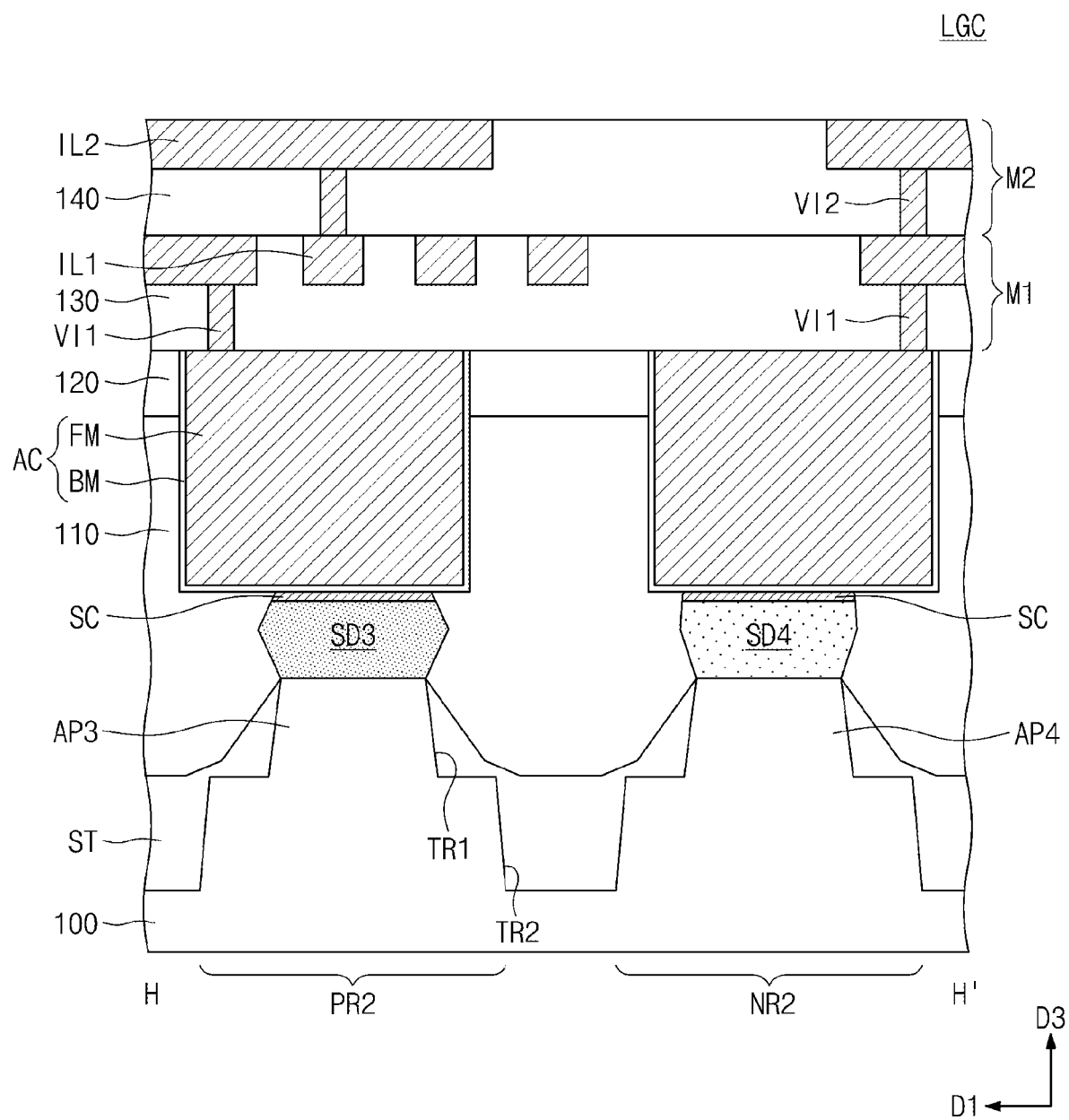
Figure 4A:
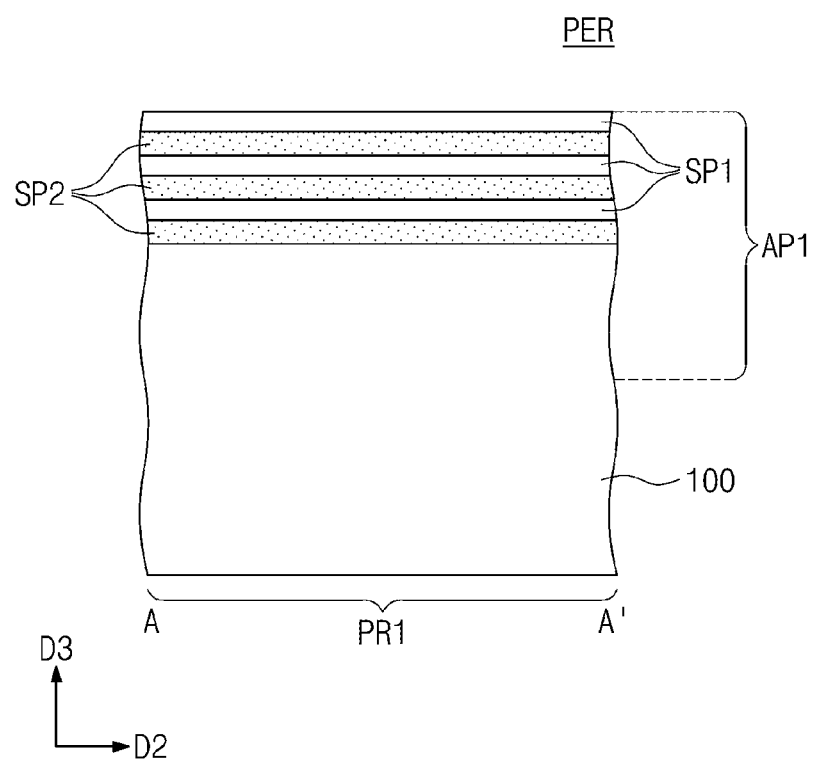
FIGS. 4A, 6A, 8A, 10A, 12A and 14A are cross-sectional views taken along lines A-A' of FIGS. 3, 5, 7, 9, 11 and 13, respectively.
Figure 4B:
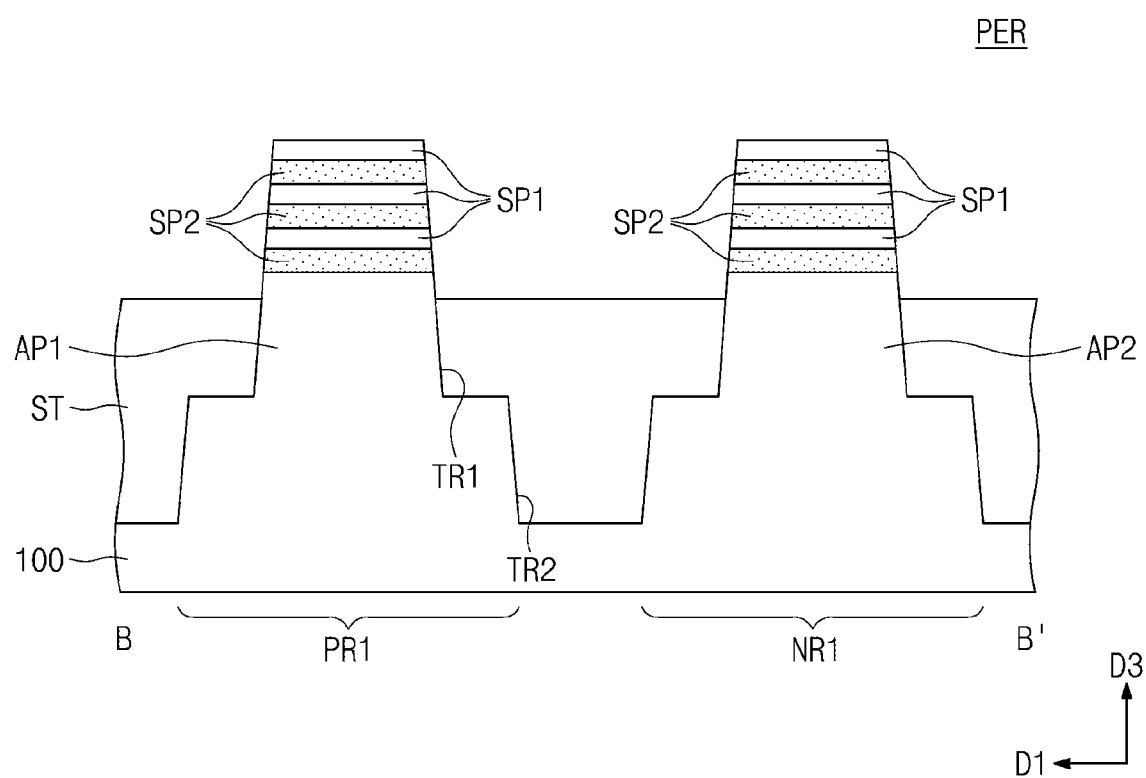
FIGS. 4B, 6B, 8B, 10B, 12B and 14B are cross-sectional views taken along lines B-B' of FIGS. 3, 5, 7, 9, 11 and 13, respectively.
Figure 4C:
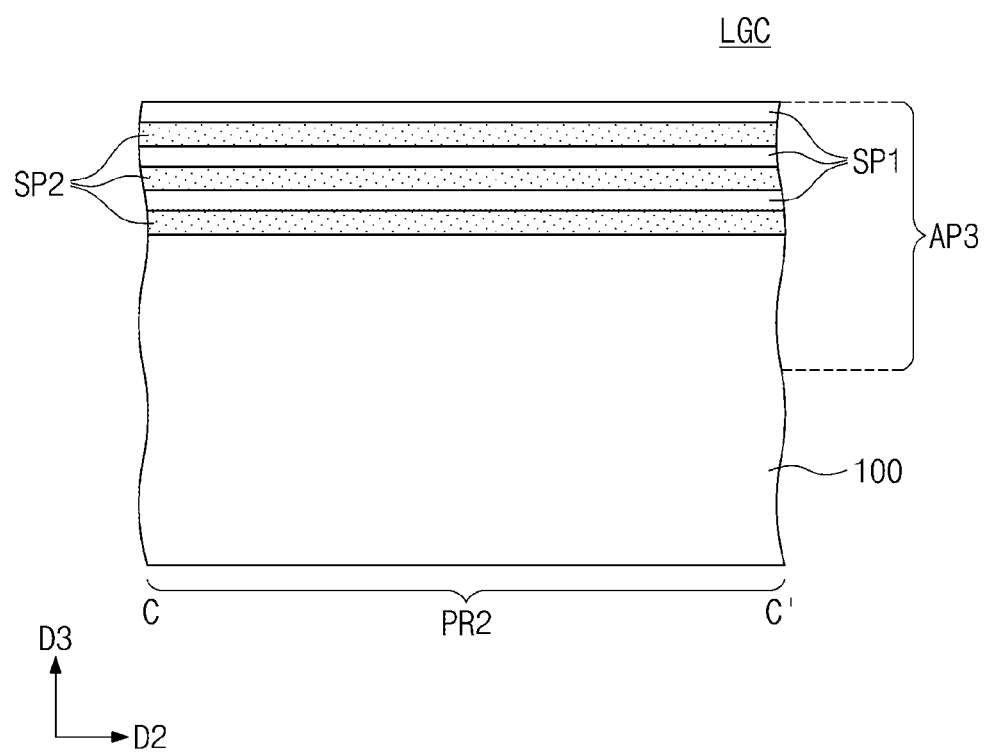
FIGS. 4C, 6C, 8C, 10C, 12C and 14C are cross-sectional views taken along lines C-C' of FIGS. 3, 5, 7, 9, 11 and 13, respectively.
Figure 4D:
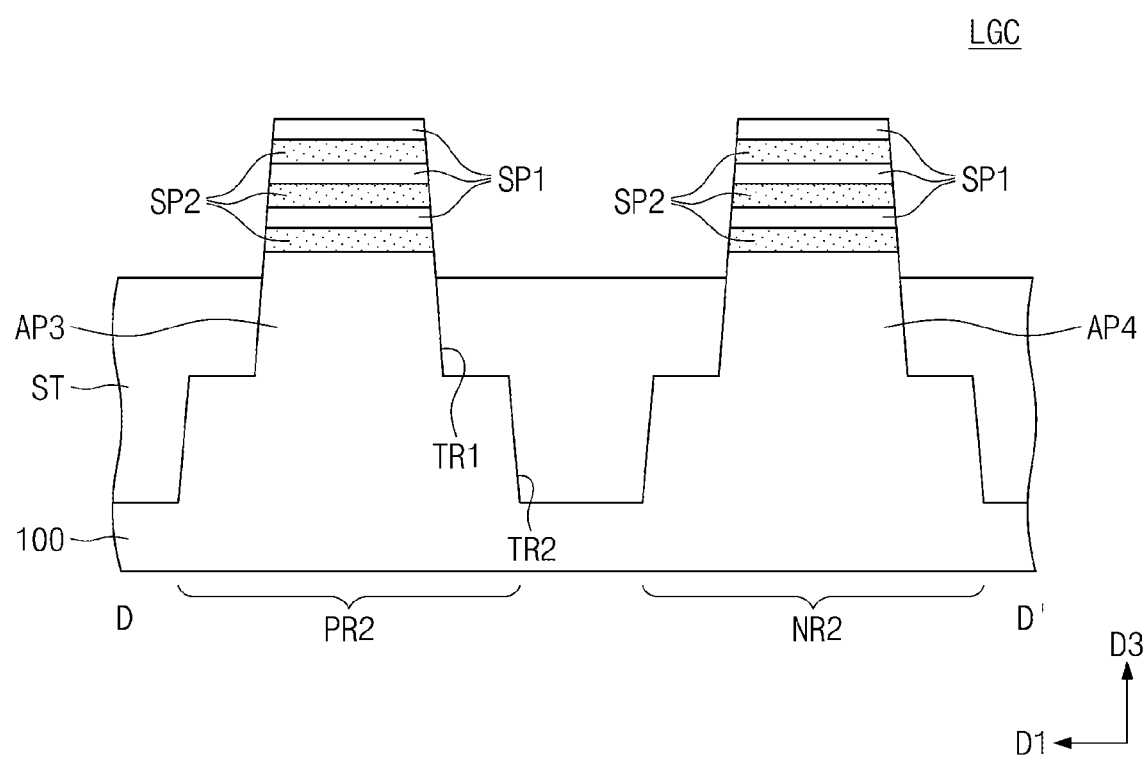
FIGS. 4D, 6D, 8D, 10D, 12D and 14D are cross-sectional views taken along lines D-D' of FIGS. 3, 5, 7, 9, 11 and 13, respectively.

FIG. 1 is a plan view illustrating a semiconductor device according to some embodiments of the inventive concept. FIGS. 2A to 2H are cross-sectional views taken along lines A-A', B-B', C-C', D-D', E-E', F-F', G-G' and H-H' of FIG. 1, respectively.

Referring to FIG. 1, a substrate 100 including a peripheral region PER and a logic cell region LGC may be provided. The substrate 100 may be a semiconductor substrate including silicon, germanium, or silicon-germanium or may be a compound semiconductor substrate. In some embodiments, the substrate 100 may be a silicon substrate. The peripheral region PER may be a region on which transistors constituting a processor core or an I/O terminal are disposed. The logic cell region LGC may be a region on which a standard cell constituting a logic circuit is disposed. The peripheral region PER may include a long gate transistor of which a gate length (i.e., a channel length) is relatively long. The operating power of the transistors of the peripheral region PER may be higher than the operating power of transistors of the logic cell region LGC. Hereinafter, the transistors of the peripheral region PER will be described in detail with reference to FIGS. 1 and 2A to 2D.

The peripheral region PER may include a first PMOSFET region PR1 and a first NMOSFET region NR1. The first PMOSFET region PR1 and the first NMOSFET region NR1 may be defined by a second trench TR2 formed in an upper portion of the substrate 100. In other words, the second trench TR2 may be disposed between the first PMOSFET region PR1 and the first NMOSFET region NR1. The first PMOSFET region PR1 and the first NMOSFET region NR1 may be spaced apart from each other in a first direction D1 with the second trench TR2 interposed therebetween.

A first active pattern AP1 and a second active pattern AP2 may be defined by a first trench TR1 formed in the upper portion of the substrate 100. The first active pattern AP1 and the second active pattern AP2 may be provided on the first PMOSFET region PR1 and the first NMOSFET region NR1, respectively. The first trench TR1 may be shallower than the second trench TR2. The first and second active patterns AP1 and AP2 may extend in a second direction D2. The first and second active patterns AP1 and AP2 may be portions of the substrate 100, which vertically protrude, i.e., protrude in the D3 direction.

A device isolation layer ST may at least partially fill the first and second trenches TR1 and TR2. The device isolation layer ST may include a silicon oxide layer. Upper portions of the first and second active patterns AP1 and AP2 may vertically protrude upward, i.e., in the D3 direction, from the device isolation layer ST (see FIG. 2C). The device isolation layer ST may not cover the upper portions of the first and second active patterns AP1 and AP2. The device isolation layer ST may cover or be on sidewalls of lower portions of the first and second active patterns AP1 and AP2 in the D1 direction.

The upper portion of each of the first and second active patterns AP1 and AP2 may include first semiconductor patterns SP1 and second semiconductor patterns SP2, which are alternately stacked. The first semiconductor patterns SP1 adjacent to each other may be spaced apart from each other in a vertical direction (i.e., a third direction D3) with the second semiconductor pattern SP2 interposed therebetween. The first and second semiconductor patterns SP1 and SP2 alternately stacked may vertically overlap with each other in the D3 direction.

The first semiconductor patterns SP1 may include one of silicon (Si), germanium (Ge), and silicon-germanium (SiGe), and the second semiconductor patterns SP2 may include another of silicon (Si), germanium (Ge), and silicon-germanium (SiGe). For example, the first semiconductor patterns SP1 may include silicon (Si), and the second semiconductor patterns SP2 may include silicon-germanium (SiGe).

A pair of first source/drain patterns SD1 may be provided in the upper portion of the first active pattern AP1. The first source/drain patterns SD1 may be dopant regions having a first conductivity type (e.g., a P-type). A first channel pattern CH1 may be defined between the pair of first source/drain patterns SD1. The first channel pattern CH1 may include the first and second semiconductor patterns SP1 and SP2 disposed between the pair of first source/drain patterns SD1.

A pair of second source/drain patterns SD2 may be provided in the upper portion of the second active pattern AP2. The second source/drain patterns SD2 may be dopant regions having a second conductivity type (e.g., an N-type). A second channel pattern CH2 may be defined between the pair of second source/drain patterns SD2. The second channel pattern CH2 may include the first and second semiconductor patterns SP1 and SP2 disposed between the pair of second source/drain patterns SD2.

The first and second source/drain patterns SD1 and SD2 may include epitaxial patterns formed by a selective epitaxial growth (SEG) process. In some embodiments, a top surface of each of the first and second source/drain patterns SD1 and SD2 may be disposed at substantially the same level as atop surface of the uppermost one of the first semiconductor patterns SP1 in the D3 direction.

The first source/drain patterns SD1 may include a semiconductor element (e.g., SiGe) of which a lattice constant is greater than that of a semiconductor element of the substrate 100. Thus, the first source/drain patterns SD1 may provide compressive stress to the first channel pattern CH1. The second source/drain patterns SD2 may include the same semiconductor element (e.g., silicon) as the substrate 100.

A first gate electrode GE1 may intersect the first and second active patterns AP1 and AP2 and may extend in the first direction D1. The first gate electrode GE1 may vertically overlap (i.e., in the D3 direction) with the first and second channel patterns CH1 and CH2.

Referring again to FIG. 2C, the first gate electrode GE1 may be provided on a top surface and both sidewalls of each of the first and second channel patterns CH1 and CH2. In other words, the transistors of the peripheral region PER, according to the present embodiments, may be three-dimensional (3D) field effect transistors in which the first gate electrode GE1 three-dimensionally borders or surrounds channels.

Referring again to FIGS. 1 and 2A to 2D, a pair of gate spacers GS may be disposed on both sidewalls of the first gate electrode GE1, respectively. The gate spacers GS may extend along the first gate electrode GE1 in the first direction D1. Top surfaces of the gate spacers GS may be higher than a top surface of the first gate electrode GE1 as shown in the cross-sectional view. The top surfaces of the gate spacers GS may be coplanar with a top surface of a first interlayer insulating layer 110 to be described below. The gate spacers GS may include at least one of SiCN, SiCON, or SiN. In certain embodiments, each of the gate spacers GS may have a multi-layered structure formed of at least two of SiCN, SiCON, or SiN.

A gate capping pattern GP may be provided on the first gate electrode GE1. The gate capping pattern GP may extend along the first gate electrode GE1 in the first direction D1. The gate capping pattern GP may include a material having an etch selectivity with respect to first and second interlayer insulating layers 110 and 120 to be described below. For example, the gate capping pattern GP may include at least one of SiON, SiCN, SiCON, or SiN.

A first capping layer CL1 may be provided on a sidewall of the first active pattern AP1 and a sidewall of the second active pattern AP2. The first capping layer CL1 may be provided on a sidewall of the upper portion of each of the first and second active patterns AP1 and AP2. In other words, the first capping layer CL1 may be provided on a sidewall of the first channel pattern CH1 and a sidewall of the second channel pattern CH2. Particularly, the first capping layer CL1 may extend along sidewalls of the first and second semiconductor patterns SP1 and SP2. The first capping layer CL1 may be disposed between the sidewall of each of the first and second active patterns AP1 and AP2 and a second capping layer CL2 to be described below.

The first capping layer CL1 may include the same semiconductor material as the second semiconductor patterns SP2. For example, the first capping layer CL1 and the second semiconductor patterns SP2 may include silicon-germanium (SiGe). Unlike FIG. 2C, the first capping layer CL1 and the second semiconductor patterns SP2 may be formed in one body or as a monolithic structure without an interface therebetween. The first capping layer CL1 may not extend onto a top surface of each of the first and second active patterns AP1 and AP2. The first capping layer CL1 may be conformally provided. For example, a thickness of the first capping layer CL1 may range from about 1 nm to 5 nm.

The first capping layer CL1 may be provided on the first and second active patterns AP1 and AP2 on the peripheral region PER. Particularly, the first capping layer CL1 may be provided on the sidewalls of the second semiconductor patterns SP2. If the first capping layer CL1 is not provided, due to a difference in band gap between the first semiconductor patterns SP1 and the second semiconductor patterns SP2, it may be difficult to control threshold voltages of the transistors of the peripheral region PER. Because the first capping layer CL1 including the same semiconductor material as the second semiconductor patterns SP2 is provided, the threshold voltages of the transistors of the peripheral region PER may be reduced and may be uniformly controlled. As a result, electrical characteristics of the semiconductor device may be improved.

A second capping layer CL2 may be provided on the first capping layer CL1. The second capping layer CL2 may be on and at least partially cover the first capping layer CL1. The second capping layer CL2 may be disposed between the first capping layer CL1 and a first gate insulating layer GI1 to be described below. The second capping layer CL2 may be disposed between the top surface of each of the first and second active patterns AP1 and AP2 and the first gate insulating layer GI1 to be described later. For example, the second capping layer CL2 may include silicon (Si). A concentration of germanium (Ge) of the first capping layer CL1 may be greater than a concentration of germanium (Ge) of the second capping layer CL2. The second capping layer CL2 may be conformally provided. For example, a thickness of the second capping layer CL2 may range from about 1 nm to 2 nm.

Because the second capping layer CL2 is provided, it may be possible to prevent or inhibit a surface of the first capping layer CL1 from being oxidized. As a result, the electrical characteristics of the semiconductor device may be improved.

A first gate insulating layer GI1 may be disposed between the first gate electrode GE1 and the second capping layer CL2. The first gate insulating layer GI1 may extend along a bottom surface of the first gate electrode GE1 thereon. The first gate insulating layer GI1 may be on and at least partially cover a top surface of the device isolation layer ST disposed under the first gate electrode GE1.

The first gate insulating layer GI1 may include a first insulating layer EG on and at least partially covering the second capping layer CL2. The first gate insulating layer GI1 may further include a second insulating layer IL on the first insulating layer EG, and a high-k dielectric layer HK on the second insulating layer IL. The second insulating layer IL may be disposed between the first insulating layer EG and the high-k dielectric layer HK.

In some embodiments, the high-k dielectric layer HK may be thicker than the second insulating layer IL. The first insulating layer EG may be thicker than the high-k dielectric layer HK. Each of the first and second insulating layers EG and IL may include a silicon oxide layer or a silicon oxynitride layer. For example, each of the first and second insulating layers EG and IL may include a silicon oxide layer. In this case, because the first and second insulating layers EG and IL include the same material, an interface therebetween may not be checked or visible. In other words, the first and second insulating layers EG and IL may constitute a single monolithic silicon oxide layer. The high-k dielectric layer HK may include a high-k dielectric material of which a dielectric constant is greater than that of silicon oxide. For example, the high-k dielectric material may include at least one of hafnium oxide, hafnium-silicon oxide, hafnium-zirconium oxide, hafnium-tantalum oxide, lanthanum oxide, zirconium oxide, zirconium-silicon oxide, tantalum oxide, titanium oxide, barium-strontium-titanium oxide, barium-titanium oxide, strontium-titanium oxide, lithium oxide, aluminum oxide, lead-scandium-tantalum oxide, or lead-zinc niobate.

In certain embodiments, the semiconductor device according to embodiments of the inventive concepts may include a negative capacitance (NC) field effect transistor (FET) using a negative capacitor. For example, the first gate insulating layer GI1 may include a ferroelectric material layer having ferroelectric properties and a paraelectric material layer having paraelectric properties.

The ferroelectric material layer may have a negative capacitance, and the paraelectric material layer may have a positive capacitance. For example, when two or more capacitors are connected in series to each other and a capacitance of each of the capacitors has a positive value, a total capacitance may be reduced to be less than the capacitance of each of the capacitors. When at least one of two or more capacitors connected in series to each other has a negative value, however, a total capacitance may have a positive value and may be greater than an absolute value of a capacitance of each of the capacitors.

When the ferroelectric material layer having the negative capacitance is connected in series to the paraelectric material layer having the positive capacitance, a total capacitance value of the ferroelectric and paraelectric material layers connected in series may increase. The transistor including the ferroelectric material layer may have a subthreshold swing (SS) less than 60 mV/decade at room temperature by using the increase in the total capacitance value.

The ferroelectric material layer may have the ferroelectric properties. For example, the ferroelectric material layer may include at least one of hafnium oxide, hafnium zirconium oxide, barium strontium titanium oxide, barium titanium oxide, or lead zirconium titanium oxide. Here, for an example, the hafnium zirconium oxide may be a material formed by doping hafnium oxide with zirconium (Zr). In other embodiments, the hafnium zirconium oxide may be a compound of hafnium (Hf), zirconium (Zr), and oxygen (O).

The ferroelectric material layer may further include dopants doped therein. For example, the dopants may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), or tin (Sn). A kind of the dopants included in the ferroelectric material layer may be selected based on a kind of the ferroelectric material included in the ferroelectric material layer.

When the ferroelectric material layer includes hafnium oxide, the dopants included in the ferroelectric material layer may include at least one of, for example, gadolinium (Gd), silicon (Si), zirconium (Zr), aluminum (Al), or yttrium (Y).

When the dopants are aluminum (Al), the ferroelectric material layer may include aluminum of 3 at % (atomic %) to 8 at %. Here, a ratio of the dopants may be a ratio of the amount of aluminum to a sum of the amounts of hafnium and aluminum.

When the dopants are silicon (Si), the ferroelectric material layer may include silicon of 2 at % to 10 at %. When the dopants are yttrium (Y), the ferroelectric material layer may include yttrium of 2 at % to 10 at %. When the dopants are gadolinium (Gd), the ferroelectric material layer may include gadolinium of 1 at % to 7 at %. When the dopants are zirconium (Zr), the ferroelectric material layer may include zirconium of 50 at % to 80 at %.

The paraelectric material layer may have the paraelectric properties. For example, the paraelectric material layer may include at least one of silicon oxide or a metal oxide having a high-k dielectric constant. For example, the metal oxide included in the paraelectric material layer may include at least one of hafnium oxide, zirconium oxide, or aluminum oxide. However, embodiments of the inventive concepts are not limited thereto.

The ferroelectric material layer and the paraelectric material layer may include the same material. The ferroelectric material layer may have the ferroelectric properties, but the paraelectric material layer may not have the ferroelectric properties. For example, when the ferroelectric material layer and the paraelectric material layer include hafnium oxide, a crystal structure of hafnium oxide included in the ferroelectric material layer may be different from a crystal structure of hafnium oxide included in the paraelectric material layer.

The ferroelectric material layer may have a thickness showing the ferroelectric properties. For example, the thickness of the ferroelectric material layer may range from about 0.5 nm to 10 nm. However, embodiments of the inventive concepts are not limited thereto. A critical thickness showing the ferroelectric properties may be based on a kind of a ferroelectric material, and thus the thickness of the ferroelectric material layer may vary based on a kind of the ferroelectric material included therein.

For some examples, the first gate insulating layer GI1 may include a single ferroelectric material layer. For other examples, the first gate insulating layer GI1 may include a plurality of ferroelectric material layers spaced apart from each other. The first gate insulating layer GI1 may have a stack structure in which the ferroelectric material layers and the paraelectric material layers are alternately stacked.

The first gate electrode GET may include a first metal pattern and a second metal pattern on the first metal pattern. The first metal pattern may be provided on the first gate insulating layer GI1 and may be adjacent to the first and second channel patterns CH1 and CH2. The first metal pattern may include a work function metal for adjusting a threshold voltage of the transistor. A desired threshold voltage of the transistor may be obtained by adjusting a thickness and a composition of the first metal pattern.

The first metal pattern may include a metal nitride layer. For example, the first metal pattern may include nitrogen (N) and at least one metal selected from a group consisting of titanium (Ti), tantalum (Ta), aluminum (Al), tungsten (W), and molybdenum (Mo). In addition, the first metal pattern may further include carbon (C). In some embodiments, the first metal pattern may include a plurality of stacked work function metal layers.

The second metal pattern may include a metal having a resistance less than that of the first metal pattern. For example, the second metal pattern may include at least one metal selected from a group consisting of tungsten (W), aluminum (Al), titanium (Ti), and tantalum (Ta).

A first interlayer insulating layer 110 may be provided on the substrate 100. The first interlayer insulating layer 110 may be on and at least partially cover the gate spacers GS and the first and second source/drain patterns SD1 and SD2. A top surface of the first interlayer insulating layer 110 may be substantially coplanar with a top surface of the gate capping pattern GP and top surfaces of the gate spacers GS. A second interlayer insulating layer 120 may be disposed on the first interlayer insulating layer 110 and the gate capping pattern GP. For example, each of the first and second interlayer insulating layers 110 and 120 may include a silicon oxide layer.

Active contacts AC may penetrate the second and first interlayer insulating layers 120 and 110 and may be electrically connected to the first and second source/drain patterns SD1 and SD2. A pair of the active contacts AC may be provided at both sides of the first gate electrode GE1, respectively. The active contact AC may have a bar shape extending in the first direction D1 when viewed in a plan view.

The active contact AC may include a conductive pattern FM and a barrier pattern BM bordering or surrounding the conductive pattern FM. For example, the conductive pattern FM may include at least one metal of aluminum, copper, tungsten, molybdenum, or cobalt. The barrier pattern BM may be on and at least partially cover a bottom surface and sidewalls of the conductive pattern FM. The barrier pattern BM may include a metal layer/a metal nitride layer. The metal layer may include at least one of titanium, tantalum, tungsten, nickel, cobalt, or platinum. The metal nitride layer may include at least one of a titanium nitride (TiN) layer, a tantalum nitride (TaN) layer, a tungsten nitride (WN) layer, a nickel nitride (NiN) layer, a cobalt nitride (CoN) layer, or a platinum nitride (PtN) layer.

The active contact AC may be a self-aligned contact. In other words, the active contact AC may be formed to be self-aligned using the gate capping pattern GP and the gate spacer GS. For example, the active contact AC may be on and at least partially cover at least a portion of a sidewall of the gate spacer GS. Even though not shown in the drawings, the active contact AC may be on and at least partially cover a portion of the top surface of the gate capping pattern GP.

Silicide patterns SC may be disposed between the active contact AC and the first source/drain pattern SD1 and between the active contact AC and the second source/drain pattern SD2, respectively. The active contact AC may be electrically connected to the source/drain pattern SD1 or SD2 through the silicide pattern SC. The silicide pattern SC may include a metal silicide and may include at least one of, for example, titanium silicide, tantalum silicide, tungsten silicide, nickel silicide, or cobalt silicide.

A gate contact GC may penetrate the second interlayer insulating layer 120 and the gate capping pattern GP and may be electrically connected to the first gate electrode GE1. The gate contact GC may be provided on the device isolation layer ST between the first PMOSFET region PR1 and the first NMOSFET region NR1. The gate contact GC may have a bar shape extending in the second direction D2 when viewed in a plan view. The gate contact GC may include a conductive pattern FM and a barrier pattern BM bordering or surrounding the conductive pattern FM, like the active contact AC.

A third interlayer insulating layer 130 may be provided on the second interlayer insulating layer 120. A first metal layer M1 may be provided in the third interlayer insulating layer 130. The first metal layer M1 may include first interconnection lines IL1 and first vias VI1. The first vias VI1 may be provided under the first interconnection lines IL1. The first interconnection lines IL1 may be arranged in the first direction D1. Each of the first interconnection lines IL1 may have a line or bar shape extending in the second direction D2.

The first vias VI1 may be provided under the first interconnection lines IL1 of the first metal layer M1. Each of some of the first vias VI1 may be disposed between a corresponding one of the active contacts AC and a corresponding one of the first interconnection lines ILL. Another of the first vias VI1 may be disposed between the gate contact GC and a corresponding one of the first interconnection lines IL1.

The first interconnection line IL1 and the first via VI1 of the first metal layer M1 may be formed by different processes. In other words, each of the first interconnection line IL1 and the first via VI1 may be formed by a single damascene process. The semiconductor device according to the present embodiments may be formed using a process providing integration of less than 20 nm.

A fourth interlayer insulating layer 140 may be provided on the third interlayer insulating layer 130. A second metal layer M2 may be provided in the fourth interlayer insulating layer 140. The second metal layer M2 may include second interconnection lines IL2. Each of the second interconnection lines IL2 may have a line or bar shape extending in the first direction D1. In other words, the second interconnection lines IL2 may extend in the first direction D1 in parallel to each other.

The second metal layer M2 may further include second vias VI2. The second vias VI2 may be provided under the second interconnection lines IL2. Each of the second vias VI2 may be disposed between a corresponding one of the first interconnection lines IL1 and a corresponding one of the second interconnection lines IL2.

The second interconnection line IL2 and the second via VI2 thereunder in the second metal layer M2 may be formed in one body or monolithic structure by the same process. In other words, the second interconnection line IL2 and the second via VI2 of the second metal layer M2 may be formed together by a dual damascene process.

The first interconnection lines IL1 of the first metal layer M1 and the second interconnection lines IL2 of the second metal layer M2 may include the same conductive material or different conductive materials. For example, each of the first and second interconnection lines IL1 and IL2 may include at least one metal selected from a group consisting of copper (Cu), ruthenium (Ru), cobalt (Co), tungsten (W), aluminum (Al), and molybdenum (Mo).

Even though not shown in the drawings, in some embodiments, metal layers (e.g., M3, M4, M5, etc.) may be additionally stacked on the fourth interlayer insulating layer 140. Each of the stacked metal layers may include routing interconnection lines.

Hereinafter, the transistors of the logic cell region LGC will be described in detail with reference to FIGS. 1 and 2E to 2H. The descriptions of the same technical features as the transistors of the peripheral region PER described with reference to FIGS. 1 and 2A to 2D will be omitted for the purpose of ease and convenience in explanation. In other words, differences between the transistors of the logic cell region LGC and the transistors of the peripheral region PER will be primarily described.

The logic cell region LGC may include a second PMOSFET region PR2 and a second NMOSFET region NR2. The second PMOSFET region PR2 and the second NMOSFET region NR2 may be defined by the second trench TR2 formed in the upper portion of the substrate 100. A third active pattern AP3 and a fourth active pattern AP4 may be defined by the first trench TR1 formed in the upper portion of the substrate 100. The third active pattern AP3 and the fourth active pattern AP4 may be provided on the second PMOSFET region PR2 and the second NMOSFET region NR2, respectively.

An upper portion of each of the third and fourth active patterns AP3 and AP4 may include first semiconductor patterns SP1, which are stacked and are spaced apart from each other. The stacked first semiconductor patterns SP1 may be spaced apart from each other in the third direction D3. Unlike the transistors of the peripheral region PER described above, the third and fourth active patterns AP3 and AP4 may not include the second semiconductor patterns SP2.

Third source/drain patterns SD3 may be provided in the upper portion of the third active pattern AP3. Fourth source/drain patterns SD4 may be provided in the upper portion of the fourth active pattern AP4. A third channel pattern CH3 may be defined between a pair of the third source/drain patterns SD3. A fourth channel pattern CH4 may be defined between a pair of the fourth source/drain patterns SD4. Each of the third and fourth channel patterns CH3 and CH4 may include the first semiconductor patterns SP1, which are stacked and are spaced apart from each other.

Each of the third source/drain patterns SD3 may be an epitaxial pattern containing dopants of the first conductivity type (e.g., the P-type). Each of the fourth source/drain patterns SD4 may be an epitaxial pattern containing dopants of the second conductivity type (e.g., the N-type).

Second gate electrodes GE2 may intersect the third and fourth channel patterns CH3 and CH4 and may extend in the first direction D1. The second gate electrode GE2 may vertically overlap with the third and fourth channel patterns CH3 and CH4. A pair of gate spacers GS may be disposed on both sidewalls of the second gate electrode GE2, respectively. A gate capping pattern GP may be provided on the second gate electrode GE2.

Referring again to FIG. 2G, the second gate electrode GE2 may border or surround each of the first semiconductor patterns SP1. The second gate electrode GE2 may be provided on a top surface TS, both sidewalls SW, and a bottom surface BS of the first semiconductor pattern SP1. The second gate electrode GE2 may border or surround the first semiconductor pattern SP1 constituting a channel. In other words, the transistors of the logic cell region LGC according to the present embodiments may be 3D field effect transistors (e.g., MBCFETs) in which the second gate electrode GE2 three-dimensionally borders or surrounds channels.

Referring again to FIGS. 1 and 2E to 2H, a second gate insulating layer GI2 may be disposed between the second gate electrode GE2 and the third channel pattern CH3 and between the second gate electrode GE2 and the fourth channel pattern CH4. The second gate insulating layer GI2 may include a second insulating layer IL directly on and at least partially covering each of the first semiconductor patterns SP1. Unlike the first gate insulating layer GI1 described above, the second gate insulating layer GI2 may not include the first insulating layer EG. In other words, the first insulating layer EG may be omitted in the transistors of the logic cell region LGC. The second gate electrode GE2 and the second gate insulating layer GI2 may be in and at least partially fill a space between the first semiconductor patterns SP1 vertically adjacent to each other.

An insulating pattern IP may be disposed between the second gate insulating layer GI2 and the fourth source/drain pattern SD4 on the second NMOSFET region NR2. The second gate electrode GE2 may be spaced apart from the fourth source/drain pattern SD4 by the second gate insulating layer GI2 and the insulating pattern IP. In other embodiments, the insulating pattern IP may be omitted on the second PMOSFET region PR2.

The first interlayer insulating layer 110 and the second interlayer insulating layer 120 may be provided on an entire top surface of the substrate 100. Active contacts AC may penetrate the second and first interlayer insulating layers 120 and 110 and may be connected to the third and fourth source/drain patterns SD3 and SD4, respectively. A gate contact GC may penetrate the second interlayer insulating layer 120 and the gate capping pattern GP and may be electrically connected to the second gate electrode GE2.

A first metal layer M1 and a second metal layer M2 may be provided on the second interlayer insulating layer 120. The active contacts AC, the gate contact GC, the first metal layer M1 and the second metal layer M2 may be substantially the same as described above with reference to FIGS. 1 and 2A to 2D.

As described above, the operating power of the transistors of the peripheral region PER may be higher than the operating power of the transistors of the logic cell region LGC. A thickness of the first gate insulating layer GI1 may be greater than a thickness of the second gate insulating layer GI2. This may be because the first gate insulating layer GI1 further includes the first insulating layer EG as compared with the second gate insulating layer GI2. In addition, referring again to FIG. 1, a width of the first gate electrode GE1 in the second direction D2 may be greater than a width of the second gate electrode GE2 in the second direction D2.

Figure 10A:
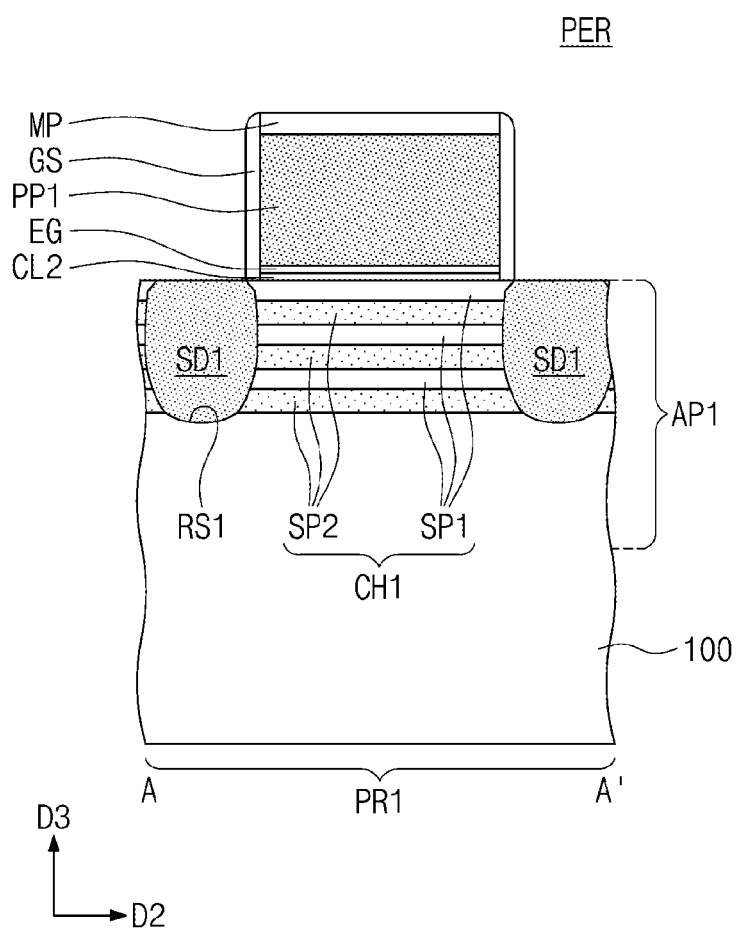
Figure 10B:
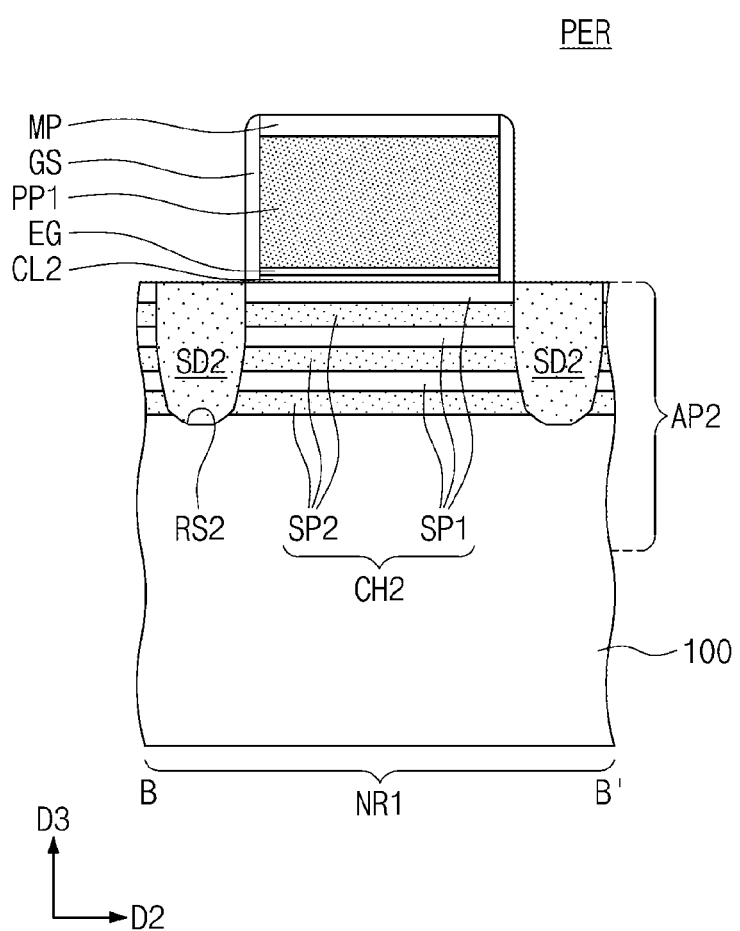
Figure 10C:
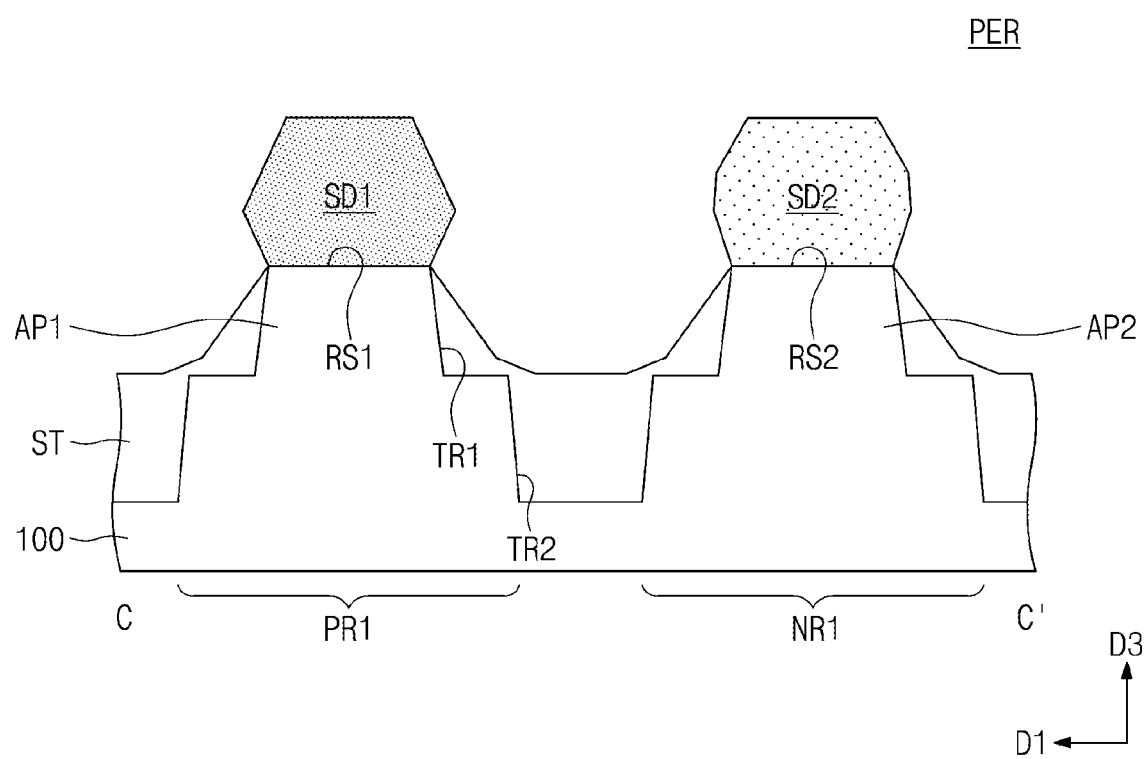
Figure 10D:
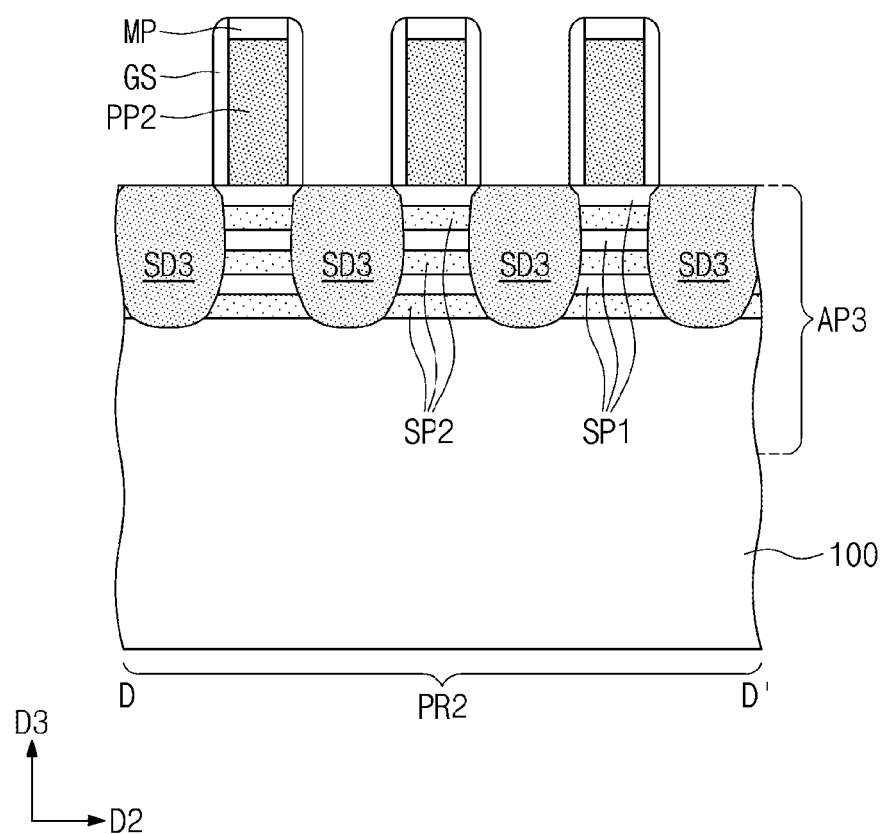
Figure 10E:
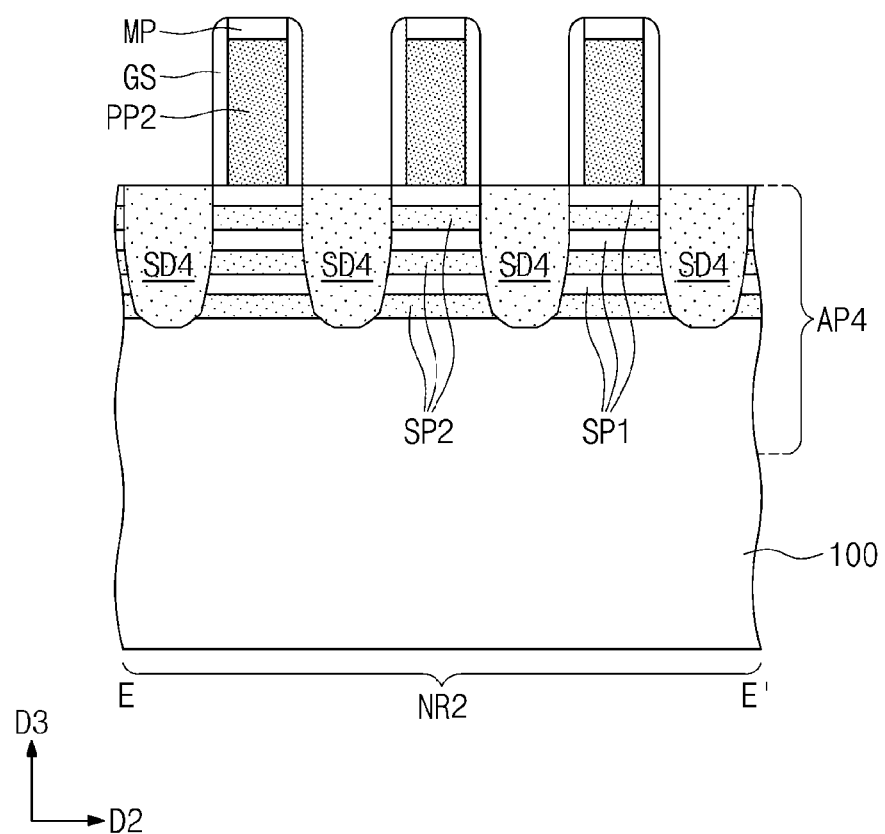
FIGS. 10E, 12E and 14E are cross-sectional views taken along lines E-E' of FIGS. 9, 11 and 13, respectively.
Figure 10F:
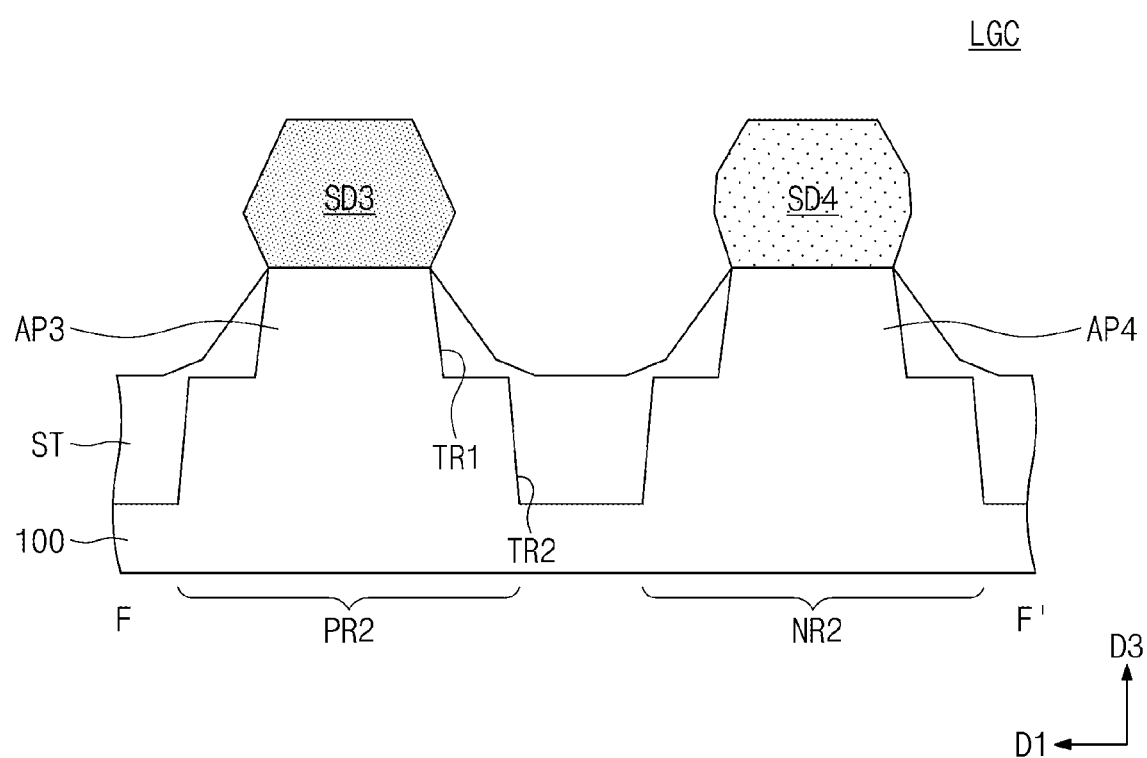
FIGS. 10F, 12F and 14F are cross-sectional views taken along lines F-F' of FIGS. 9, 11 and 13, respectively.
Figure 11:
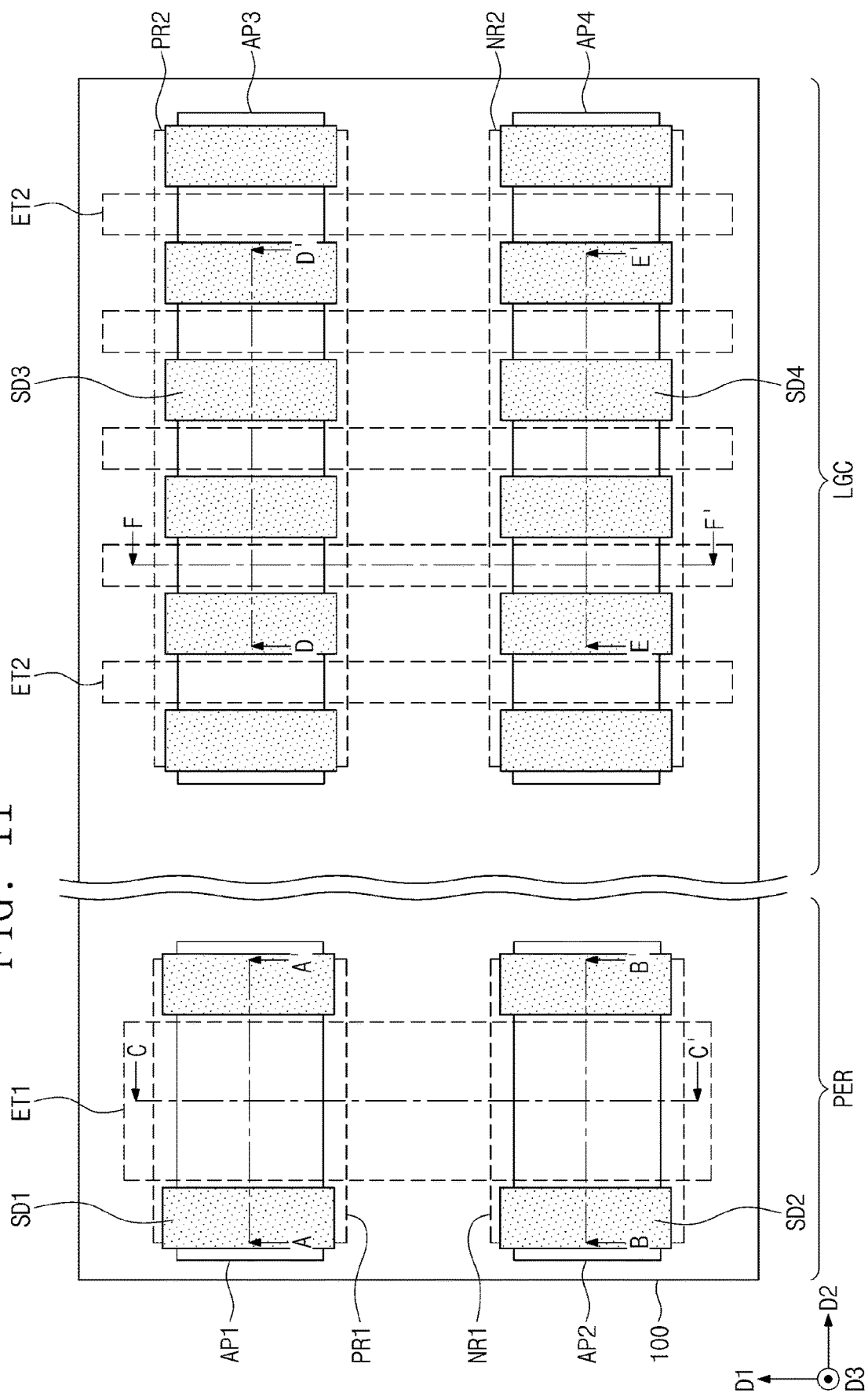
Figure 12A:
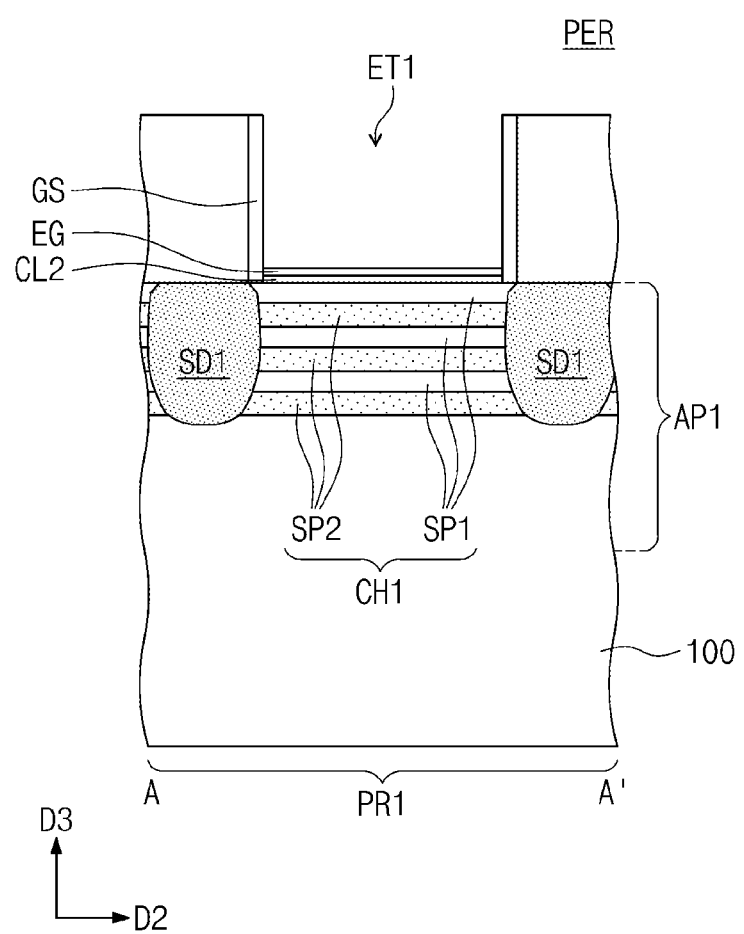
Figure 12B:
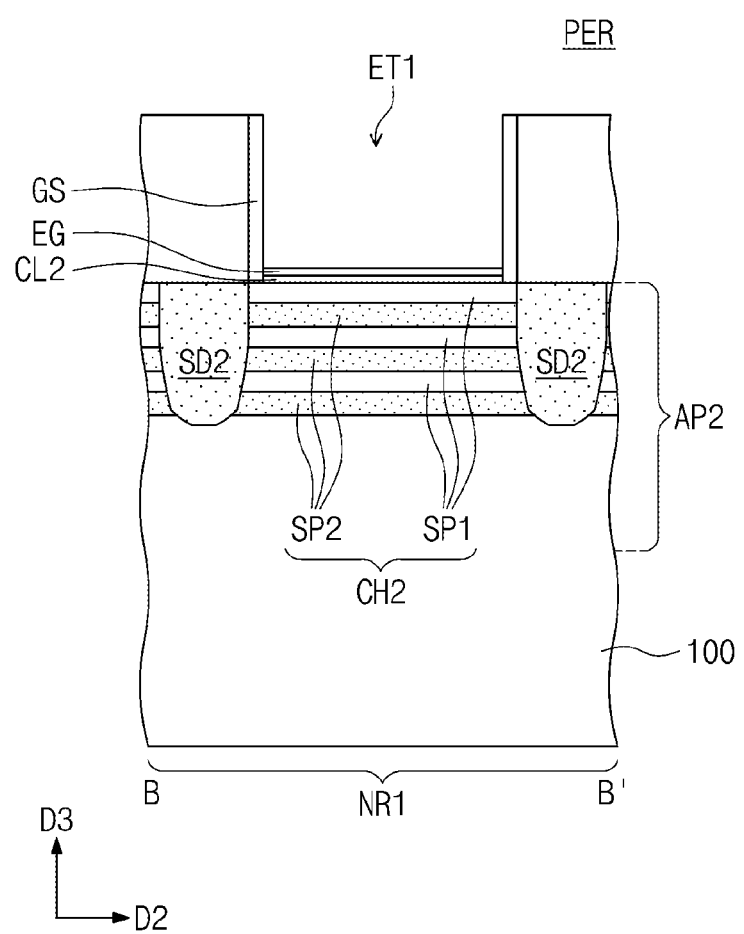
Figure 12C:
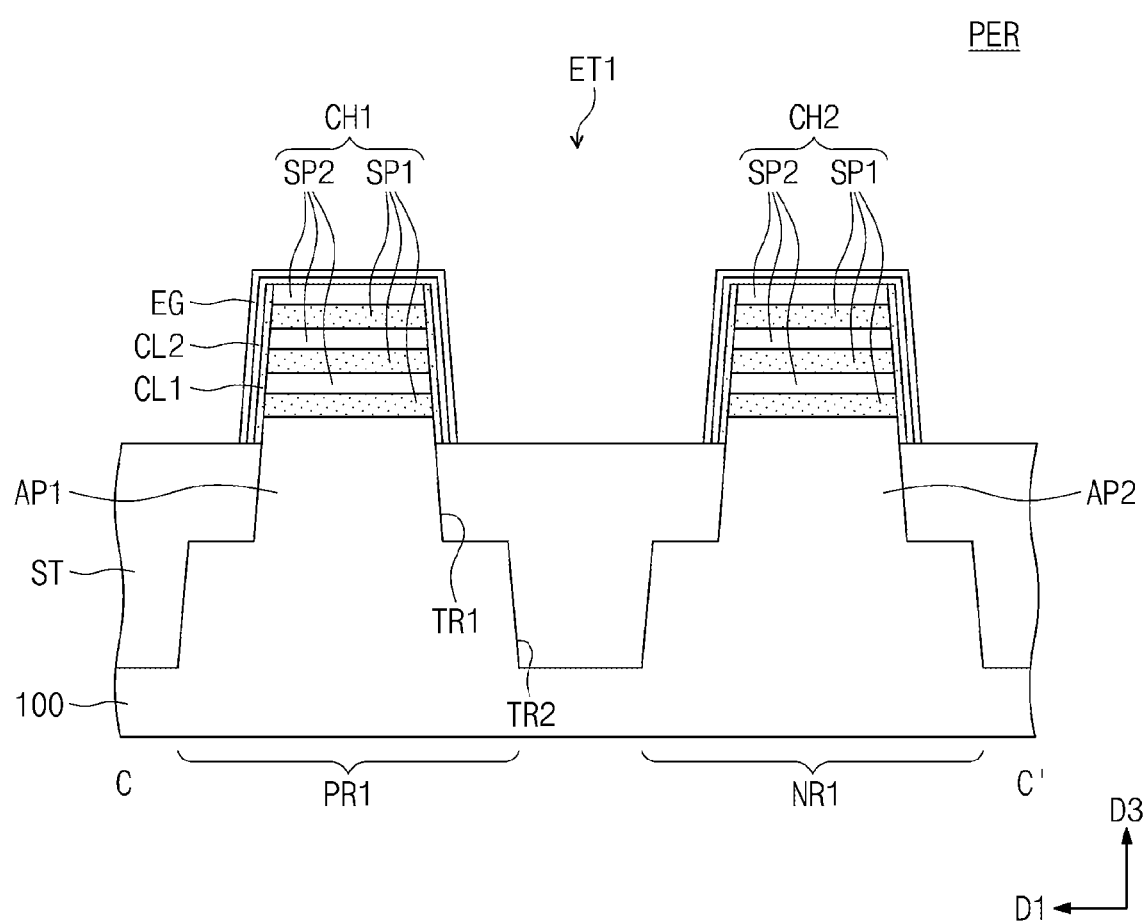
Figure 12D:
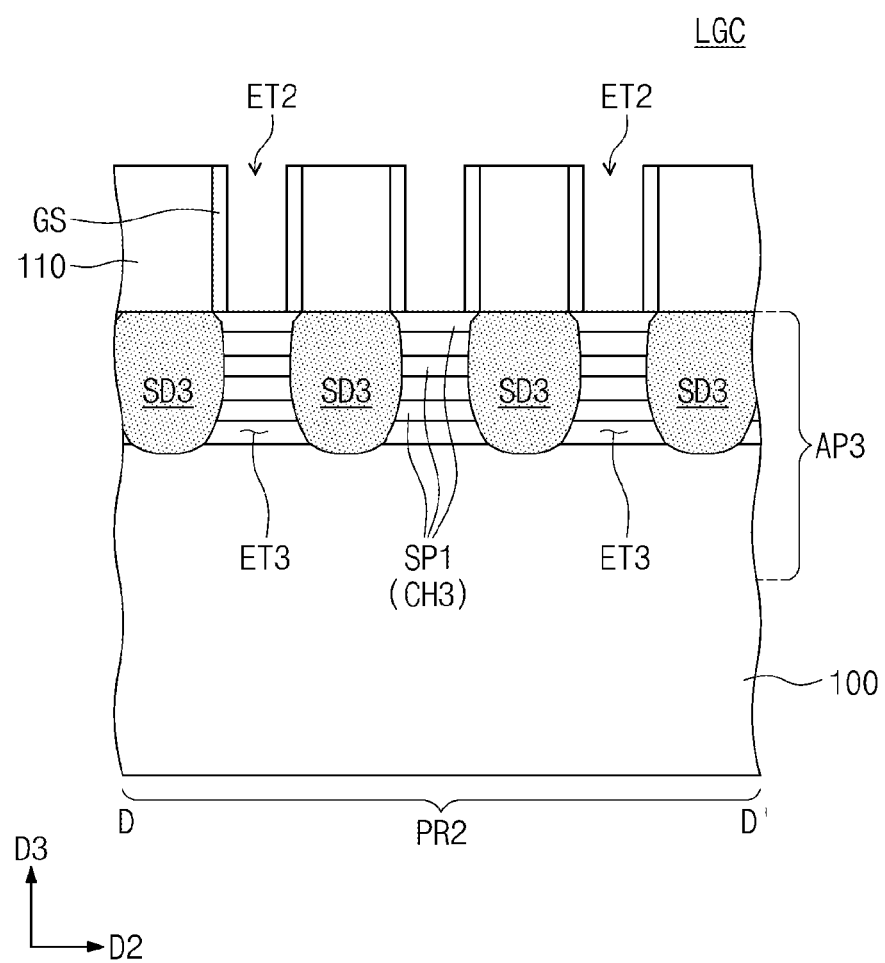
Figure 12E:
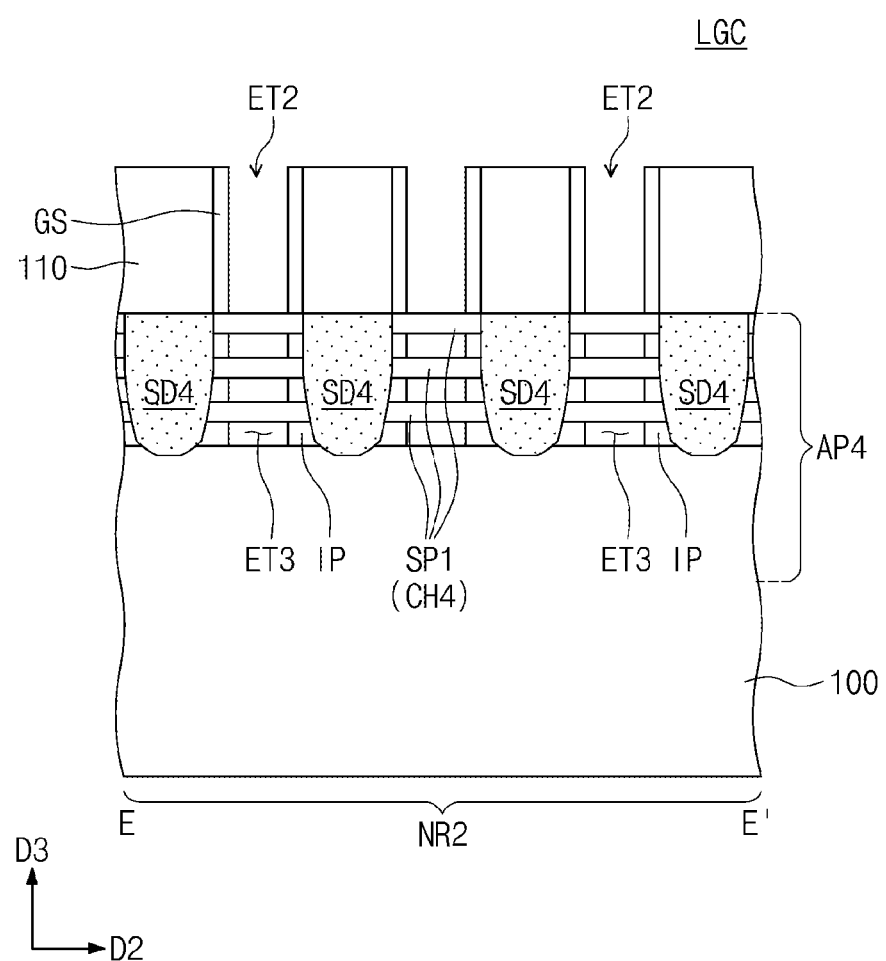
Figure 12F:
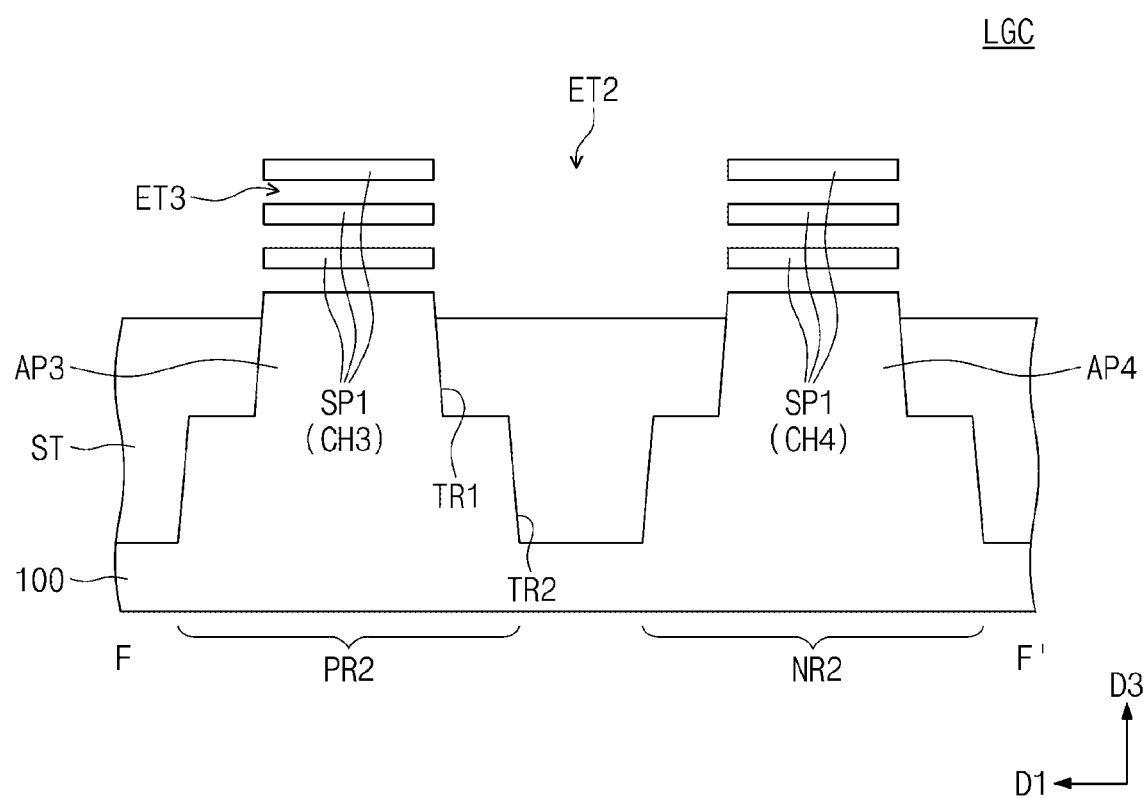
Figure 13:
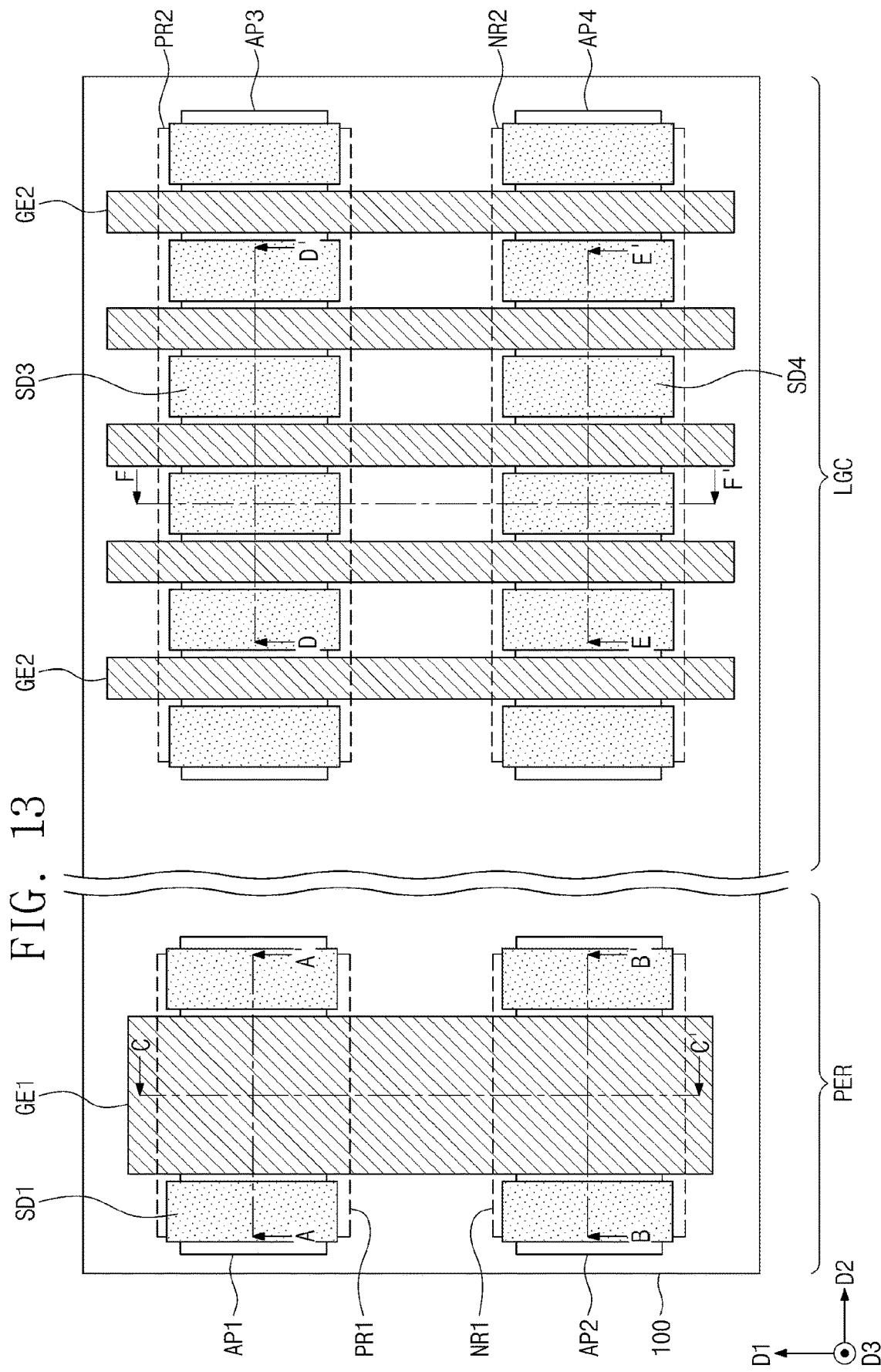
Figure 14A:
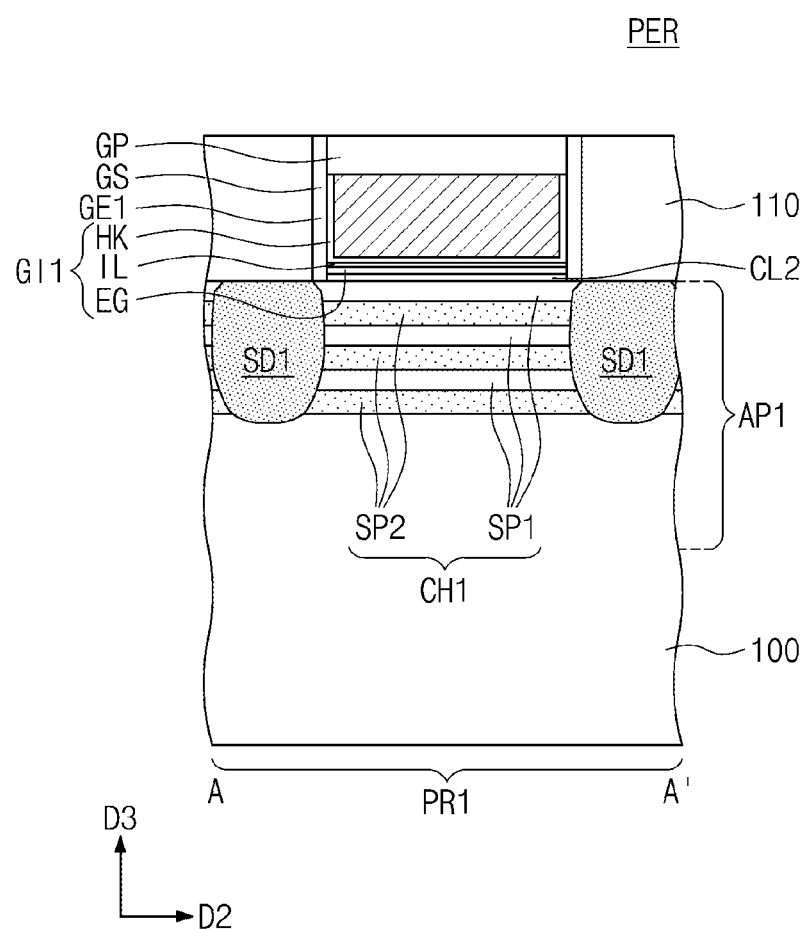
Figure 14B:
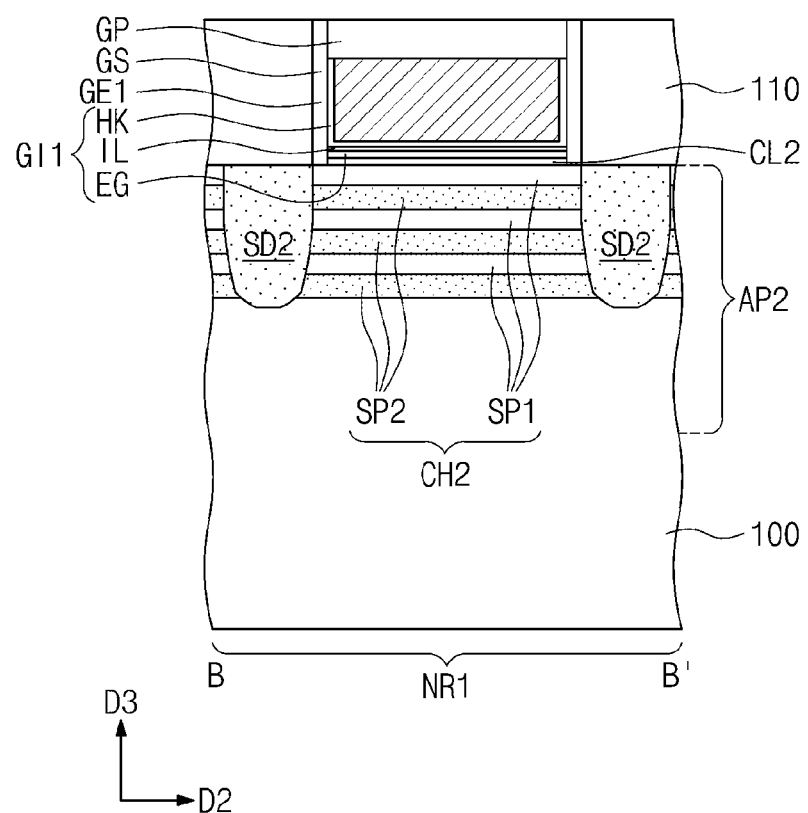
Figure 14C:
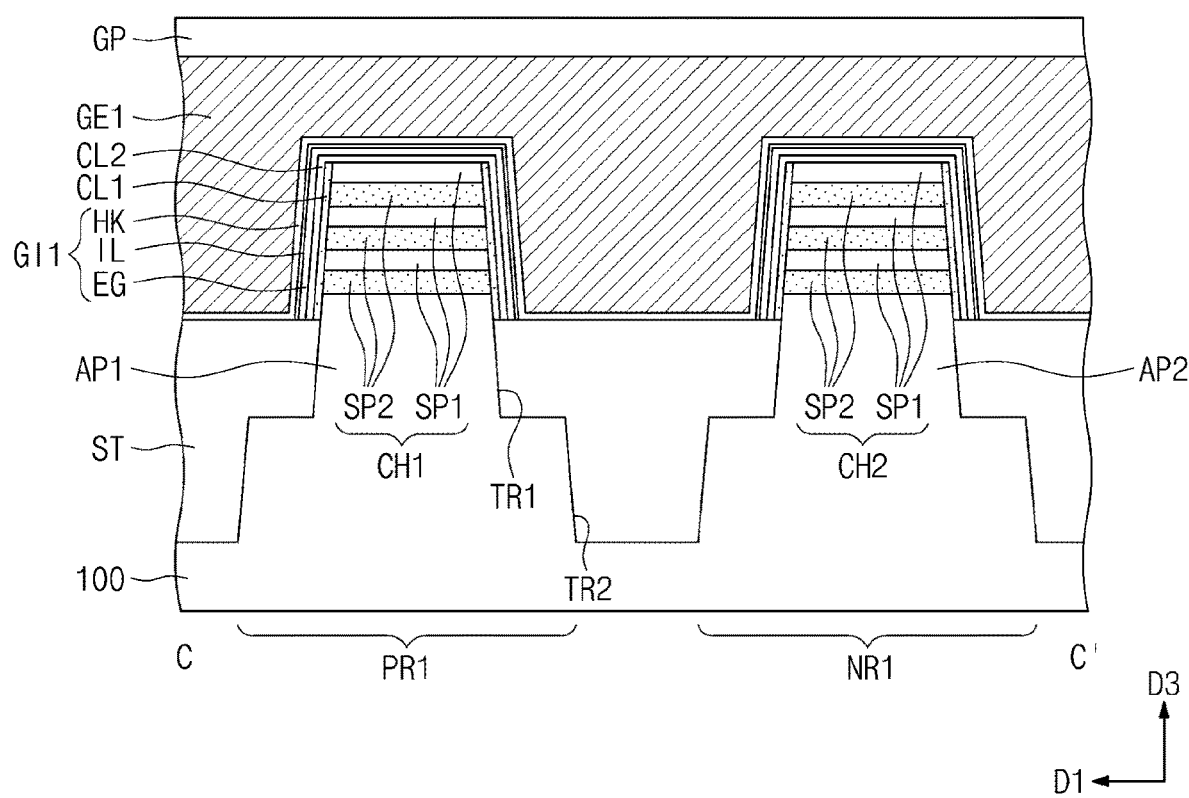
Figure 14D:
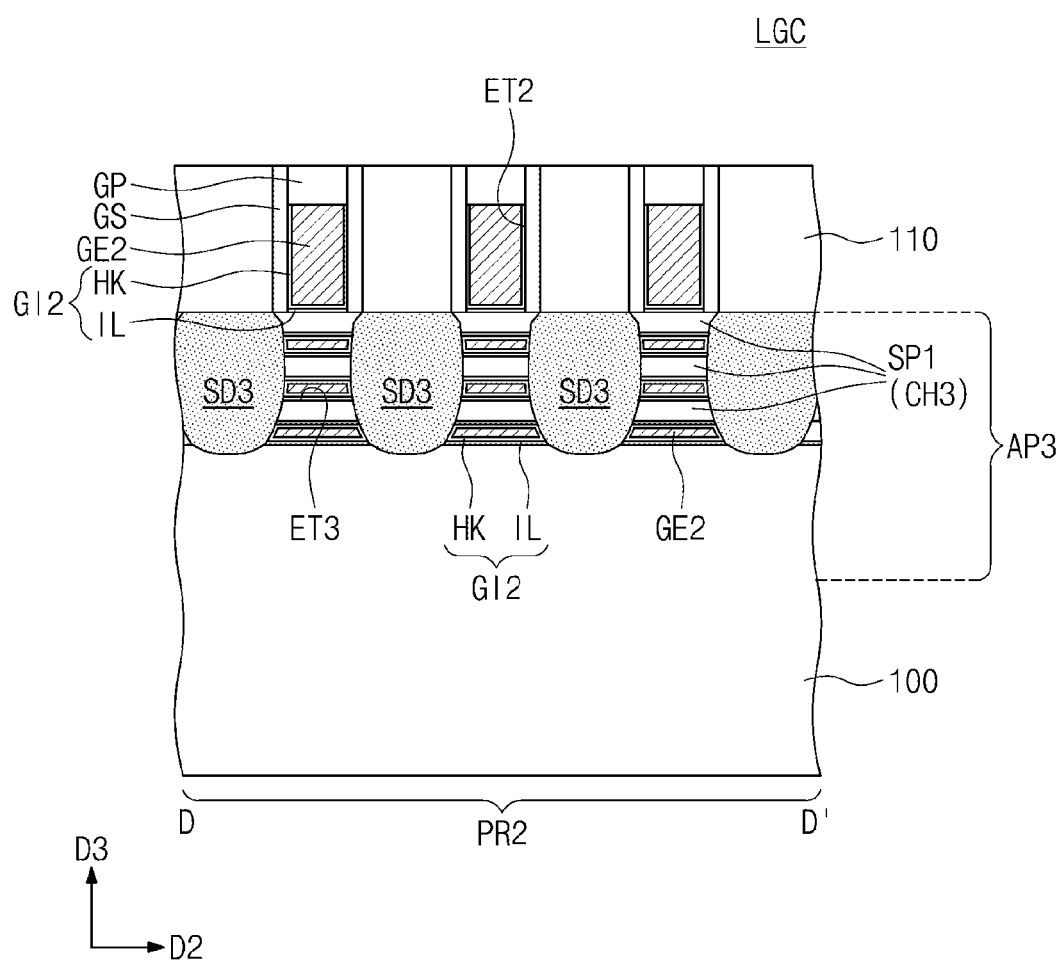
Figure 14E:
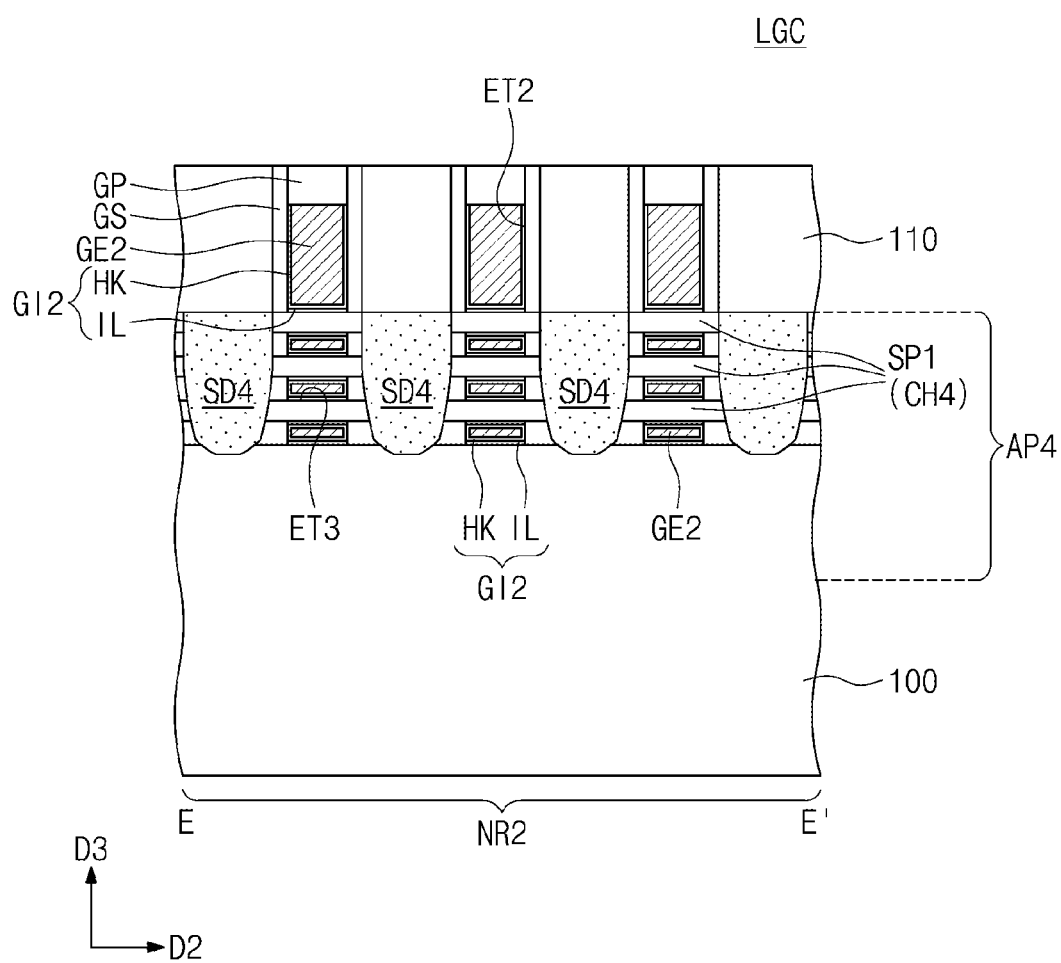
Figure 14F:
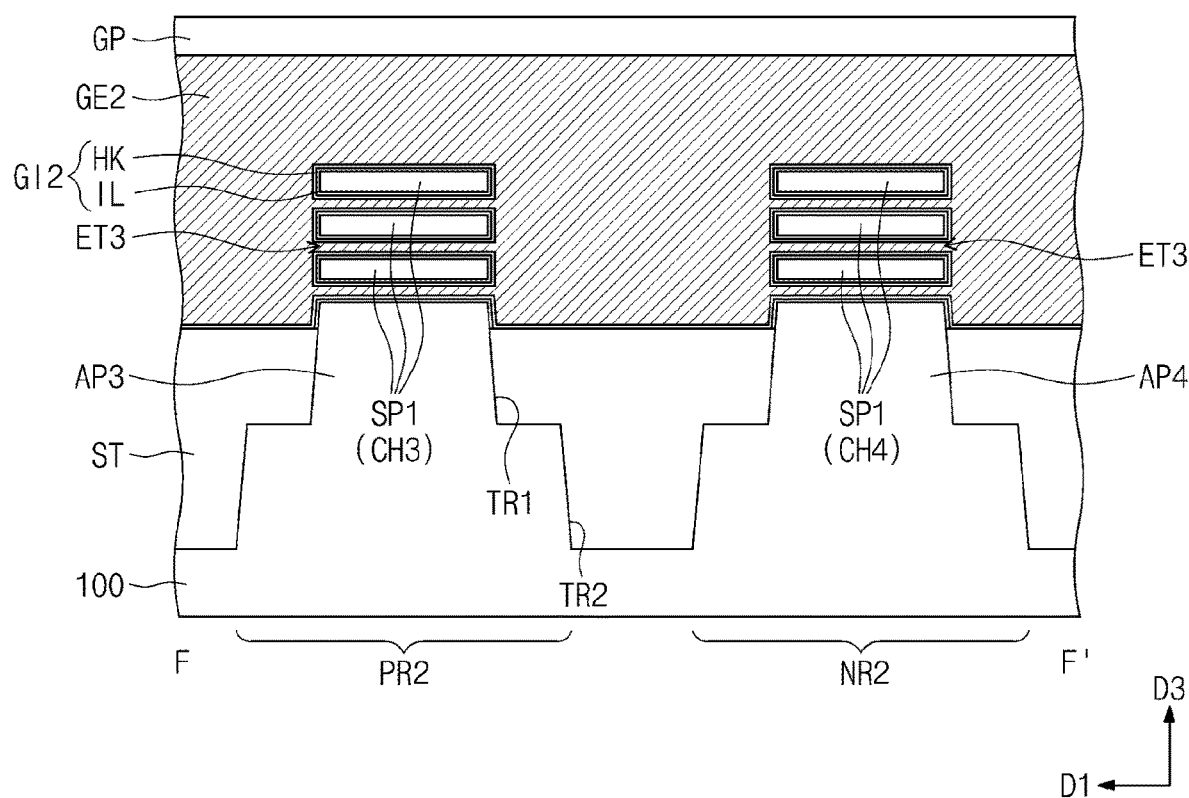

FIGS. 3, 5, 7, 9, 11 and 13 are plan views illustrating a method for manufacturing a semiconductor device according to some embodiments of the inventive concept. FIGS. 4A, 6A, 8A, 10A, 12A and 14A are cross-sectional views taken along lines A-A' of FIGS. 3, 5, 7, 9, 11 and 13, respectively. FIGS. 4B, 6B, 8B, 10B, 12B and 14B are cross-sectional views taken along lines B-B' of FIGS. 3, 5, 7, 9, 11 and 13, respectively. FIGS. 4C, 6C, 8C, 10C, 12C and 14C are cross-sectional views taken along lines C-C' of FIGS. 3, 5, 7, 9, 11 and 13, respectively. FIGS. 4D, 6D, 8D, 10D, 12D and 14D are cross-sectional views taken along lines D-D' of FIGS. 3, 5, 7, 9, 11 and 13, respectively. FIGS. 10E, 12E and 14E are cross-sectional views taken along lines E-E' of FIGS. 9, 11 and 13, respectively. FIGS. 10F, 12F and 14F are cross-sectional views taken along lines F-F' of FIGS. 9, 11 and 13, respectively.

Referring to FIGS. 3 and 4A to 4D, a substrate 100 including a peripheral region PER and a logic cell region LGC may be provided. First semiconductor layers and second semiconductor layers may be alternately formed on the substrate 100. The first semiconductor layers may include one of silicon (Si), germanium (Ge), and silicon-germanium (SiGe), and the second semiconductor layers may include another of silicon (Si), germanium (Ge), and silicon-germanium (SiGe). For example, the first semiconductor layers may include silicon (Si), and the second semiconductor layers may include silicon-germanium (SiGe).

A first patterning process may be performed on the substrate 100 to form a first trench TR1 defining first to fourth active patterns AP1 to AP4. In the first patterning process, the first and second semiconductor layers may be patterned to form first and second semiconductor patterns SP1 and SP2. The first and second semiconductor patterns SP1 and SP2 may be alternately stacked on each of the first to fourth active patterns AP1 to AP4.

A second patterning process may be performed on the substrate 100 to form a second trench TR2 defining a first PMOSFET region PR1, a first NMOSFET region NR1, a second PMOSFET region PR2, and a second NMOSFET region NR2. The second trench TR2 may be deeper than the first trench TR1.

The first PMOSFET region PR1 and the first NMOSFET region NR1 may be disposed in the peripheral region PER. The first active pattern AP1 and the second active pattern AP2 may be formed on the first PMOSFET region PR1 and the first NMOSFET region NR1, respectively. The second PMOSFET region PR2 and the second NMOSFET region NR2 may be disposed in the logic cell region LGC. The third active pattern AP3 and the fourth active pattern AP4 may be formed on the second PMOSFET region PR2 and the second NMOSFET region NR2, respectively.

A device isolation layer ST may be formed on the substrate 100 to at least partially fill the first and second trenches TR1 and TR2. The device isolation layer ST may include an insulating material, such as a silicon oxide layer. The device isolation layer ST may be recessed until upper portions of the first to fourth active patterns AP1 to AP4 are exposed. Thus, the upper portions of the first to fourth active patterns AP1 to AP4 may vertically protrude in the D3 direction above the device isolation layer ST.

Referring to FIGS. 5 and 6A to 6D, a mask layer MA may be formed on the logic cell region LGC. The mask layer MA may be on and at least partially cover the logic cell region LGC but may expose the peripheral region PER.

A first capping layer CL1 may be formed on the first and second active patterns AP1 and AP2 of the peripheral region PER. For example, the first capping layer CL1 may be formed using an annealing process. In other words, the annealing process may be performed on the first and second active patterns AP1 and AP2, and thus the semiconductor material in the second semiconductor patterns SP2 may be diffused into a sidewall of each of the first and second active patterns AP1 and AP2. The first capping layer CL1 may include the same semiconductor material as the second semiconductor patterns SP2. For example, the first capping layer CL1 may include silicon-germanium (SiGe).

A second capping layer CL2 may be formed on the first capping layer CL1. The second capping layer CL2 may be formed to be on and at least partially cover the first capping layer CL1 and a top surface of each of the first and second active patterns AP1 and AP2. For example, the second capping layer CL2 may include silicon (Si). The second capping layer CL2 may be conformally formed. For example, the second capping layer CL2 may be formed to have a thickness of about 1 nm to 2 nm.

A first insulating layer EG may be formed on the second capping layer CL2. The first insulating layer EG may include a silicon oxide layer or a silicon oxynitride layer. For example, the first insulating layer EG may be formed using an oxidation process.

In other embodiments, due to the mask layer MA, the first capping layer CL1, the second capping layer CL2 and the first insulating layer EG may not be formed on the third and fourth active patterns AP3 and AP4 on the logic cell region LGC.

Referring to FIGS. 7 and 8A to 8D, the mask layer MA may be removed. A first sacrificial pattern PP1 intersecting the first and second active patterns AP1 and AP2 may be formed on the peripheral region PER. Second sacrificial patterns PP2 intersecting the third and fourth active patterns AP3 and AP4 may be formed on the logic cell region LGC. The first sacrificial pattern PP1 and the second sacrificial patterns PP2 may have line or bar shapes extending in the first direction D1. A width of the first sacrificial pattern PP1 may be greater than a width of the second sacrificial pattern PP2.

For example, the formation of the first and second sacrificial patterns PP1 and PP2 may include forming a sacrificial layer on an entire top surface of the substrate 100, forming hard mask patterns MP on the sacrificial layer, and patterning the sacrificial layer using the hard mask patterns MP as etch masks. The sacrificial layer may include poly-silicon.

In some embodiments, the patterning process for forming the first and second sacrificial patterns PP1 and PP2 may include a lithography process using extreme ultraviolet (EUV) light. As used herein, the EUV light may mean ultraviolet light having a wavelength of about 4 nm to 124 nm (particularly, a wavelength of about 4 nm to 20 nm, more particularly, a wavelength of about 13.5 nm). The EUV light may mean light having an energy of about 6.21 eV to 124 eV (in particular, an energy of about 90 eV to 95 eV).

The lithography process using the EUV light may include an exposure process using the EUV light irradiated onto a photoresist layer, and a development process performed on the photoresist layer. For example, the photoresist layer may include an organic photoresist containing an organic polymer, such as polyhydroxystyrene. The organic photoresist may further include a photosensitive compound capable of reacting to the EUV light. The organic photoresist may additionally include a material having a high absorption rate for the EUV light, for example, an organometallic material, an iodine-containing material, or a fluorine-containing material. For other examples, the photoresist layer may include an inorganic photoresist containing an inorganic material, such as tin oxide.

The photoresist layer may be formed with a relatively thin thickness. The photoresist layer exposed to the EUV light may be developed to form photoresist patterns. The photoresist patterns may have, but are not limited to, line shapes extending in one direction, island shapes, a zigzag form, a honeycomb form, or circular shapes when viewed in a plan view.

One or more mask layers stacked under the photoresist patterns may be patterned using the photoresist patterns as etch masks to form the hard mask patterns MP described above. The sacrificial layer corresponding to a target layer may be patterned using the hard mask patterns MP as etch masks to form desired patterns (i.e., the first and second sacrificial patterns PP1 and PP2) on a wafer.

In a comparative example, a multi patterning technique (MPT) using two or more photomasks may be required to form patterns having a fine pitch on a wafer. By contrast, when the EUV lithography process according to the embodiments of the inventive concepts is performed, the first and second sacrificial patterns PP1 and PP2 having a fine pitch may be formed using a single photomask.

For example, a minimum pitch between the first and second sacrificial patterns PP1 and PP2 formed using the EUV lithography process of the present embodiments may be about 45 nm or less. In other words, because the EUV lithography process is performed, the first and second sacrificial patterns PP1 and PP2, which may be precise and fine, may be formed without the multi patterning technique.

According to some embodiments of the inventive concept, the aforementioned lithography process using the EUV light may be used in the patterning process for forming the first to fourth active patterns AP1 to AP4 described above, as well as the patterning process for forming the sacrificial patterns PP1 and PP2. However, embodiments of the inventive concepts are not limited thereto.

Referring again to FIG. 8A, portions of the second capping layer CL2 and the first insulating layer EG on the peripheral region PER, which are at least partially covered by the first sacrificial pattern PP1, may remain, but the other portions thereof, which are not covered by the first sacrificial pattern PP1 may be removed.

A pair of gate spacers GS may be formed on both sidewalls of each of the first and second sacrificial patterns PP1 and PP2, respectively. The formation of the gate spacers GS may include conformally forming a gate spacer layer on an entire top surface of the substrate 100 and anisotropically etching the gate spacer layer. For example, the gate spacer layer may include at least one of SiCN, SiCON, or SiN. In certain embodiments, the gate spacer layer may be formed of a multi-layer including at least two of SiCN, SiCON, or SiN.

Referring to FIGS. 9 and 10A to 10F, first to fourth source/drain patterns SD1 to SD4 may be formed in upper portions of the first to fourth active patterns AP1 to AP4, respectively.

For example, the first source/drain patterns SD1 may be formed in the upper portion of the first active pattern AP1. A pair of the first source/drain patterns SD1 may be formed at both sides of the first sacrificial pattern PP1, respectively. For example, the upper portion of the first active pattern AP1 may be etched using the hard mask pattern MP and the gate spacers GS as etch masks to form first recess regions RS1. The device isolation layer ST between the first and second active patterns AP1 and AP2 may be recessed while the upper portions of the first active patterns AP1 are etched (see FIG. 10C).

The first source/drain patterns SD1 may be formed by performing a selective epitaxial growth (SEG) process using inner surfaces of the first recess regions RS1 of the first active pattern AP1 as a seed layer. Because the first source/drain patterns SD1 are formed, a first channel pattern CH1 may be defined between the pair of first source/drain patterns SD1. For example, the SEG process may include a chemical vapor deposition (CVD) process or a molecular beam epitaxy (MBE) process. The first source/drain patterns SD1 may include a semiconductor element (e.g., SiGe) of which a lattice constant is greater than that of a semiconductor element of the substrate 100. In some embodiments, each of the first source/drain patterns SD1 may be formed of a plurality of stacked semiconductor layers.

In some embodiments, dopants may be injected in-situ into the first source/drain patterns SD1 during the SEG process for forming the first source/drain patterns SD1. In certain embodiments, the dopants may be injected or implanted into the first source/drain patterns SD1 after the SEG process for forming the first source/drain patterns SD1. The first source/drain patterns SD1 may be doped with the dopants to have a first conductivity type (e.g., a P-type).

The second source/drain patterns SD2 may be formed in the upper portion of the second active pattern AP2. A pair of the second source/drain patterns SD2 may be formed at both sides of the first sacrificial pattern PP1, respectively. Because the second source/drain patterns SD2 are formed, a second channel pattern CH2 may be defined between the pair of second source/drain patterns SD2.

For example, the upper portion of the second active pattern AP2 may be etched using the hard mask pattern MP and the gate spacers GS as etch masks to form second recess regions RS2. The second source/drain patterns SD2 may be formed by performing a SEG process using inner surfaces of the second recess regions RS2 of the second active pattern AP2 as a seed layer. For example, the second source/drain patterns SD2 may include the same semiconductor element (e.g., silicon) as the substrate 100. The second source/drain patterns SD2 may be doped with dopants to have a second conductivity type (e.g., an N-type).

A method of forming the third source/drain patterns SD3 in the upper portion of the third active pattern AP3 may be substantially the same as the aforementioned method of forming the first source/drain patterns SD1. The first source/drain patterns SD1 and the third source/drain patterns SD3 may be formed at the same time.

A method of forming the fourth source/drain patterns SD4 in the upper portion of the fourth active pattern AP4 may be substantially the same as the aforementioned method of forming the second source/drain patterns SD2. The second source/drain patterns SD2 and the fourth source/drain patterns SD4 may be formed at the same time.

Referring to FIGS. 11 and 12A to 12F, a first interlayer insulating layer 110 may be formed to be on and at least partially cover the first to fourth source/drain patterns SD1 to SD4, the hard mask patterns MP, and the gate spacers GS. For example, the first interlayer insulating layer 110 may include a silicon oxide layer.

The first interlayer insulating layer 110 may be planarized until top surfaces of the first and second sacrificial patterns PP1 and PP2 are exposed. The planarization process of the first interlayer insulating layer 110 may be performed using an etch-back process or a chemical mechanical polishing (CMP) process. The hard mask patterns MP may be completely removed during the planarization process. As a result, a top surface of the first interlayer insulating layer 110 may be substantially coplanar with the top surfaces of the first and second sacrificial patterns PP1 and PP2 and top surfaces of the gate spacers GS.

The first and second sacrificial patterns PP1 and PP2 may be selectively removed. A first empty space ET1 exposing the first insulating layer EG may be formed by the removal of the first sacrificial pattern PP1 (see FIG. 12C). Second empty spaces ET2 exposing the third and fourth active patterns AP3 and AP4 may be formed by the removal of the second sacrificial patterns PP2 (see FIG. 12F).

The second semiconductor patterns SP2 on the logic cell region LGC may be selectively removed. In detail, referring again to FIG. 12F, the second semiconductor patterns SP2 may be exposed by the second empty space ET2. The second semiconductor patterns SP2 may be removed by performing an etching process for selectively removing the second semiconductor patterns SP2. The first semiconductor patterns SP1 may not be removed but may remain. Third empty spaces ET3 may be formed by the removal of the second semiconductor patterns SP2. Each of the third empty spaces ET3 may be defined between the first semiconductor patterns SP1 vertically adjacent to each other. A third channel pattern CH3 may be defined between a pair of the third source/drain patterns SD3. A fourth channel pattern CH4 may be defined between a pair of the fourth source/drain patterns SD4.

Referring again to FIG. 12E, an insulating pattern IP may be formed in the third empty space ET3 on the second NMOSFET region NR2. The insulating pattern IP may at least partially fill the third empty space ET3. The insulating pattern IP may be in physical contact with the fourth source/drain pattern SD4.

Referring to FIGS. 13 and 14A to 14F, first and second gate insulating layers GI1 and GI2 may be formed in the first and second empty spaces ET1 and ET2, respectively. In detail, a second insulating layer IL may be formed in the first and second empty spaces ET1 and ET2. The second insulating layer IL formed on the peripheral region PER may be on and at least partially cover the first insulating layer EG. The second insulating layer IL formed on the logic cell region LGC may border or surround each of the first semiconductor patterns SP1. The second insulating layer IL formed on the logic cell region LGC may also be formed in the third empty space ET3.

Thereafter, a high-k dielectric layer HK may be conformally formed on the peripheral region PER and the logic cell region LGC. The high-k dielectric layer HK may be on and at least partially cover the second insulating layer IL. The high-k dielectric layer HK on the logic cell region LGC may also be formed in the third empty space ET3.

The first insulating layer EG, the second insulating layer IL and the high-k dielectric layer HK on the peripheral region PER may constitute the first gate insulating layer GI1. The second insulating layer IL and the high-k dielectric layer HK on the logic cell region LGC may constitute the second gate insulating layer GI2. The second gate insulating layer GI2 may border or surround each of the first semiconductor patterns SP1. A thickness of the first gate insulating layer GI1 may be greater than a thickness of the second gate insulating layer GI2.

First and second gate electrodes GE1 and GE2 may be formed in the first and second empty spaces ET1 and ET2, respectively. A gate capping pattern GP may be formed on each of the first and second gate electrodes GE1 and GE2. The second gate electrode GE2 on the logic cell region LGC may be in and may completely fill the third empty space ET3.

Referring again to FIGS. 1 and 2A to 2H, a second interlayer insulating layer 120 may be formed on the first interlayer insulating layer 110. The second interlayer insulating layer 120 may include a silicon oxide layer. Active contacts AC may be formed in the second and first interlayer insulating layers 120 and 110. The active contacts AC may penetrate the second and first interlayer insulating layers 120 and 110 and may be electrically connected to the first to fourth source/drain patterns SD1, SD2, SD3 and SD4. Gate contacts GC may be formed. The gate contacts GC may penetrate the second interlayer insulating layer 120 and the gate capping patterns GP and may be electrically connected to the first and second gate electrodes GE1 and GE2.

A third interlayer insulating layer 130 may be formed on the second interlayer insulating layer 120. A first metal layer M1 may be formed in the third interlayer insulating layer 130. The formation of the first metal layer M1 may include forming first interconnection lines IL1 and first vias VI1. A fourth interlayer insulating layer 140 may be formed on the first metal layer M1. A second metal layer M2 may be formed in the fourth interlayer insulating layer 140. The formation of the second metal layer M2 may include forming second interconnection lines IL2 and second vias VI2.

In some embodiments, the formation of the interconnection lines IL1 and/or IL2 in the first metal layer M1 and/or the second metal layer M2 may include a lithography process using EUV light. The EUV lithography process used in the process of forming the interconnection lines (i.e., a BEOL process) may be substantially the same as described above in the process of forming the first and second sacrificial patterns PP1 and PP2. For example, a minimum pitch between the first interconnection lines IL1 realized by the EUV lithography process of the present embodiments may be about 45 nm or less.

Figure 15A:
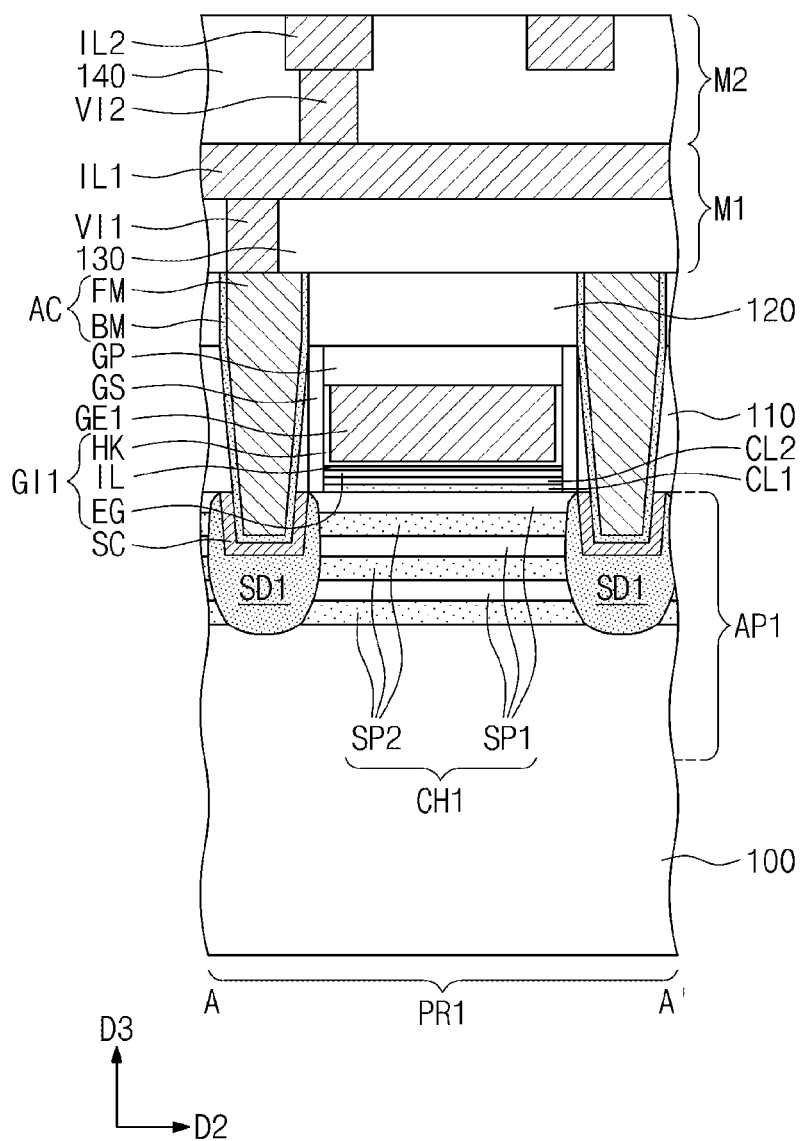
FIGS. 15A, 15B and 15C are cross-sectional views taken along the lines A-A', B-B' and C-C' of FIG. 1, respectively, to illustrate a semiconductor device according to some embodiments of the inventive concept.
Figure 15B:
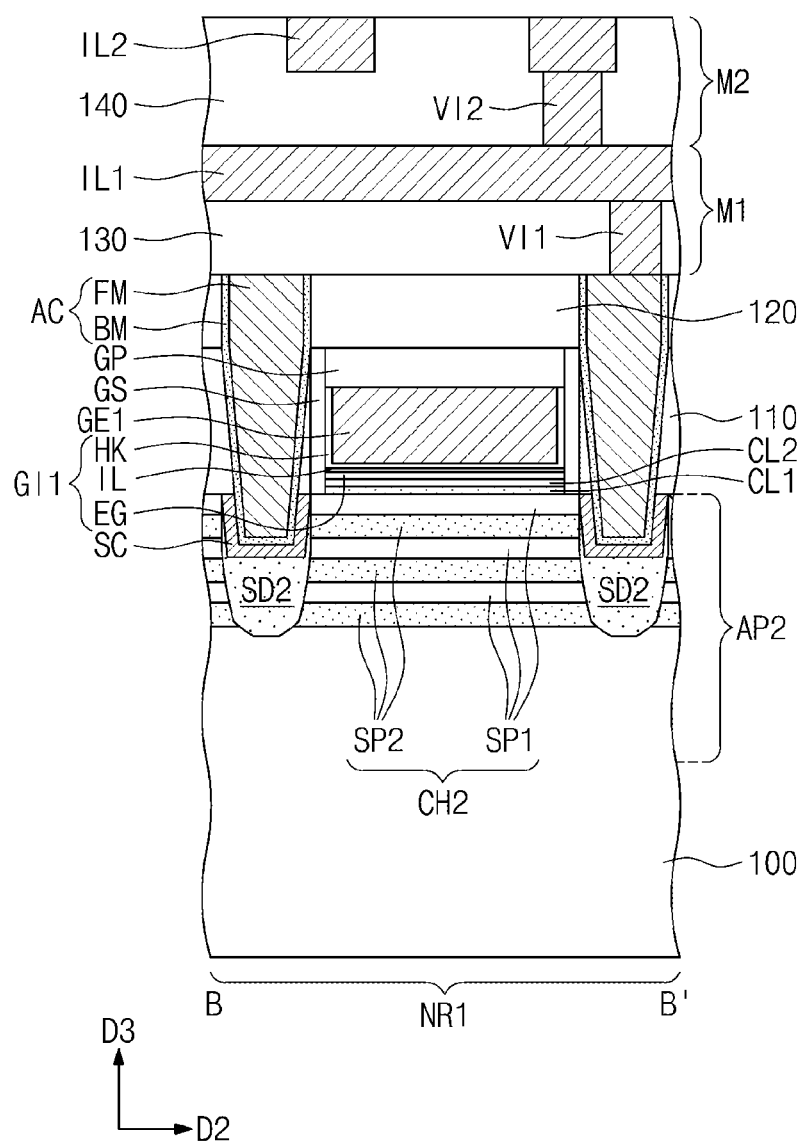
Figure 15C:
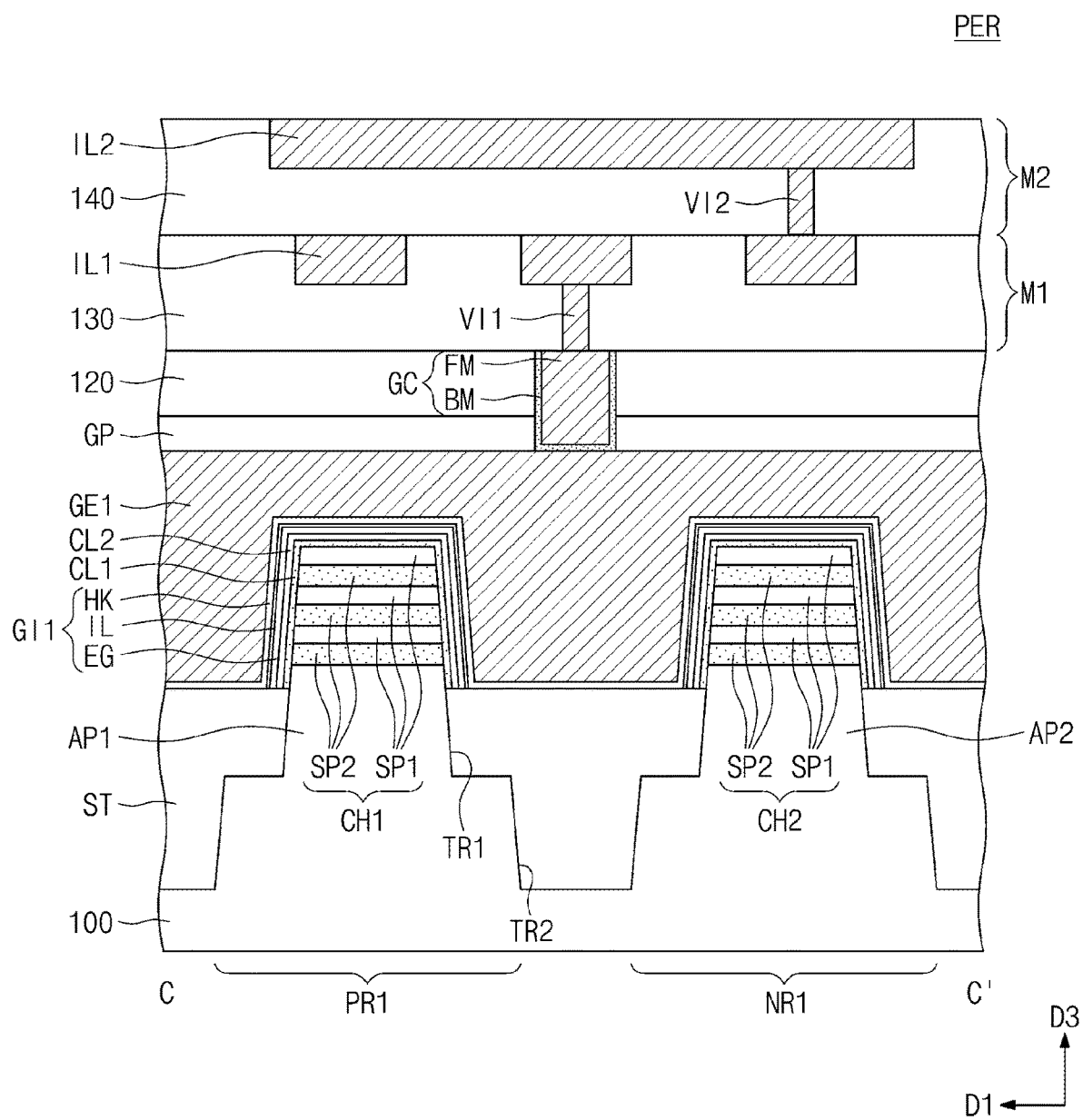

FIGS. 15A, 15B and 15C are cross-sectional views taken along the lines A-A', B-B' and C-C' of FIG. 1, respectively, to illustrate a semiconductor device according to some embodiments of the inventive concept. In the present embodiments, the descriptions of the same technical features as in the embodiments of FIGS. 1 and 2A to 2H will be omitted for the purpose of ease and convenience in explanation. In other words, differences between the present embodiments and the embodiments of FIGS. 1 and 2A to 2H will be primarily described hereinafter.

Referring to FIGS. 1 and 15A to 15C, a first capping layer CL1 may be provided on the first and second active patterns AP1 and AP2. The first capping layer CL1 may be provided on the sidewall of the first active pattern AP1. The first capping layer CL1 may further extend onto the top surface of the first active pattern AP1. The first capping layer CL1 may be provided on the sidewall of the second active pattern AP2. The first capping layer CL1 may further extend onto the top surface of the second active pattern AP2.

The first capping layer CL1 may include the same semiconductor material as the second semiconductor patterns SP2. For example, the first capping layer CL1 and the second semiconductor patterns SP2 may include silicon-germanium (SiGe). Unlike FIG. 15C, the first capping layer CL1 and the second semiconductor patterns SP2 may be formed in one body or monolithic structure without an interface therebetween. For example, a thickness of the first capping layer CL1 may range from about 1 nm to 5 nm.

A second capping layer CL2 may be provided on the first capping layer CL1. The second capping layer CL2 may be disposed between the first capping layer CL1 and the first gate insulating layer GI1. The second capping layer CL2 may be spaced apart from the first and second active patterns AP1 and AP2 by the first capping layer CL1. For example, the second capping layer CL2 may include silicon (Si). The second capping layer CL2 may be conformally provided. For example, a thickness of the second capping layer CL2 may range from about 1 nm to 2 nm. A concentration of germanium (Ge) of the first capping layer CL1 may be greater than a concentration of germanium (Ge) of the second capping layer CL2.

Figure 5:
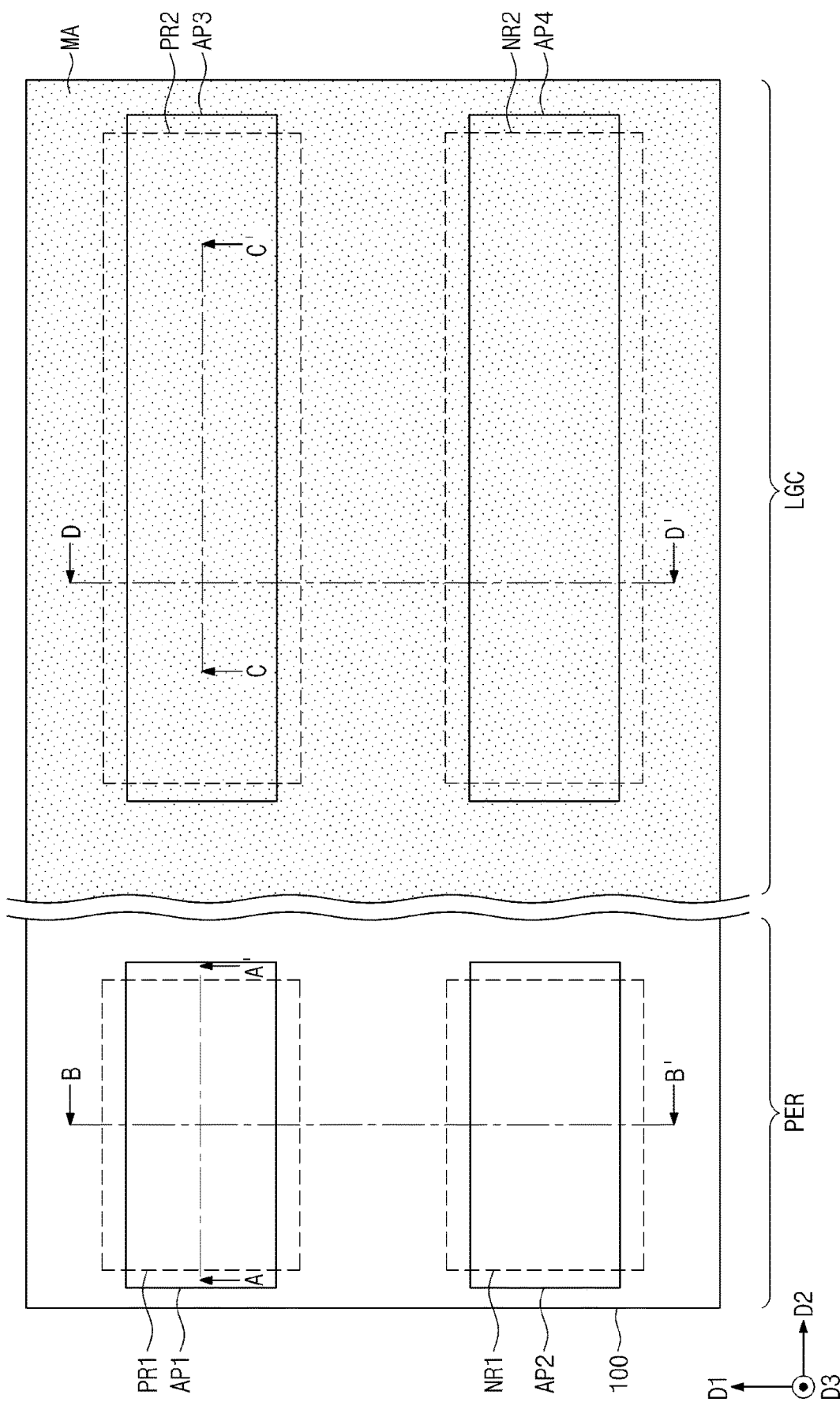
Figure 6A:
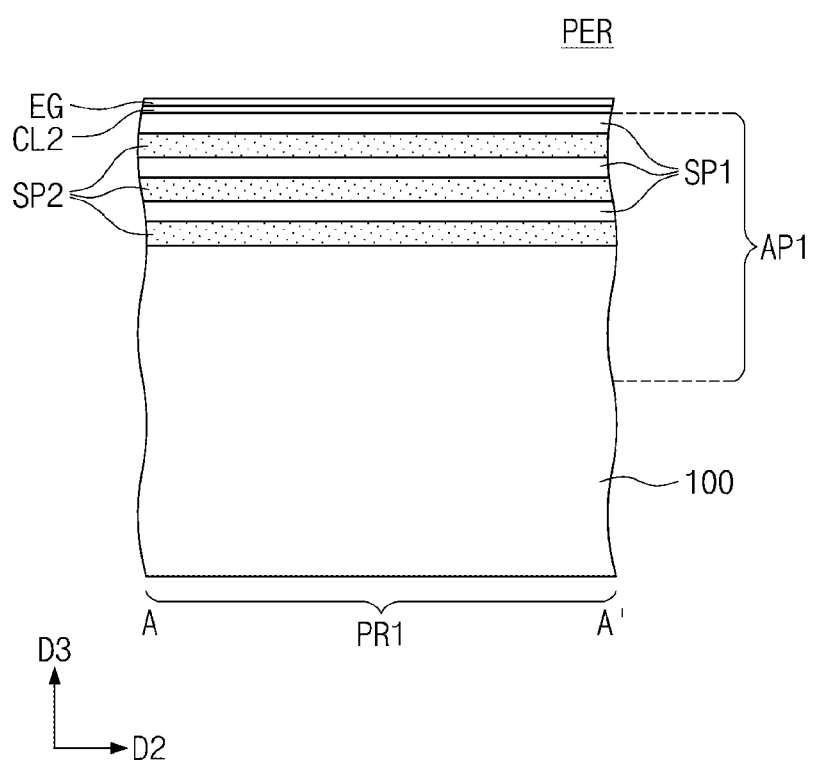
Figure 6B:
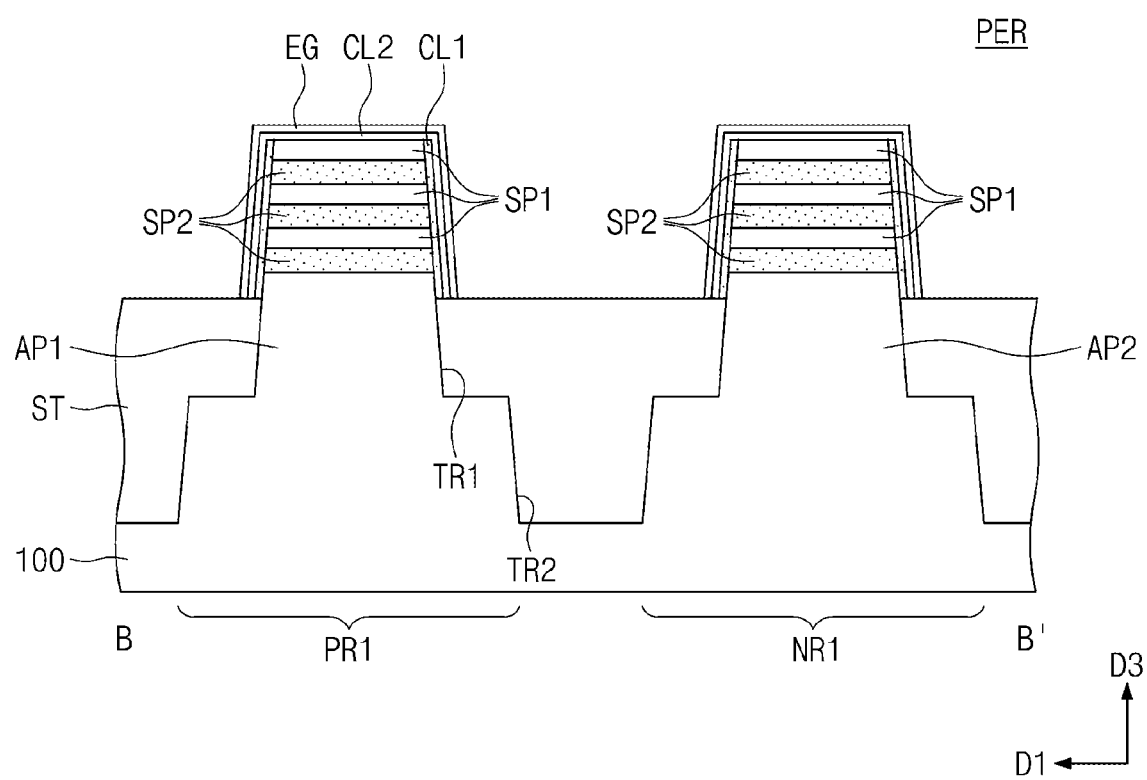
Figure 6C:
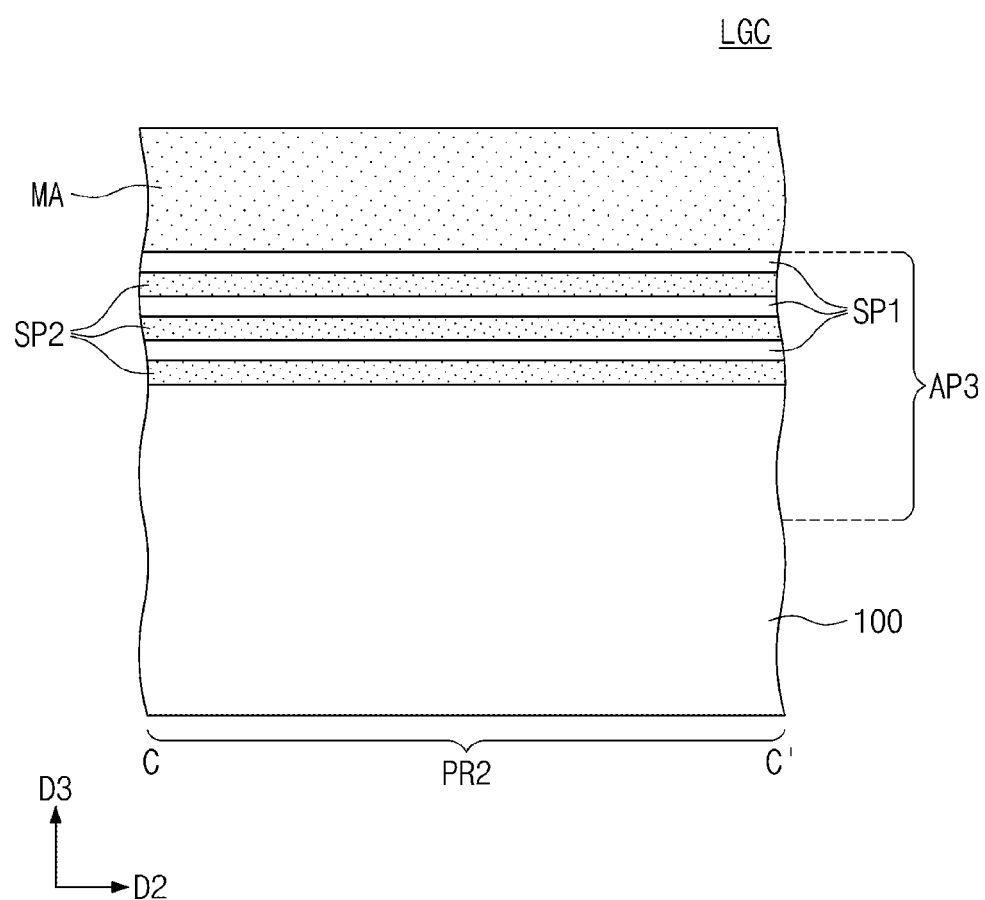
Figure 6D:
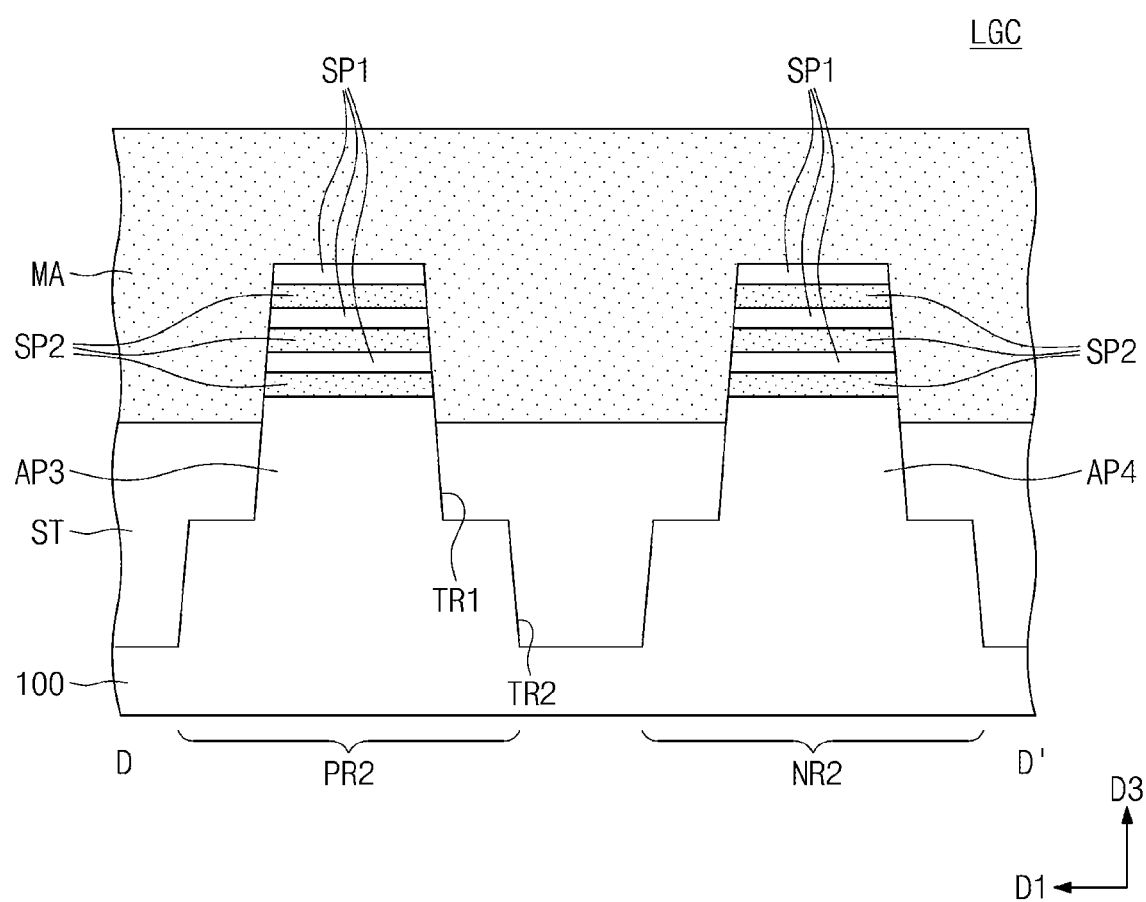
Figure 16A:
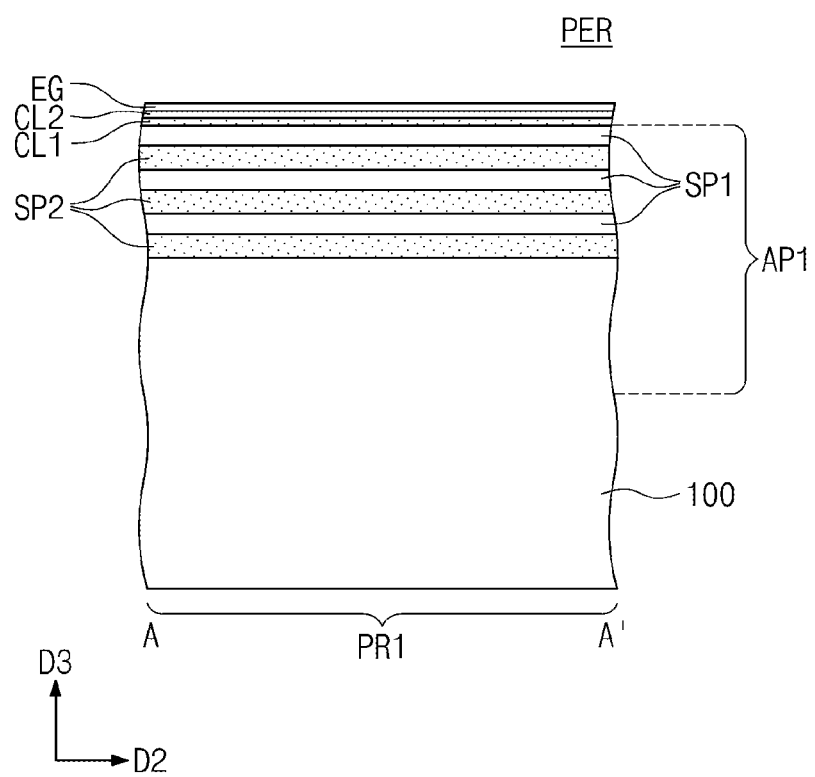
FIGS. 16A and 16B are cross-sectional views taken along the lines A-A' and B-B' of FIG. 5, respectively, to illustrate a method for manufacturing a semiconductor device according to some embodiments of the inventive concept.
Figure 16B:
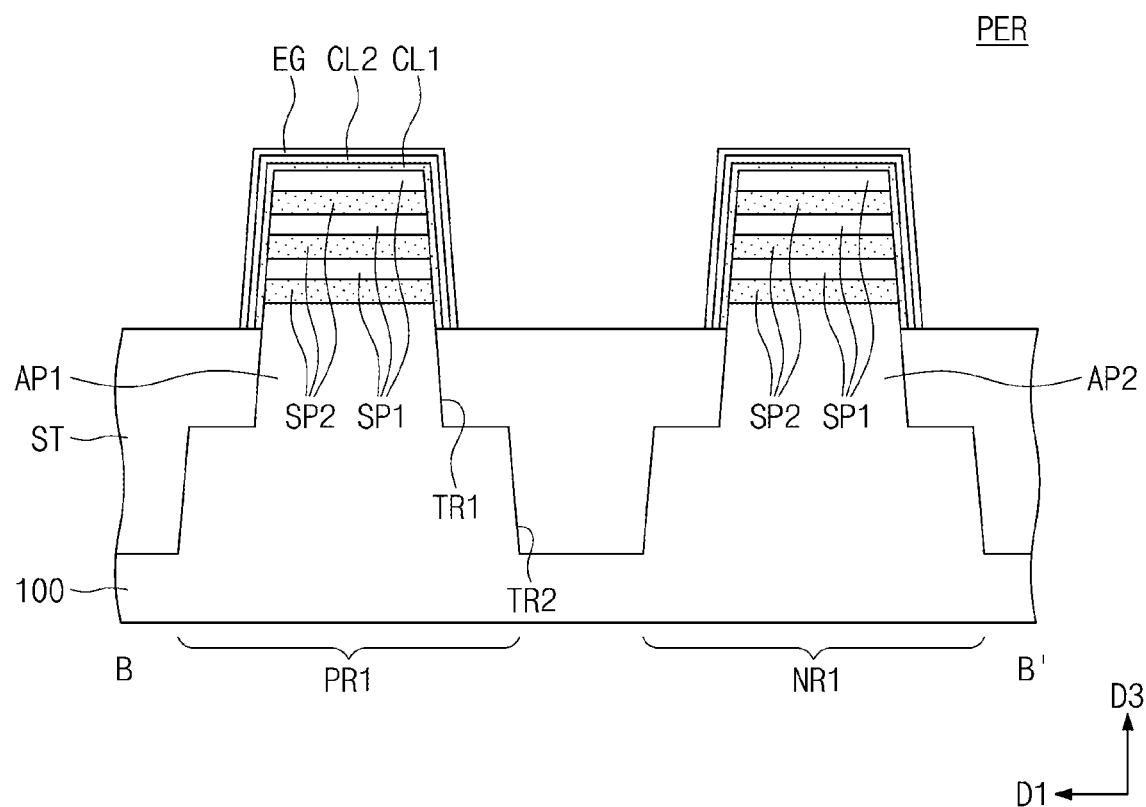
Figure 17A:
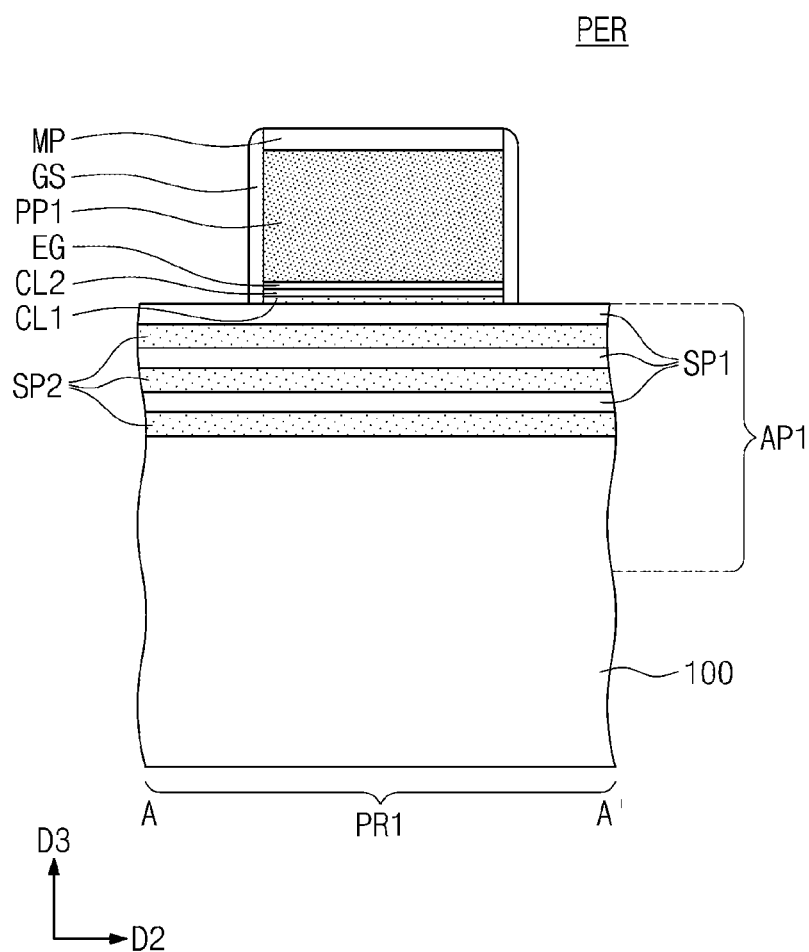
FIGS. 17A and 17B are cross-sectional views taken along the lines A-A' and B-B' of FIG. 7, respectively, to illustrate a method for manufacturing a semiconductor device according to some embodiments of the inventive concept.
Figure 17B:
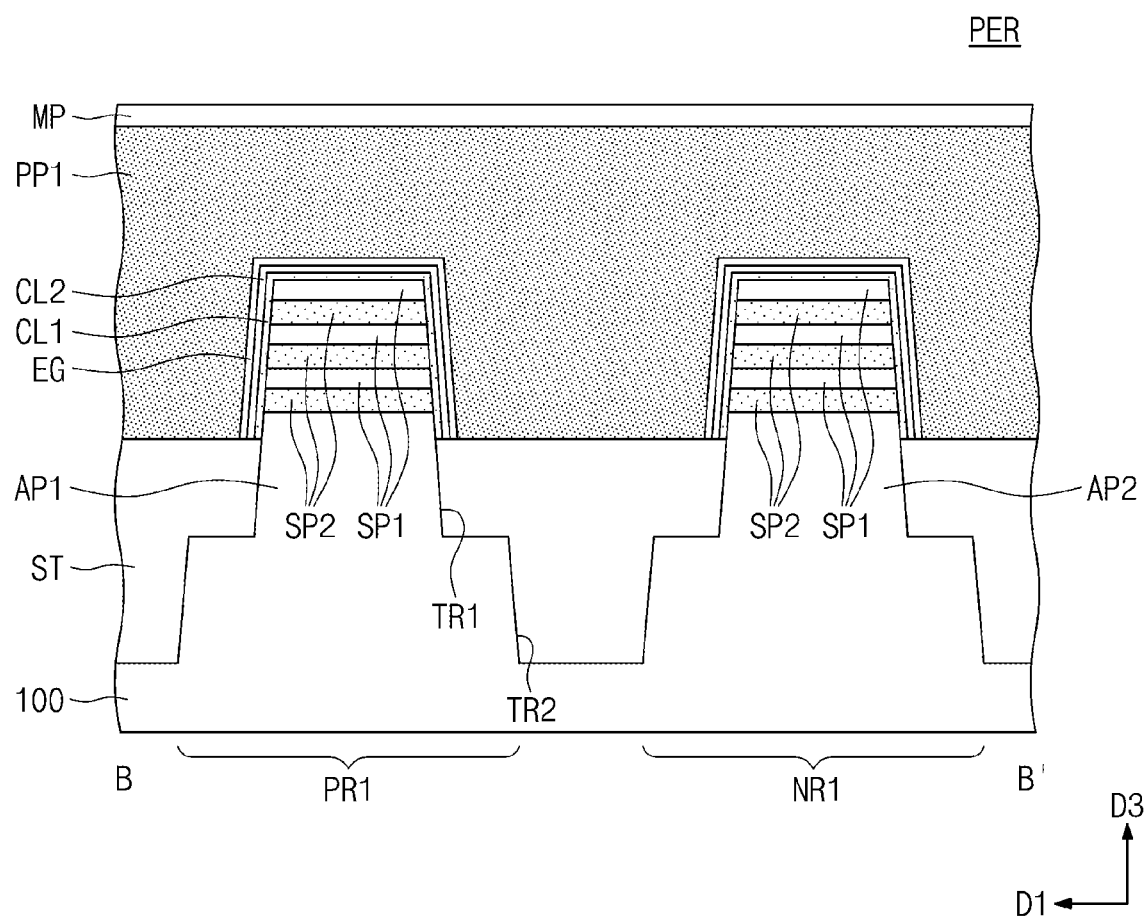

FIGS. 16A and 16B are cross-sectional views taken along the lines A-A' and B-B' of FIG. 5, respectively, to illustrate a method for manufacturing a semiconductor device according to some embodiments of the inventive concept. FIGS. 17A and 17B are cross-sectional views taken along the lines A-A' and B-B' of FIG. 7, respectively, to illustrate a method for manufacturing a semiconductor device according to some embodiments of the inventive concept.

Referring to FIGS. 5, 16A and 16B, a mask layer MA may be formed on the logic cell region LGC of the resultant structure described with reference to FIGS. 3 and 4A to 4D. The mask layer MA may be on and at least partially cover the logic cell region LGC but may expose the peripheral region PER.

A first capping layer CL1 may be formed on the first and second active patterns AP1 and AP2 of the peripheral region PER. For example, the first capping layer CL1 may be formed using an epitaxial growth process. In other words, the epitaxial growth process may be performed on the first and second active patterns AP1 and AP2, and thus the first capping layer CL1 may be formed on the sidewall and the top surface of each of the first and second active patterns AP1 and AP2. The first capping layer CL1 may include the same semiconductor material as the second semiconductor patterns SP2. For example, the first capping layer CL1 may include silicon-germanium (SiGe). The first capping layer CL1 may be conformally formed.

A second capping layer CL2 may be formed on the first capping layer CL1. The second capping layer CL2 may be formed to be on and at least partially cover the first capping layer CL1. The second capping layer CL2 may be spaced apart from the first and second active patterns AP1 and AP2 by the first capping layer CL1. For example, the second capping layer CL2 may include silicon (Si). The second capping layer CL2 may be conformally formed.

A first insulating layer EG may be formed on the second capping layer CL2. The first insulating layer EG may include a silicon oxide layer or a silicon oxynitride layer. For example, the first insulating layer EG may be formed using an oxidation process.

Due to the mask layer MA, the first capping layer CL1, the second capping layer CL2 and the first insulating layer EG may not be formed on the third and fourth active patterns AP3 and AP4 on the logic cell region LGC.

Figure 7:
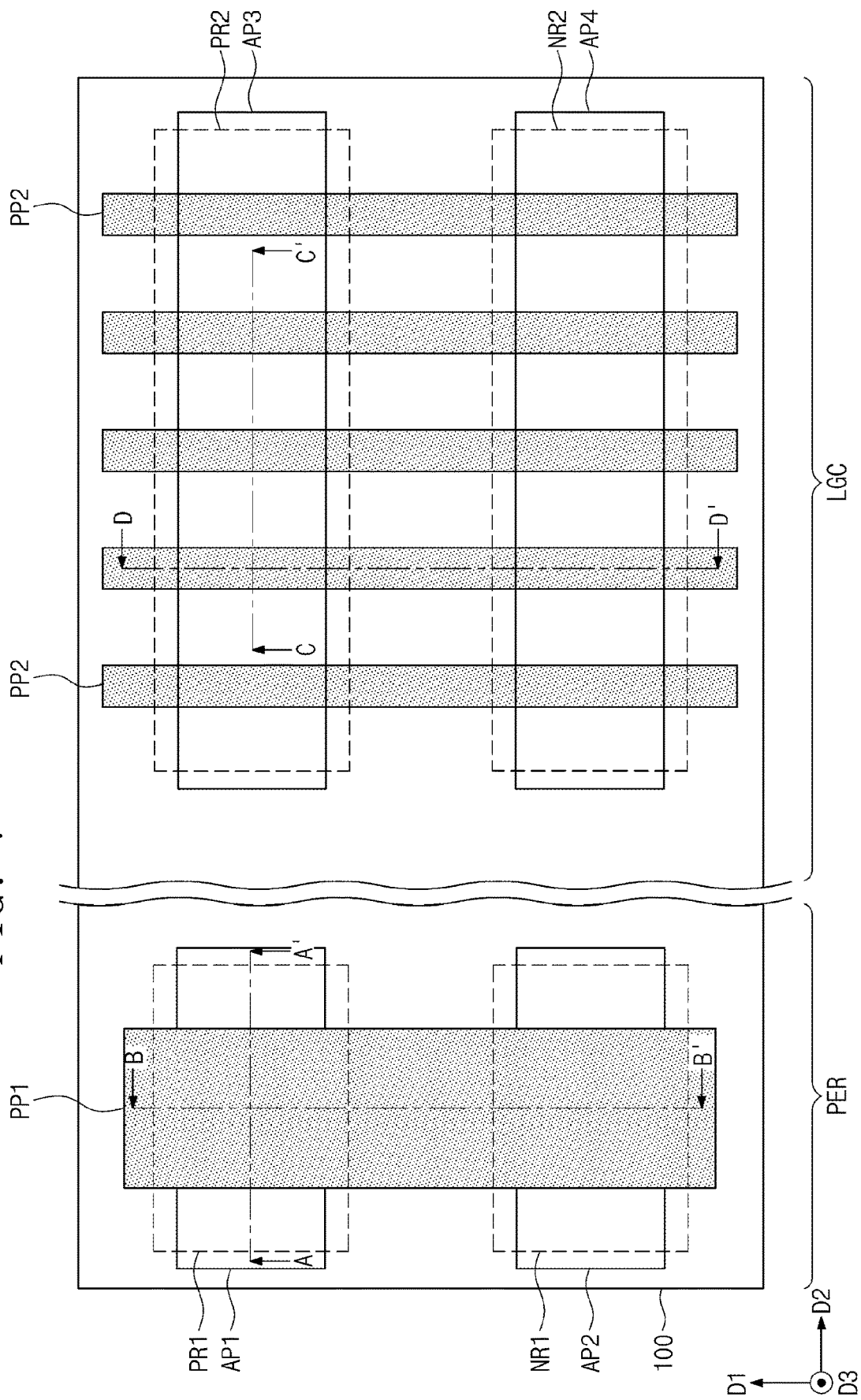
Figure 8A:
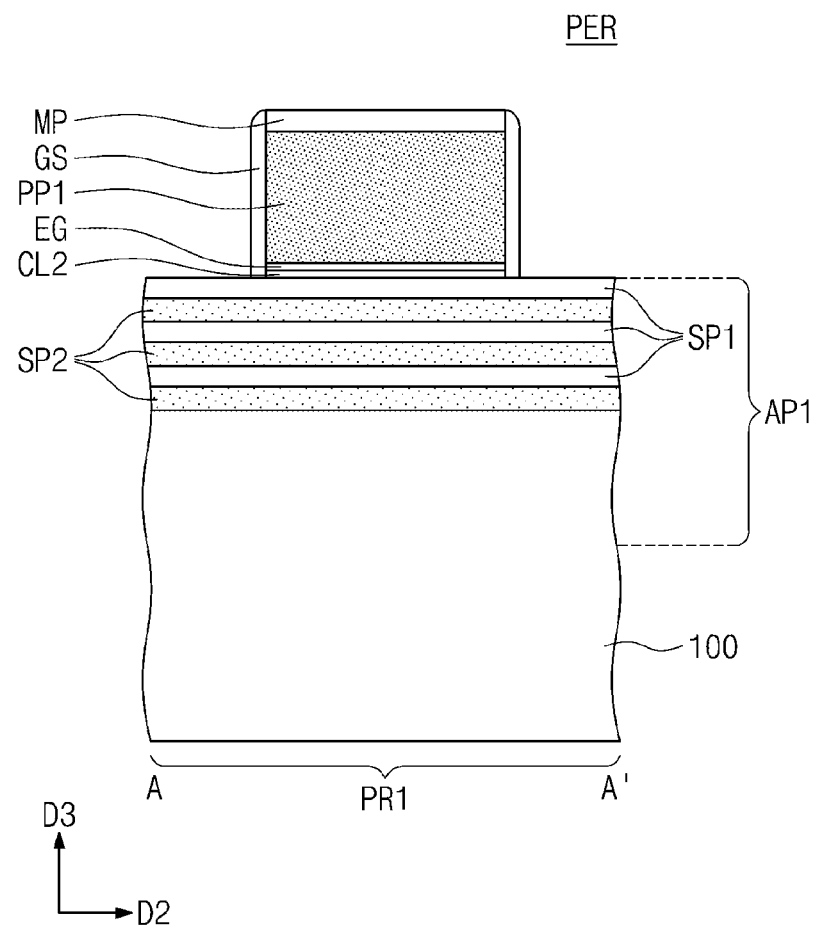
Figure 8B:
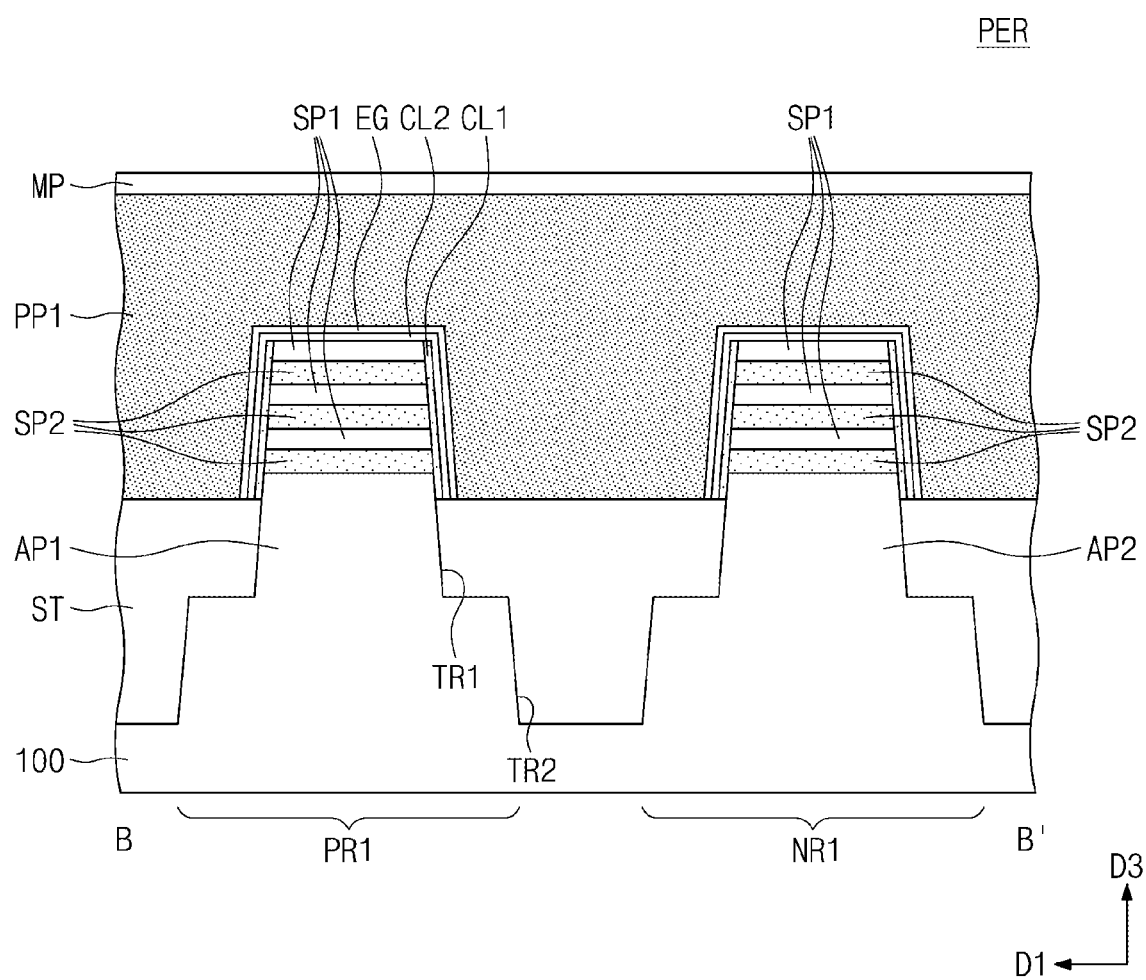
Figure 8C:
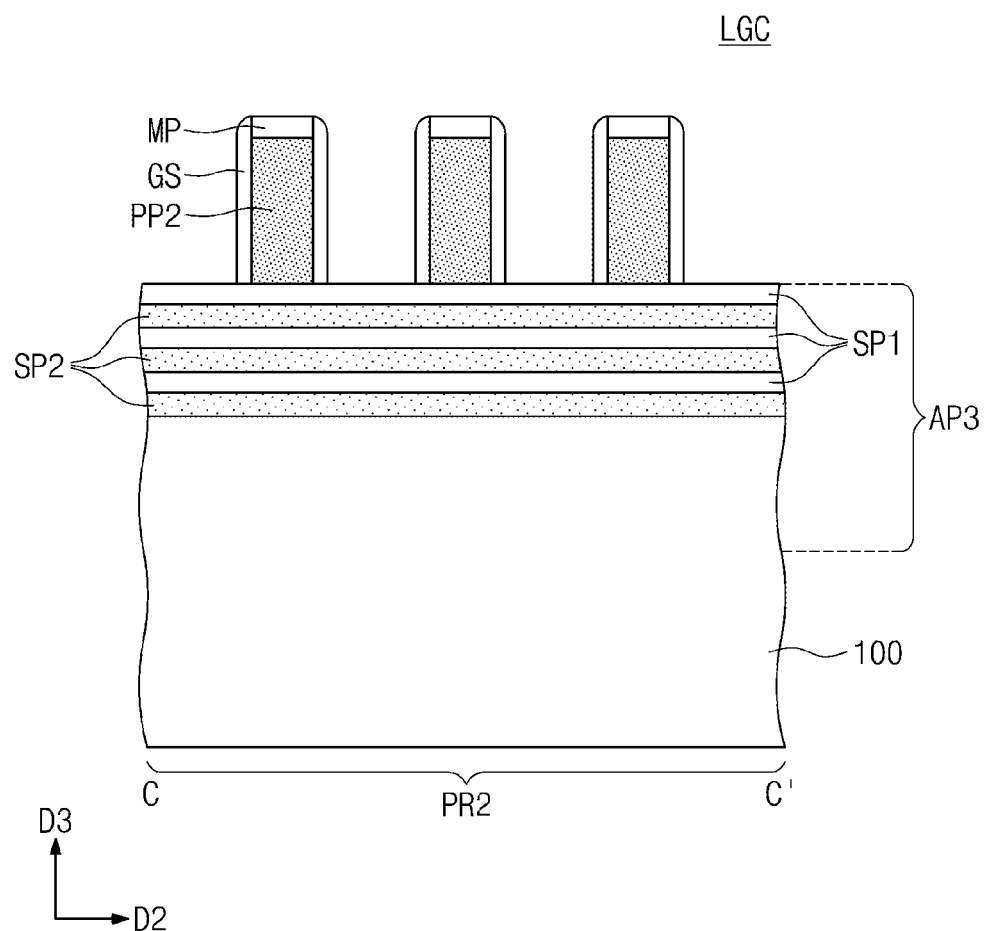
Figure 8D:
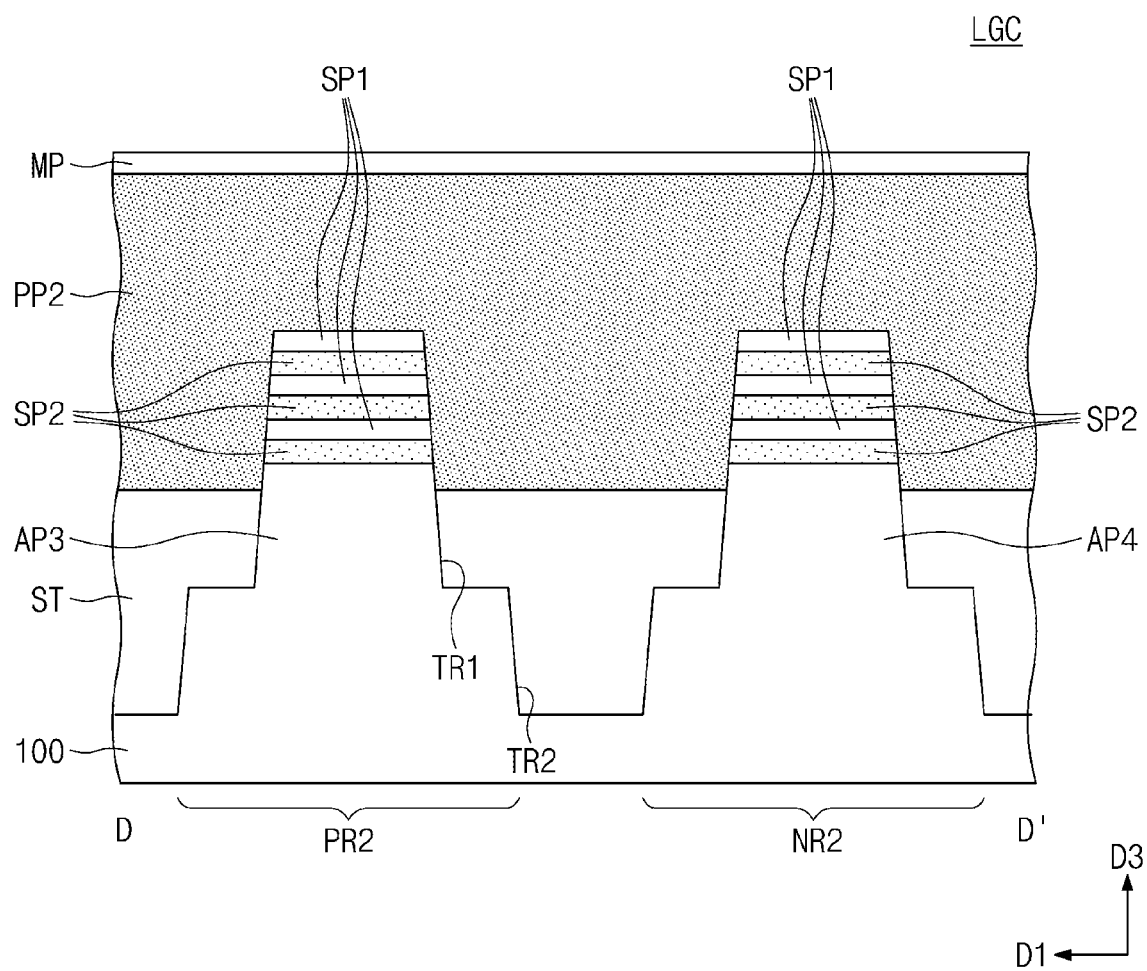
Figure 9:
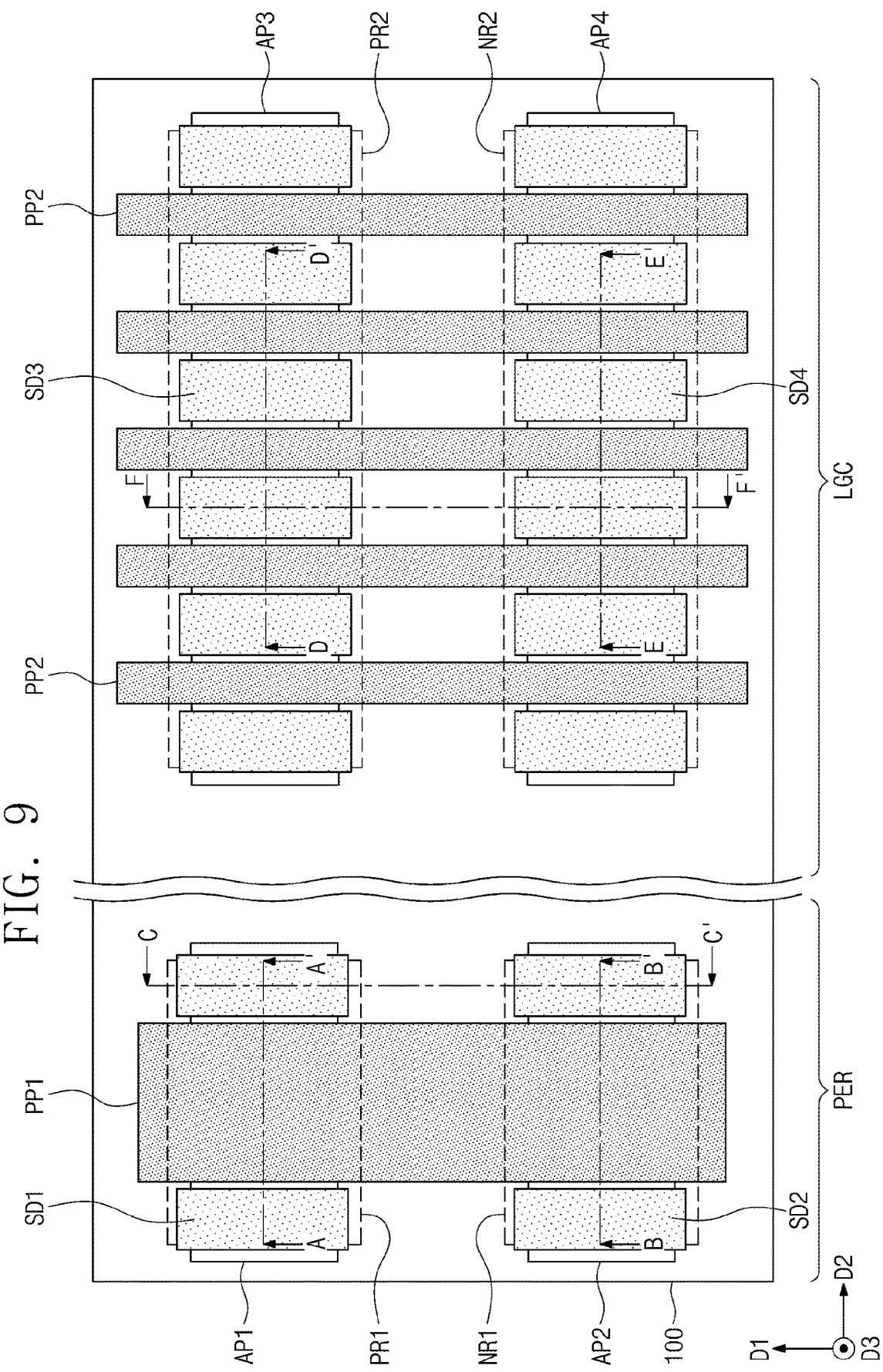

Referring to FIGS. 7, 17A and 17B, the mask layer MA may be removed. A first sacrificial pattern PP1 intersecting the first and second active patterns AP1 and AP2 may be formed on the peripheral region PER. Second sacrificial patterns PP2 intersecting the third and fourth active patterns AP3 and AP4 may be formed on the logic cell region LGC. A width of the first sacrificial pattern PP1 may be greater than a width of the second sacrificial pattern PP2.

Referring to FIG. 17A, portions of the first capping layer CL1, the second capping layer CL2 and the first insulating layer EG on the peripheral region PER, which are covered by the first sacrificial pattern PP1, may remain, but the other portions thereof which are not covered by the first sacrificial pattern PP1 may be removed.

Thereafter, substantially the same processes as described with reference to FIGS. 9 to 14F, 1 and 2A to 2H may be performed. As a result, the semiconductor device described with reference to FIGS. 1 and 15A to 15C may be manufactured.

Figure 18:
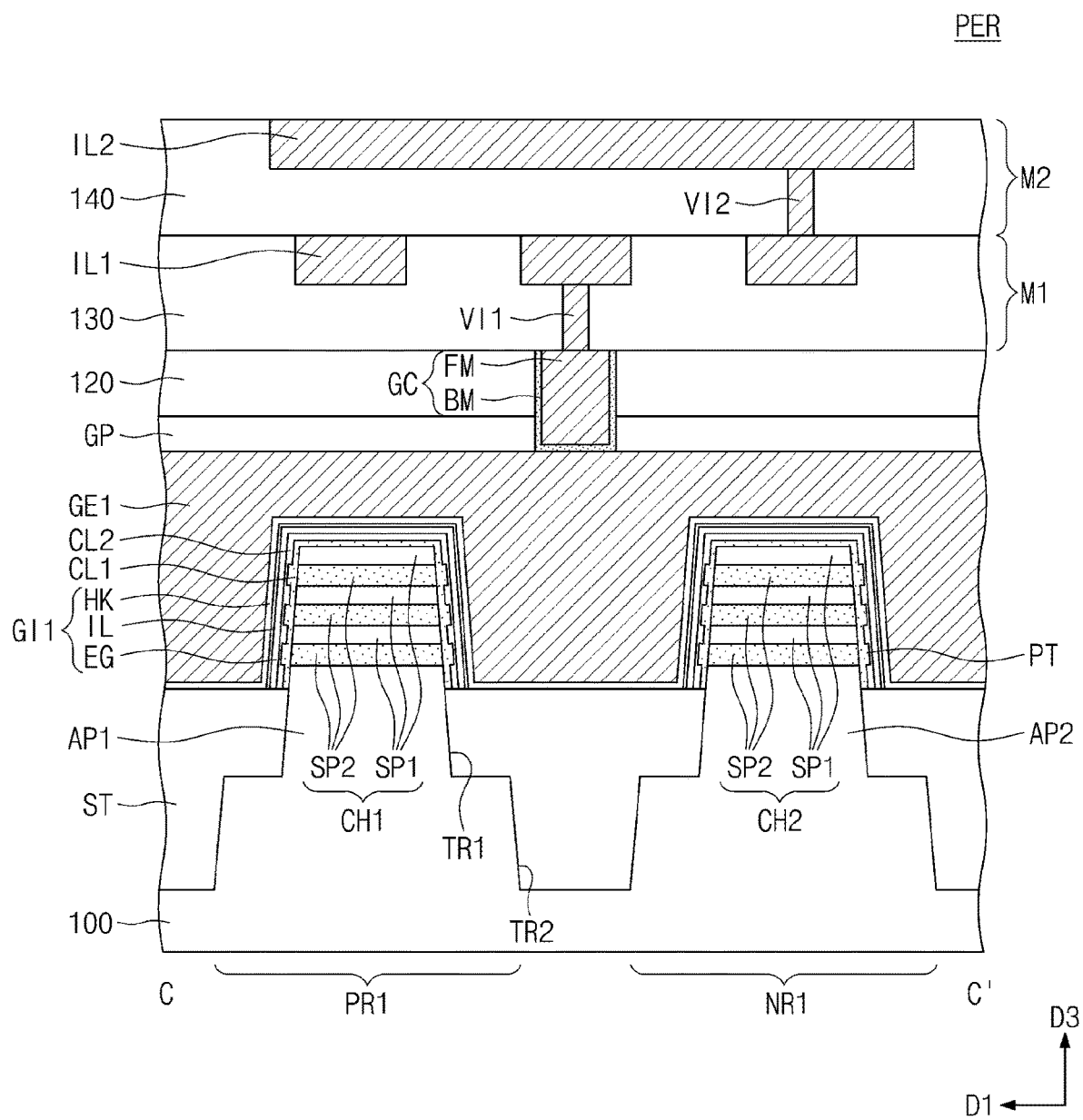
FIG. 18 is a cross-sectional view taken along the line C-C' of FIG. 1 to illustrate a semiconductor device according to some embodiments of the inventive concept.

FIG. 18 is a cross-sectional view taken along the line C-C' of FIG. 1 to illustrate a semiconductor device according to some embodiments of the inventive concept. In the present embodiments, the descriptions of the same technical features as in the embodiments of FIGS. 1, 2A to 2H and 15A to 15C will be omitted for the purpose of ease and convenience in explanation. In other words, differences between the present embodiments and the embodiments of FIGS. 1, 2A to 2H and 15A to 15C will be primarily described hereinafter.

Referring to FIGS. 1 and 18, a first capping layer CL1 may be provided on the sidewall and the top surface of each of the first and second active patterns AP1 and AP2. The first capping layer CL1 may include protrusions PT. Each of the protrusions PT may be located at substantially the same level in the D3 direction as a corresponding one of the second semiconductor patterns SP2. The protrusions PT may be formed because a growth rate of the first capping layer CL1 is higher at positions of the second semiconductor patterns SP2 including the same semiconductor material as the first capping layer CL1 than at other positions in the epitaxial growth process of forming the first capping layer CL1. The protrusions PT may extend in a direction from the first capping layer CL1 toward the first gate insulating layer GI1. Unlike FIG. 18, each of the protrusions PT may have a curved or rounded profile.

In the semiconductor device according to the embodiments of the inventive concepts, the first capping layer including the same semiconductor material as the second semiconductor pattern may be provided on the peripheral region. Thus, the threshold voltage of the transistor of the peripheral region may be reduced and may be uniformly controlled. As a result, the electrical characteristics of the semiconductor device may be improved.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scope of the inventive concept is to be determined by the broadest permissible interpretation of the following claims and their equivalents, and shall not be restricted or limited by the foregoing description.

What is claimed is:

1. A semiconductor device comprising:
   a substrate including a peripheral region and a logic cell region;
   a first active pattern on the peripheral region, the first active pattern having an upper portion including first semiconductor patterns and second semiconductor patterns, which are alternately stacked;
   a first gate electrode intersecting the first active pattern;
   a pair of first source/drain patterns provided at both sides of the first gate electrode, respectively;
   a first capping layer having a composition comprising silicon and germanium on the first active pattern;
   a second capping layer having a composition comprising silicon and germanium on the first capping layer; and
   a first gate insulating layer between the second capping layer and the first gate electrode,
   wherein the first capping layer is between a sidewall of the first active pattern and the second capping layer, and
   wherein a concentration of germanium of the first capping layer is greater than a concentration of germanium of the second capping layer.

2. The semiconductor device of claim 1, wherein the first gate insulating layer comprises:
   an insulating layer on the second capping layer; and
   a high-k dielectric layer on the insulating layer,
   wherein the insulating layer includes a silicon oxide layer.

3. The semiconductor device of claim 1, wherein the first capping layer and the second semiconductor patterns include a same semiconductor material.

4. The semiconductor device of claim 1, wherein the first capping layer extends onto a top surface of the first active pattern, and
   wherein the second capping layer is spaced apart from the first active pattern.

5. The semiconductor device of claim 4, wherein the first capping layer includes protrusions extending toward the first gate insulating layer.

6. The semiconductor device of claim 5, wherein each of the protrusions is located at substantially a same level as a corresponding one of the second semiconductor patterns with respect to the substrate providing a base level.

7. The semiconductor device of claim 1, wherein a thickness of the first capping layer ranges from about 1 nm to 5 nm.

8. The semiconductor device of claim 1, further comprising:
   a second active pattern on the logic cell region, wherein an upper portion of the second active pattern includes third semiconductor patterns stacked and spaced apart from each other;
   a second gate electrode intersecting the second active pattern;
   a pair of second source/drain patterns provided at both sides of the second gate electrode, respectively; and
   a second gate insulating layer between the second gate electrode and the second active pattern,
   wherein a thickness of the first gate insulating layer is greater than a thickness of the second gate insulating layer.

9. The semiconductor device of claim 8, wherein the second gate electrode and the second gate insulating layer are in a space between adjacent third semiconductor patterns.

10. The semiconductor device of claim 8, wherein a width of the first gate electrode is greater than a width of the second gate electrode.

11. A semiconductor device comprising:
a substrate including a peripheral region and a logic cell region;
a first active pattern and a second active pattern, which are provided on the peripheral region and the logic cell region, respectively;
a first gate electrode and a second gate electrode, which intersect the first active pattern and the second active pattern, respectively;
a first capping layer having a composition comprising silicon and germanium on the first active pattern;
a second capping layer having a composition comprising silicon and germanium on the first capping layer;
a first gate insulating layer between the second capping layer and the first gate electrode; and
a second gate insulating layer between the second active pattern and the second gate electrode,
wherein an upper portion of the first active pattern includes first semiconductor patterns and second semiconductor patterns, which are alternately stacked,
wherein the first capping layer and the second semiconductor patterns include a same semiconductor material,
wherein the first capping layer is between a sidewall of the first active pattern and the second capping layer; and
wherein a concentration of germanium of the first capping layer is greater than a concentration of germanium of the second capping layer.

12. The semiconductor device of claim 11, wherein an upper portion of the second active pattern includes third semiconductor patterns stacked and spaced apart from each other, and
wherein the first semiconductor patterns and the third semiconductor patterns include a same semiconductor material.

13. The semiconductor device of claim 11, wherein a thickness of the first gate insulating layer is greater than a thickness of the second gate insulating layer.

14. The semiconductor device of claim 11, wherein the first capping layer extends onto a top surface of the first active pattern.

15. The semiconductor device of claim 14, wherein the first capping layer includes protrusions extending toward the first gate insulating layer, and
wherein each of the protrusions is located at substantially a same level as a corresponding one of the second semiconductor patterns with respect to the substrate providing a base level.

16. A semiconductor device comprising:
a substrate including a peripheral region and a logic cell region;
a device isolation layer provided on the peripheral region to define a first active pattern;
a pair of first source/drain patterns provided on the first active pattern;
first semiconductor patterns and second semiconductor patterns provided between the first source/drain patterns, wherein the first and second semiconductor patterns are alternately stacked on the first active pattern; and a bottom surface of a lowermost one of the second semiconductor patterns is located at a higher level than a top surface of the device isolation layer with respect to the substrate providing a base level;
a first gate electrode intersecting the first and second semiconductor patterns on the first active pattern;
a first capping layer having a composition comprising silicon and germanium on the first active pattern;
a second capping layer having a composition comprising silicon and germanium on the first capping layer;
a first gate insulating layer between the second capping layer and the first gate electrode;
a pair of gate spacers provided on both sidewalls of the first gate electrode, respectively;
a gate capping pattern on the first gate electrode;
a first interlayer insulating layer on the gate capping pattern;
an active contact penetrating the first interlayer insulating layer and electrically connected to at least one of the first source/drain patterns;
a second interlayer insulating layer on the first interlayer insulating layer;
a first metal layer provided in the second interlayer insulating layer and electrically connected to the active contact; and
a second metal layer on the first metal layer,
wherein the first gate insulating layer comprises: an insulating layer on the second capping layer; and a high-k dielectric layer on the insulating layer,
wherein the insulating layer includes a silicon oxide layer,
wherein the first capping layer is between a sidewall of the first active pattern and the second capping layer, and
wherein a concentration of germanium of the first capping layer is greater than a concentration of germanium of the second capping layer.

17. The semiconductor device of claim 16, wherein the first capping layer extends onto a top surface of the first active pattern.

18. The semiconductor device of claim 17, wherein the first capping layer includes protrusions extending toward the first gate insulating layer, and
wherein each of the protrusions is located at substantially a same level as a corresponding one of the second semiconductor patterns with respect to the substrate providing the base level.

19. The semiconductor device of claim 16, wherein the first capping layer and the second semiconductor patterns include a same semiconductor material.

20. The semiconductor device of claim 16, further comprising:
a second active pattern on the logic cell region, wherein an upper portion of the second active pattern includes third semiconductor patterns stacked and spaced apart from each other;
a second gate electrode intersecting the second active pattern;
a pair of second source/drain patterns provided at both sides of the second gate electrode, respectively; and
a second gate insulating layer between the second gate electrode and the second active pattern,
wherein a thickness of the first gate insulating layer is greater than a thickness of the second gate insulating layer.

* * * * *